(12) United States Patent
Terai et al.

(10) Patent No.: US 10,546,999 B2
(45) Date of Patent: Jan. 28, 2020

(54) VARIABLE RESISTANCE MEMORY DEVICES AND METHODS OF MANUFACTURING THE SAME

(71) Applicant: SAMSUNG ELECTRONICS CO., LTD., Suwon-si, Gyeonggi-do (KR)

(72) Inventors: Masayuki Terai, Suwon-si (KR); Dae-Hwan Kang, Seoul (KR); Gwan-Hyeob Koh, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 36 days.

(21) Appl. No.: 15/346,751

(22) Filed: Nov. 9, 2016

(65) Prior Publication Data
US 2017/0237000 A1    Aug. 17, 2017

(30) Foreign Application Priority Data
Feb. 17, 2016    (KR) .................... 10-2016-0018304

(51) Int. Cl.
*H01L 45/00*    (2006.01)
(52) U.S. Cl.
CPC .......... *H01L 45/1233* (2013.01); *H01L 45/06* (2013.01); *H01L 45/142* (2013.01); *H01L 45/143* (2013.01); *H01L 45/144* (2013.01); *H01L 45/146* (2013.01); *H01L 45/147* (2013.01); *H01L 45/149* (2013.01)
(58) Field of Classification Search
CPC ....................................................... H01L 21/75
See application file for complete search history.

(56) References Cited

U.S. PATENT DOCUMENTS

| | | | |
|---|---|---|---|
| 8,288,750 B2 | 10/2012 | Shen et al. | |
| 8,305,800 B2 | 11/2012 | Tu | |
| 8,536,559 B2 | 9/2013 | Chen | |
| 8,871,559 B2 | 10/2014 | Horii et al. | |
| 9,029,828 B2 | 5/2015 | Oh | |
| 9,136,467 B2 | 9/2015 | Van Gerpen et al. | |
| 2009/0196091 A1 | 8/2009 | Kau et al. | |

(Continued)

*Primary Examiner* — Kenneth Parker
*Assistant Examiner* — Christopher A Culbert
(74) *Attorney, Agent, or Firm* — Lee & Morse, P.C.

(57) ABSTRACT

A variable resistance memory device and a method of manufacturing the same, the device including first conductive lines disposed in a first direction on a substrate, each of the first conductive lines extending in a second direction crossing the first direction, and the first and second directions being parallel to a top surface of the substrate; second conductive lines disposed in the second direction over the first conductive lines, each of the second conductive lines extending in the first direction; a memory unit between the first and second conductive lines, the memory unit being in each area overlapping the first and second conductive lines in a third direction substantially perpendicular to the top surface of the substrate, and the memory unit including a variable resistance pattern; and an insulation layer structure between the first and second conductive lines, the insulation layer structure covering the memory unit and including an air gap in at least a portion of an area overlapping neither the first conductive lines nor the second conductive lines in the third direction.

16 Claims, 82 Drawing Sheets

(56) References Cited

U.S. PATENT DOCUMENTS

| | | | |
|---|---|---|---|
| 2009/0310402 A1* | 12/2009 | Parkinson | G11C 13/0004 365/163 |
| 2013/0015421 A1 | 1/2013 | Sim et al. | |
| 2013/0320290 A1* | 12/2013 | Park | H01L 45/1286 257/4 |
| 2014/0166965 A1* | 6/2014 | Seo | H01L 45/124 257/4 |
| 2015/0003137 A1* | 1/2015 | Lee | G11C 13/004 365/49.1 |
| 2015/0155482 A1* | 6/2015 | Lee | H01L 45/12 711/154 |
| 2015/0179704 A1* | 6/2015 | Yoshida | H01L 27/249 257/5 |
| 2015/0318467 A1* | 11/2015 | Hu | H01L 27/2481 257/4 |

\* cited by examiner

FIG. 1
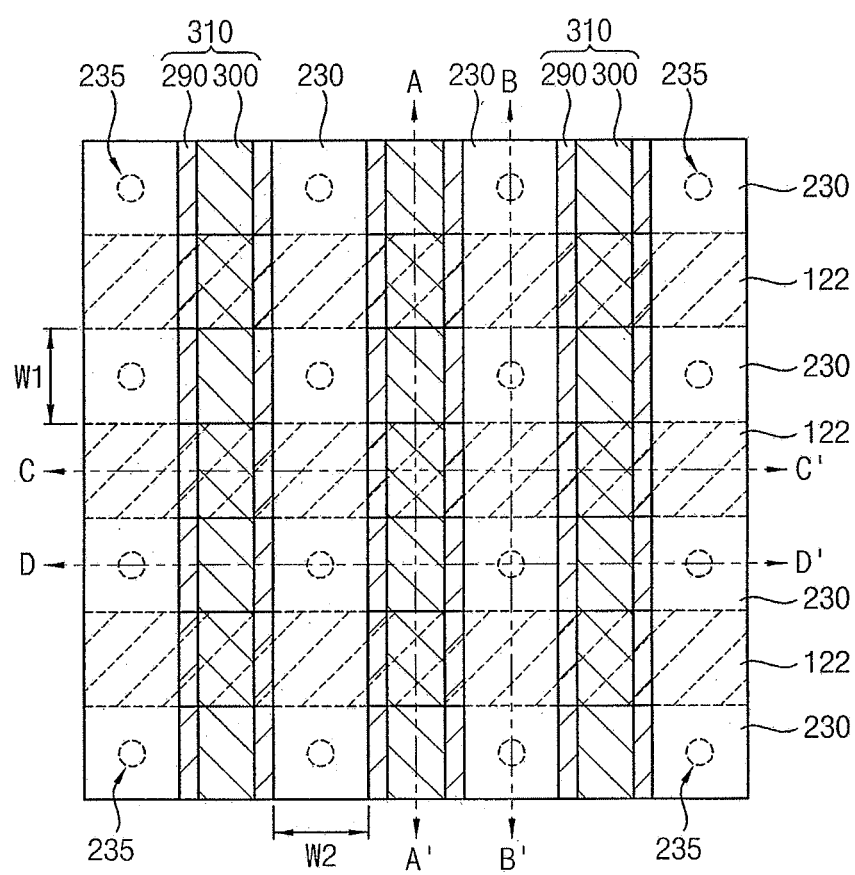
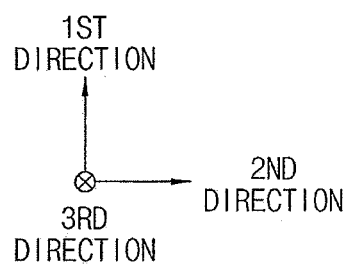

FIG. 7
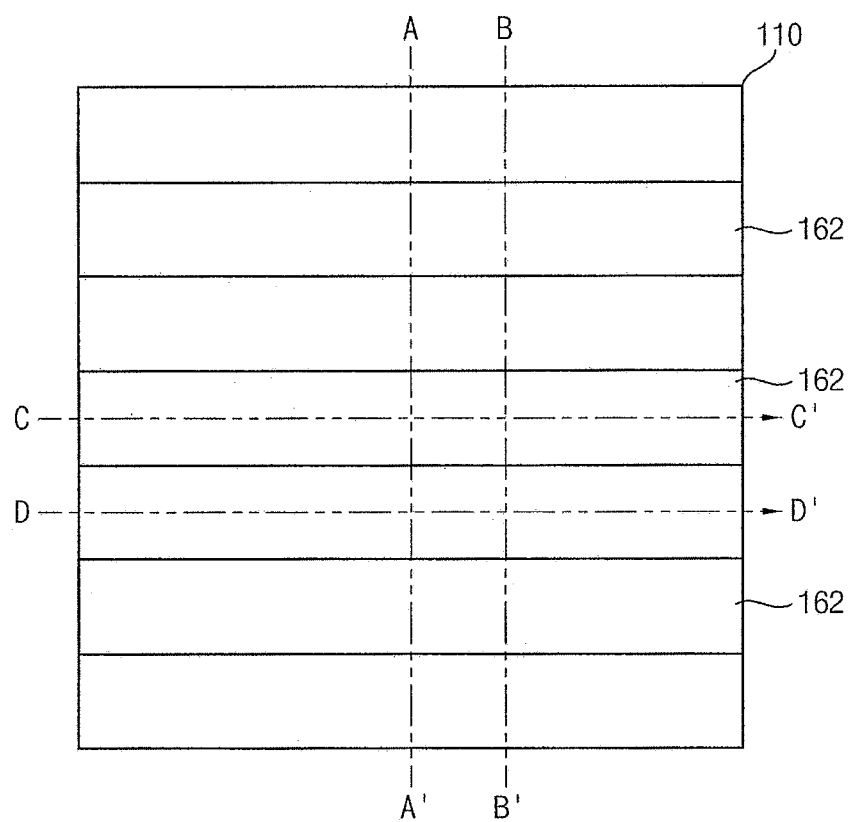
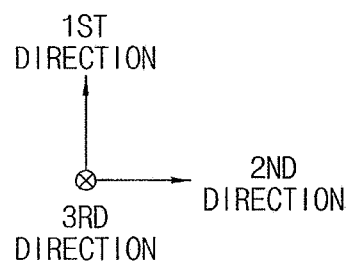

FIG. 10
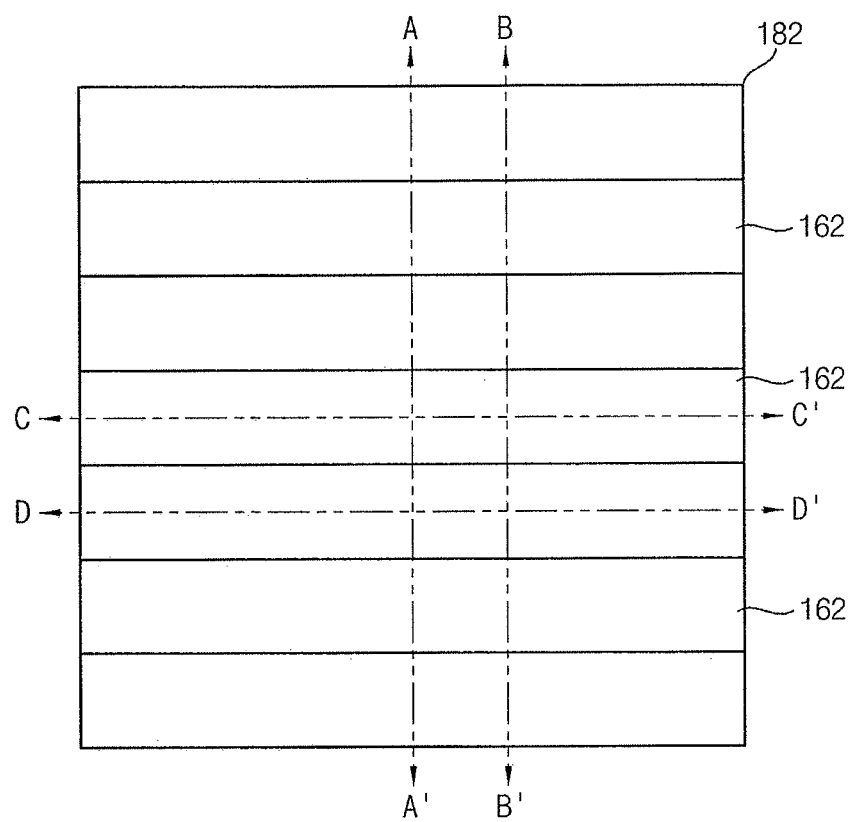
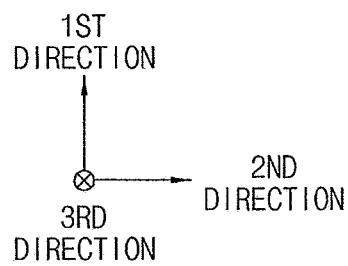

FIG. 13
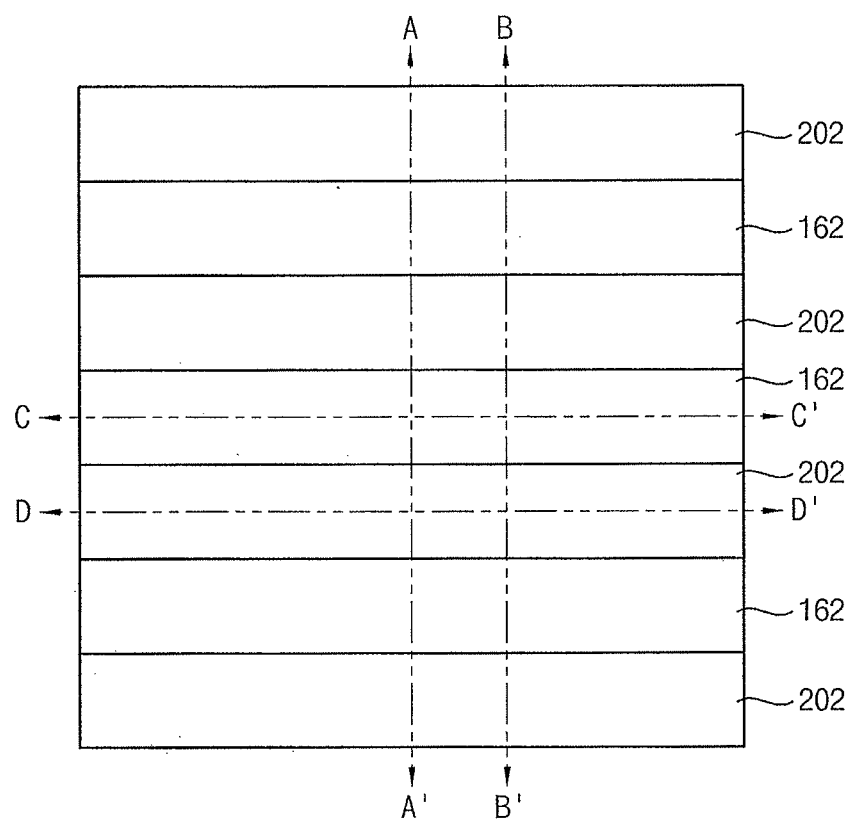
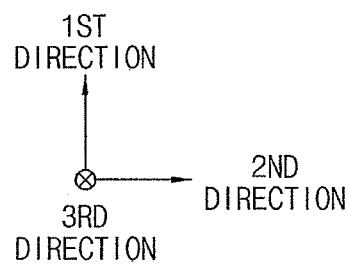

FIG. 16
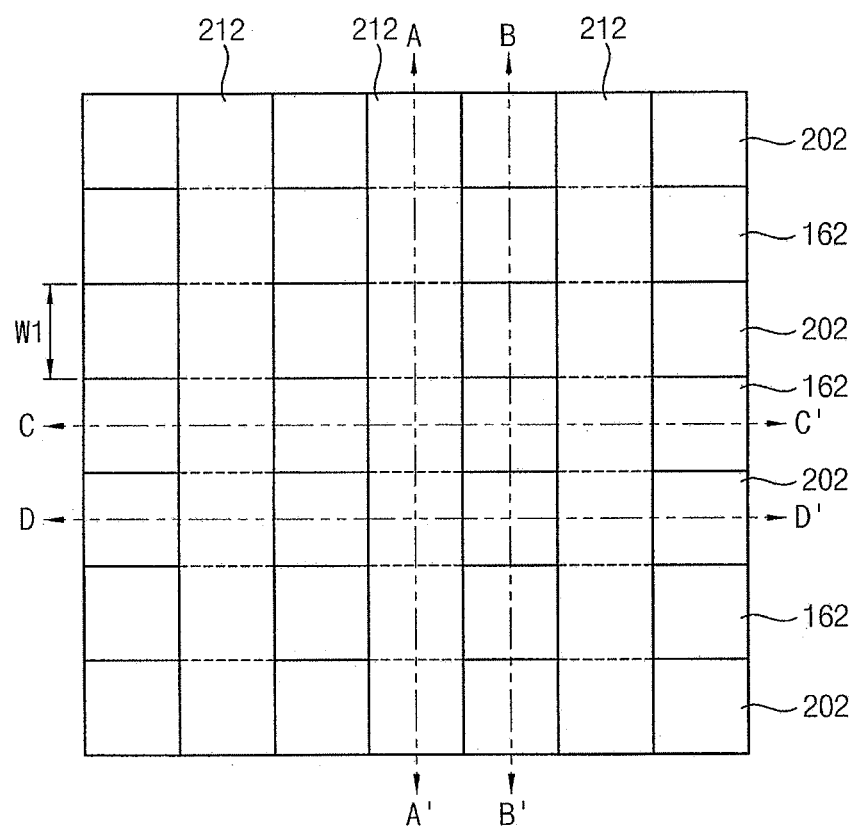
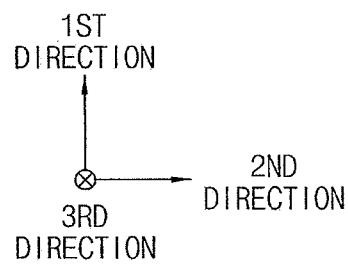

FIG. 19
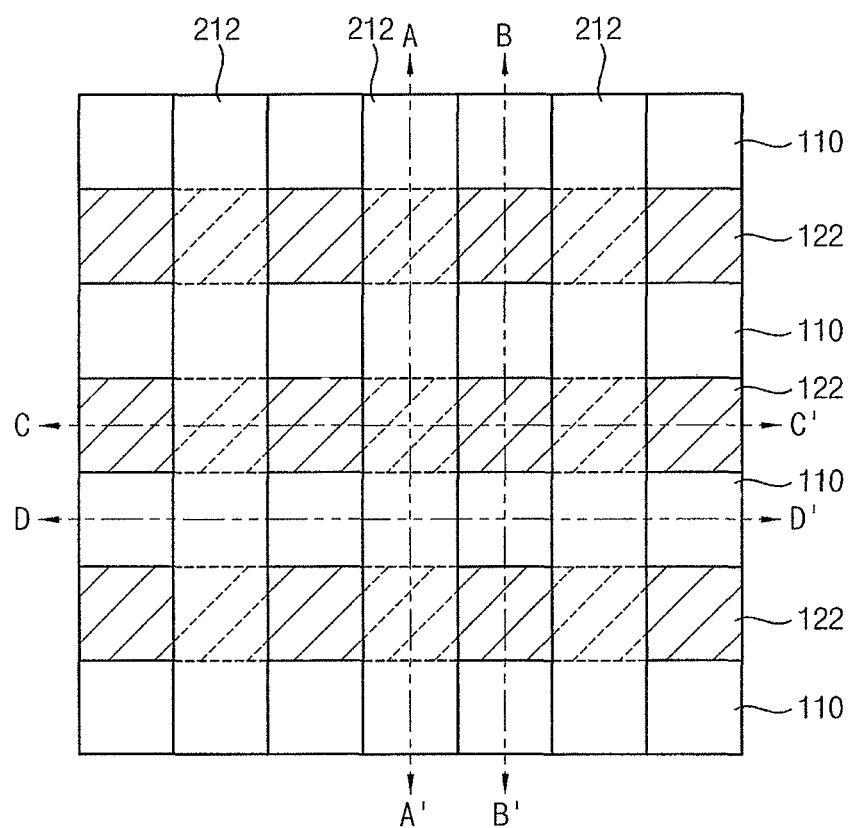
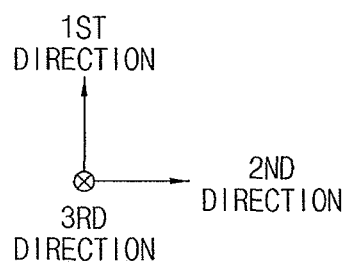

FIG. 22
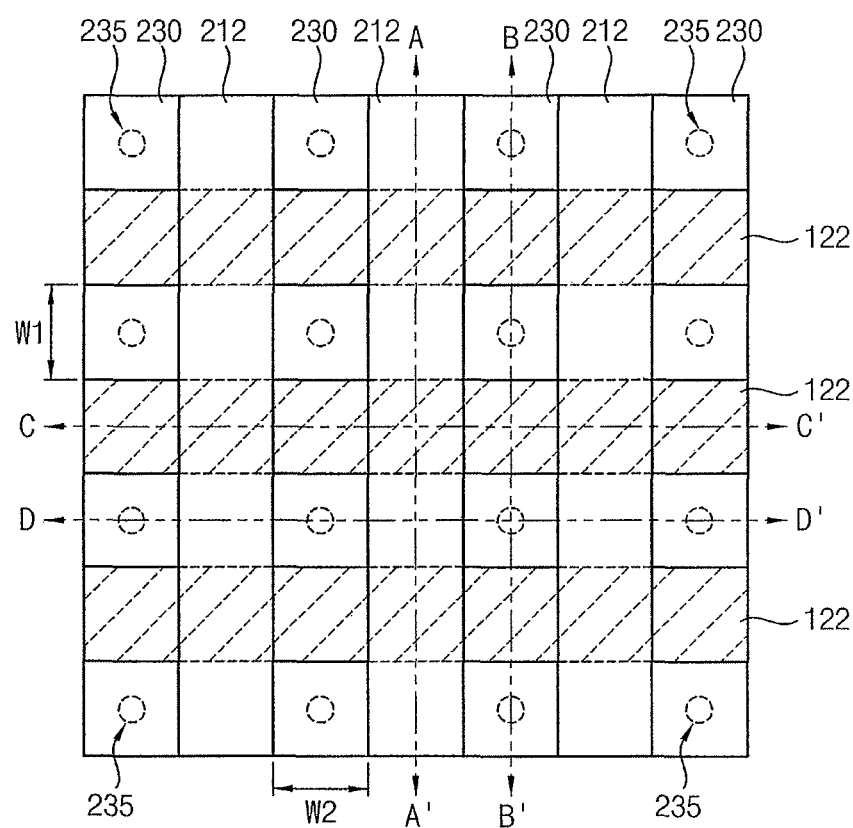
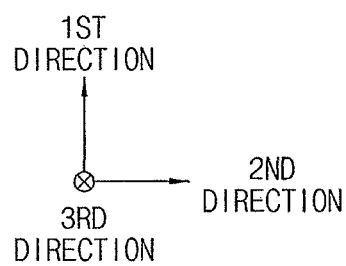

FIG. 28
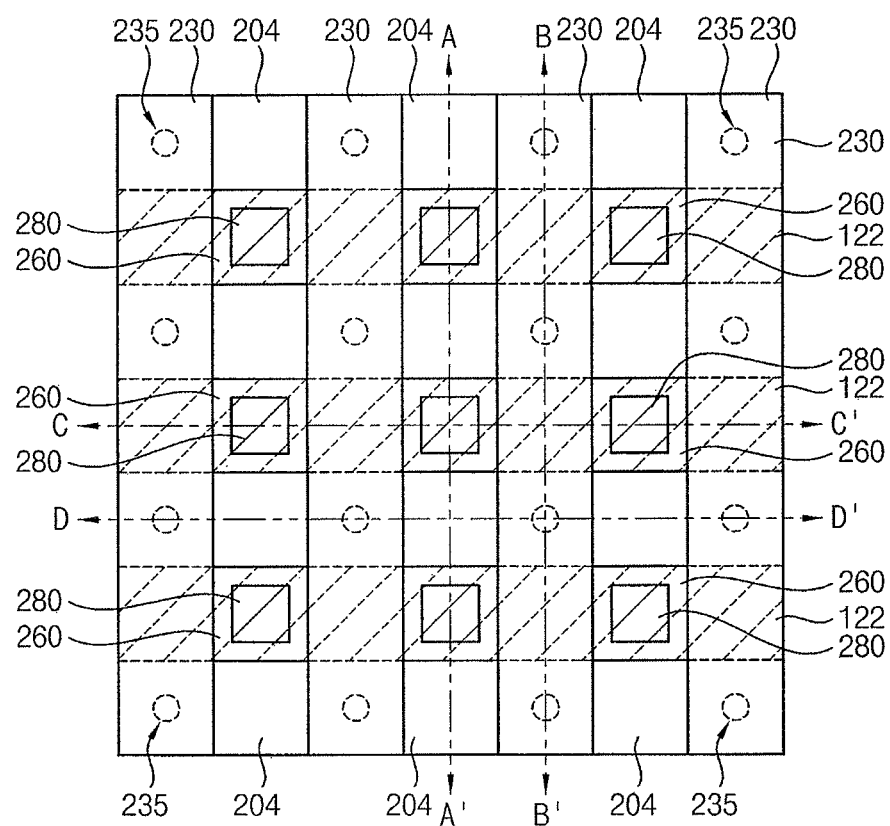
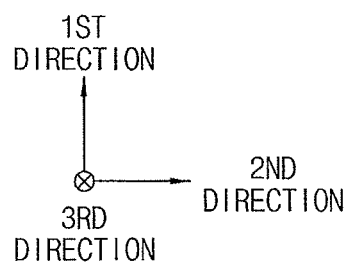

FIG. 34
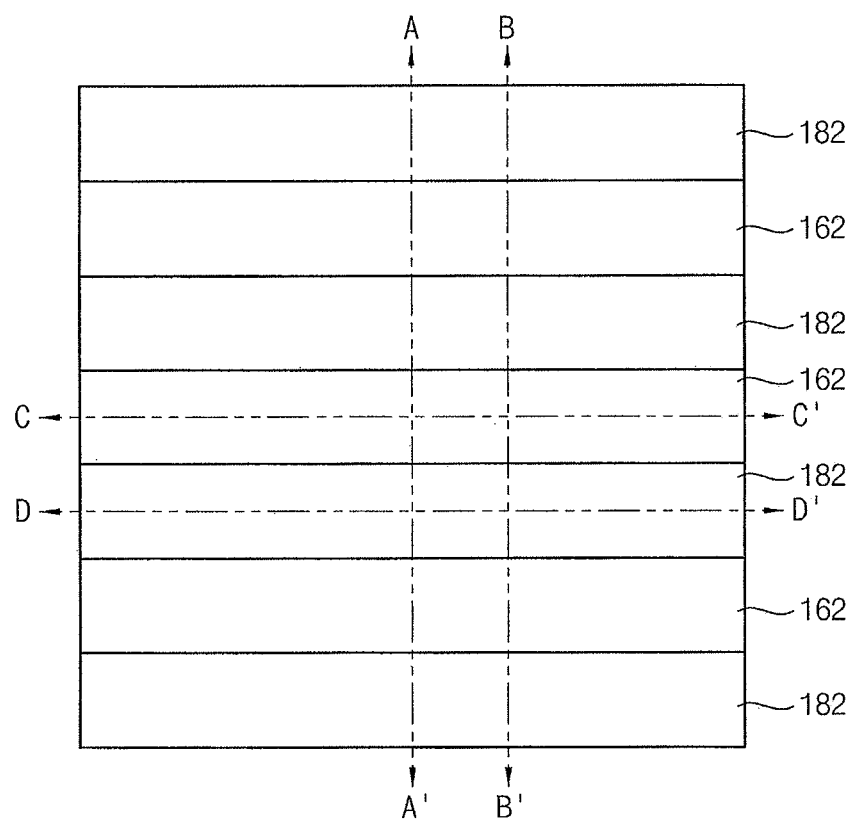
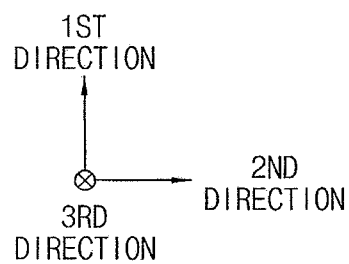

FIG. 37
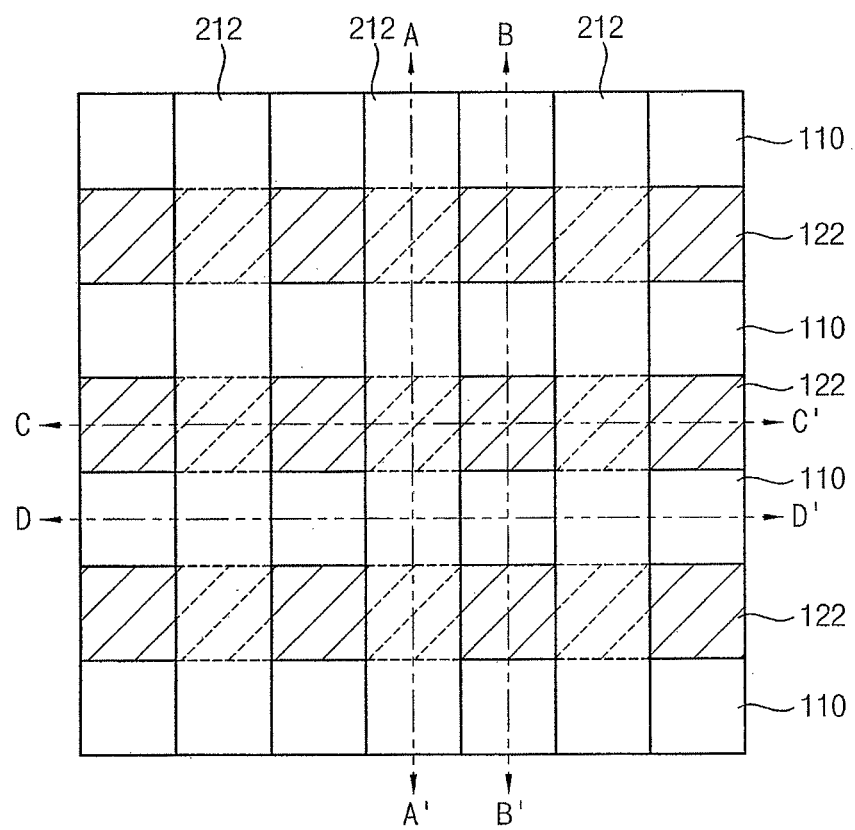
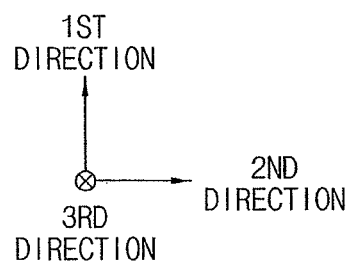

FIG. 43
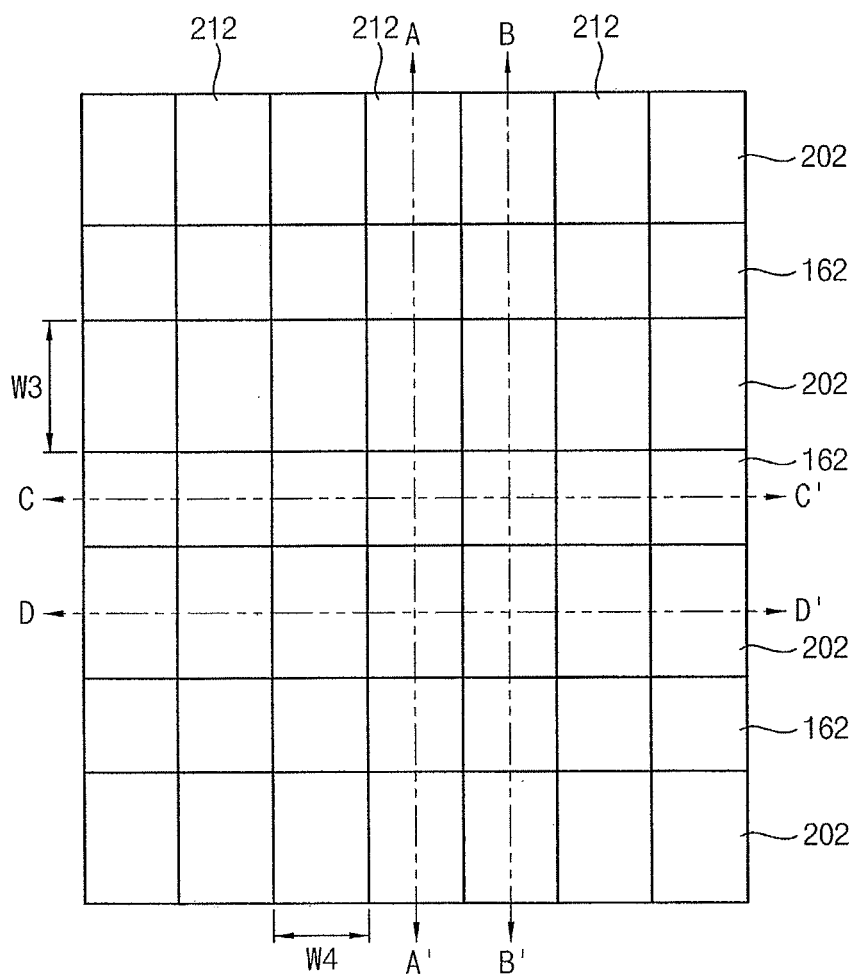
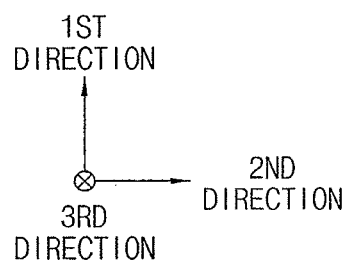

FIG. 52
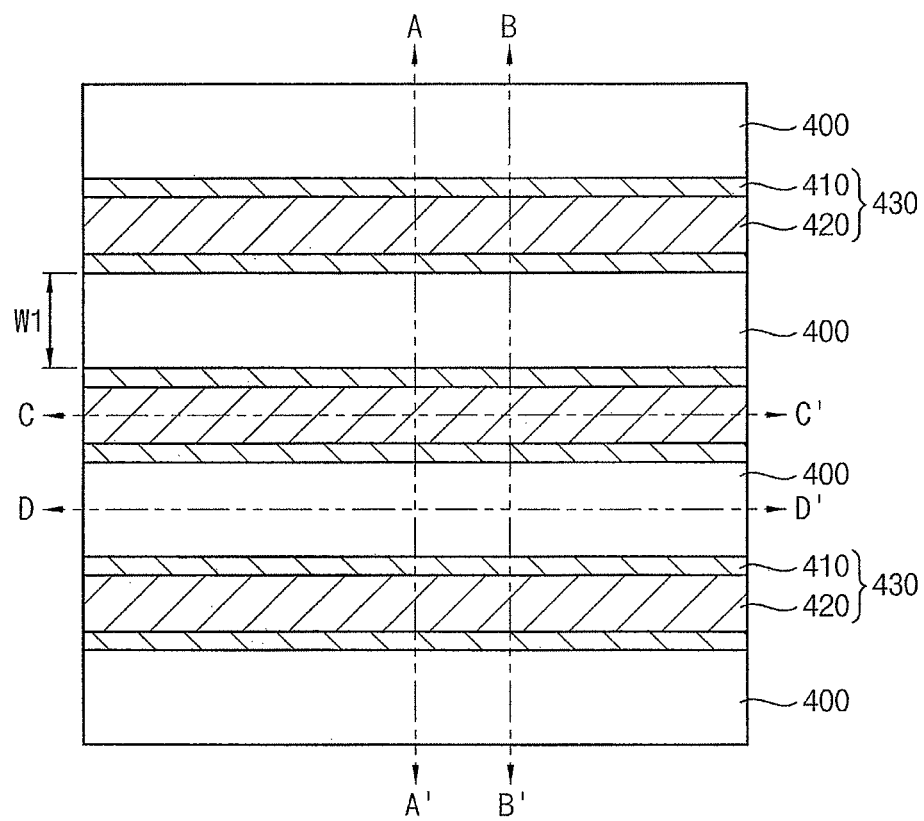
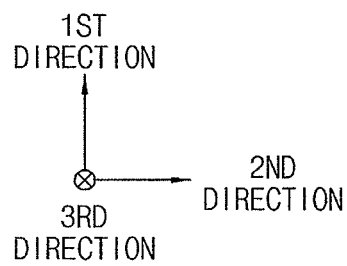

FIG. 55
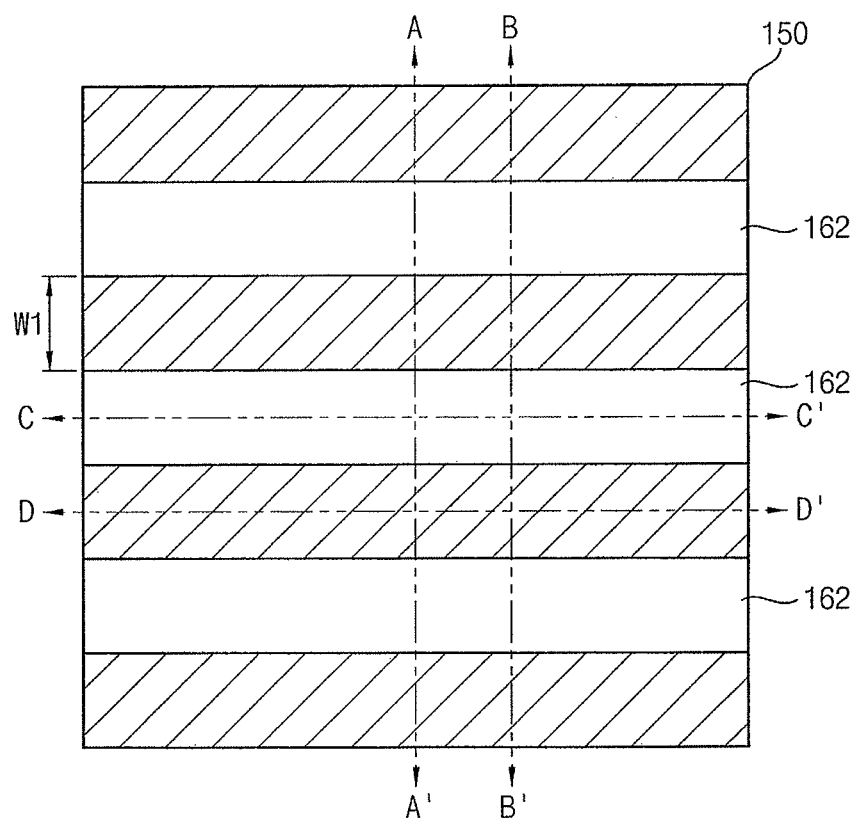
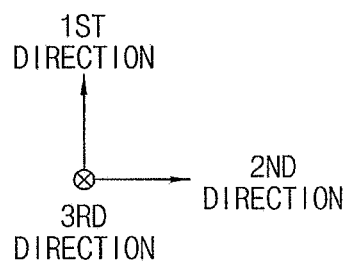

FIG. 64
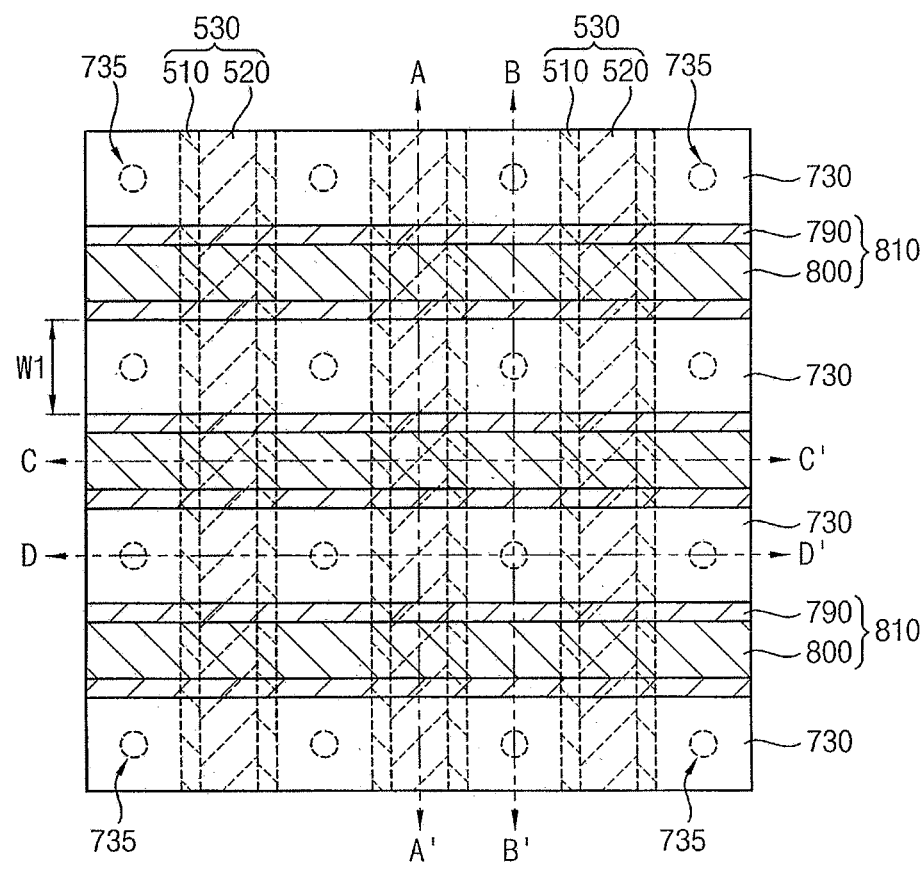
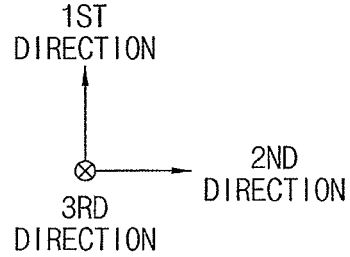

FIG. 79
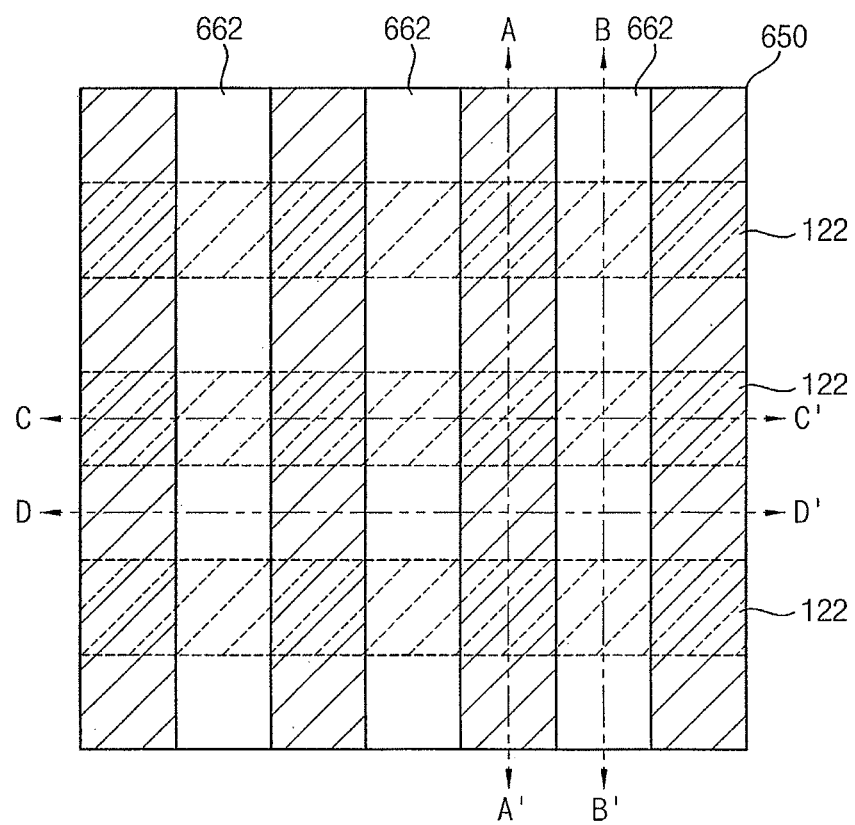
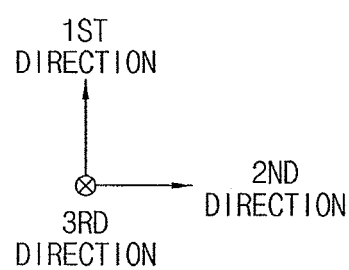

VARIABLE RESISTANCE MEMORY DEVICES AND METHODS OF MANUFACTURING THE SAME

CROSS-REFERENCE TO RELATED APPLICATION

Korean Patent Application No. 10-2016-0018304, filed on Feb. 17, 2016, in the Korean Intellectual Property Office, and entitled: "Variable Resistance Memory Devices and Methods of Manufacturing the Same," is incorporated by reference herein in its entirety.

BACKGROUND

1. Field

Embodiments relate to a variable resistance memory device and a method of manufacturing the same.

2. Description of the Related Art

As the size of a variable resistance memory device decreases, the parasitic capacitance between conductive lines or memory cells may be problematic. In order to reduce the parasitic capacitance, an air gap may be formed, and a specific method of forming the air gap may be performed.

SUMMARY

The embodiments may be realized by providing a variable resistance memory device including first conductive lines disposed in a first direction on a substrate, each of the first conductive lines extending in a second direction crossing the first direction, and the first and second directions being parallel to a top surface of the substrate; second conductive lines disposed in the second direction over the first conductive lines, each of the second conductive lines extending in the first direction; a memory unit between the first and second conductive lines, the memory unit being in each area overlapping the first and second conductive lines in a third direction substantially perpendicular to the top surface of the substrate, and the memory unit including a variable resistance pattern; and an insulation layer structure between the first and second conductive lines, the insulation layer structure covering the memory unit and including an air gap in at least a portion of an area overlapping neither the first conductive lines nor the second conductive lines in the third direction.

The embodiments may be realized by providing a variable resistance memory device including first conductive lines disposed in a first direction on a substrate, each of the first conductive lines extending in a second direction crossing the first direction, and the first and second directions being parallel to a top surface of the substrate; second conductive lines disposed in the second direction over the first conductive lines, each of the second conductive lines extending in the first direction; a memory unit between the first and second conductive lines, the memory unit being in each area overlapping the first and second conductive lines in a third direction substantially perpendicular to the top surface of the substrate, and the memory unit including a variable resistance pattern; and an insulation layer structure containing the memory units and the first and second conductive lines therein, the insulation layer structure having an air gap extending in the second direction between the first conductive lines, and a bottom of the air gap being lower than upper surfaces of the first conductive lines.

The embodiments may be realized by providing a variable resistance memory device including a first memory structure including first conductive lines disposed in a first direction on a substrate, each of the first conductive lines extending in a second direction crossing the first direction, and the first and second directions being parallel to a top surface of the substrate; second conductive lines disposed in the second direction over the first conductive lines, each of the second conductive lines extending in the first direction; a first memory unit between the first and second conductive lines, the first memory unit being in each area overlapping the first and second conductive lines in a third direction substantially perpendicular to the top surface of the substrate, and the first memory unit including a first variable resistance pattern; and a first insulation layer structure between the first and second conductive lines, the first insulation layer structure covering the first memory unit and including a first air gap in at least a portion of an area overlapping neither the first conductive lines nor the second conductive lines in the third direction; and a second first memory structure on the first memory structure, the first memory structure including third conductive lines disposed in the second direction, each of the third conductive lines extending in the first direction; fourth conductive lines disposed in the first direction over the third conductive lines, each of the fourth conductive lines extending in the second direction; a second memory unit between the third and fourth conductive lines, the second memory unit being in each area overlapping the third and fourth conductive lines in the third direction, and the second memory unit including a second variable resistance pattern; and a second insulation layer structure between third and fourth conductive lines, the second insulation layer structure covering the second memory unit and including a second air gap in at least a portion of an area overlapping neither the third conductive lines nor the fourth conductive lines in the third direction.

The embodiments may be realized by providing a method of manufacturing a variable resistance memory device, the method including forming first structures in a first direction on a substrate, each of the first structures including a first conductive line, a preliminary selection pattern, a preliminary second electrode and a preliminary first mask sequentially stacked and extending in a second direction crossing the first direction; forming a preliminary sacrificial pattern and a preliminary filling pattern on the substrate to cover sidewalls of the first structures, the preliminary sacrificial pattern and the preliminary filling pattern being sequentially stacked; forming second masks in the second direction on the first structures and the preliminary filling pattern, each of the second masks extending in the first direction; etching the preliminary first mask, the preliminary second electrode, the preliminary selection pattern, the preliminary filling pattern and the preliminary sacrificial pattern using the second masks as an etching mask to form first masks, second electrodes, selection patterns, filling patterns and sacrificial patterns, respectively, the selection patterns, the second electrodes and the first masks forming a plurality of second structures in each of the first and second directions; removing the sacrificial patterns; and forming an insulation layer structure to cover sidewalls of the second structures, the insulation layer structure having an air gap in at least a portion of an area overlapping neither the first conductive lines nor the second masks in a third direction substantially perpendicular to a top surface of the substrate.

The embodiments may be realized by providing a method of manufacturing a variable resistance memory device, the method including forming first structures in a first direction on a substrate, each of the first structures including a first conductive line, a preliminary selection pattern, a preliminary second electrode and a preliminary first mask sequentially stacked and extending in a second direction crossing the first direction; forming a sacrificial layer and a filling layer on the substrate to cover sidewalls of the first structures, the sacrificial layer and the filling layer being sequentially stacked; forming second masks in the second direction on the first structures and the filling layer, each of the second masks extending in the first direction; etching the preliminary first mask, the preliminary second electrode, the preliminary selection pattern, the filling layer and the sacrificial layer using the second masks as an etching mask to form first masks, second electrodes, selection patterns, filling patterns and sacrificial patterns, respectively, the selection patterns, the second electrodes and the first masks forming a plurality of second structures in each of the first and second directions; removing the sacrificial patterns; and forming an insulation layer structure to cover sidewalls of the second structures and the first conductive lines, the insulation layer structure having an air gap between the first conductive lines, and the air gap extending in the second direction.

BRIEF DESCRIPTION OF THE DRAWINGS

Features will be apparent to those of skill in the art by describing in detail exemplary embodiments with reference to the attached drawings in which:

FIG. 1 illustrates a plan view of a variable resistance memory device in accordance with example embodiments.

FIGS. 4 to 30 illustrate plan views and cross-sectional views of stages in a method of manufacturing a variable resistance memory device in accordance with example embodiments;

FIGS. 34 to 39 illustrate plan views and cross-sectional views of stages in a method of manufacturing a variable resistance memory device in accordance with example embodiments;

FIGS. 43 to 48 illustrate plan views and cross-sectional views of stages in a method of manufacturing a variable resistance memory device in accordance with example embodiments;

FIGS. 52 to 63 illustrate plan views and cross-sectional views of stages in a method of manufacturing a variable resistance memory device in accordance with example embodiments;

FIG. 64 illustrates a plan view of a variable resistance memory device in accordance with example embodiments.

FIGS. 79 to 81 illustrate a plan view and cross-sectional views of stages in a method of manufacturing a variable resistance memory device in accordance with example embodiments.

DETAILED DESCRIPTION

Figure 2A:
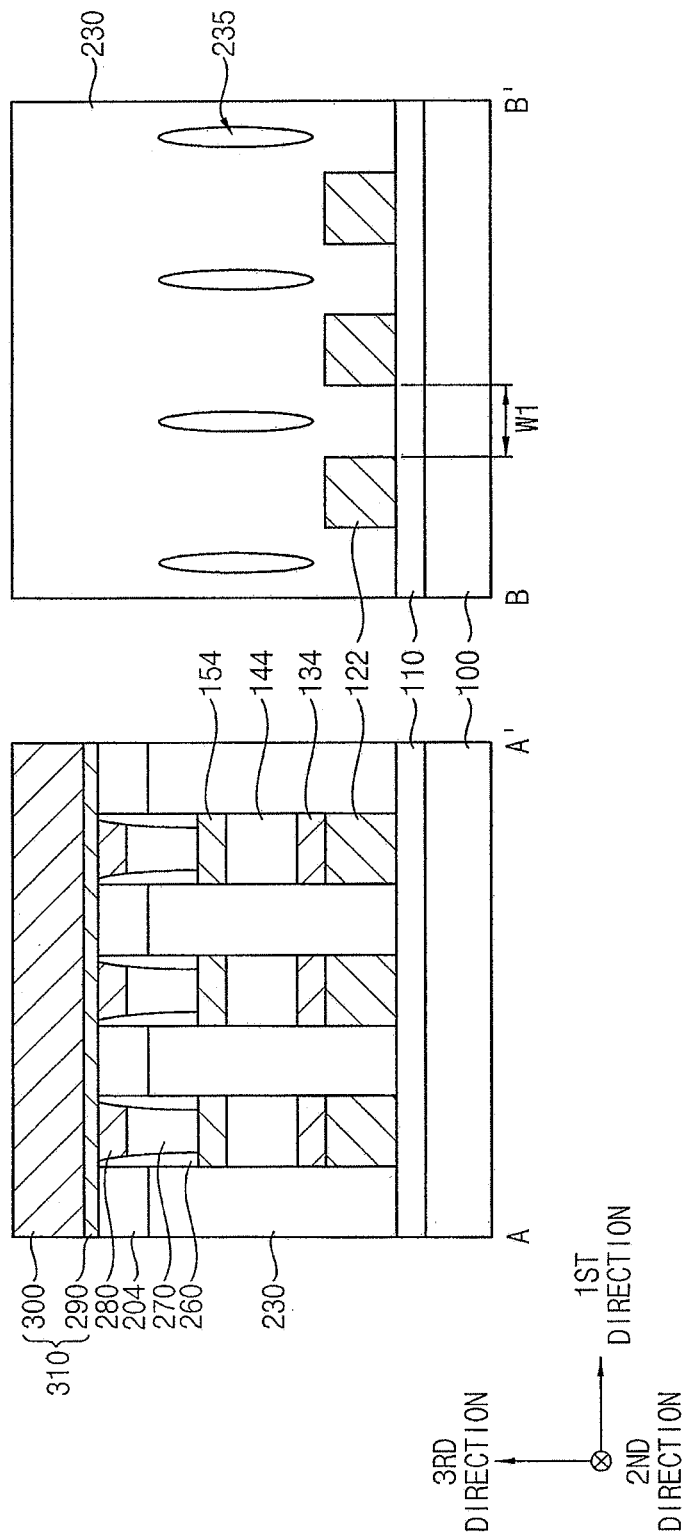
FIGS. 2A, 2B, and 3 illustrate cross-sectional views of the variable resistance memory device of FIG. 1.
Figure 2B:
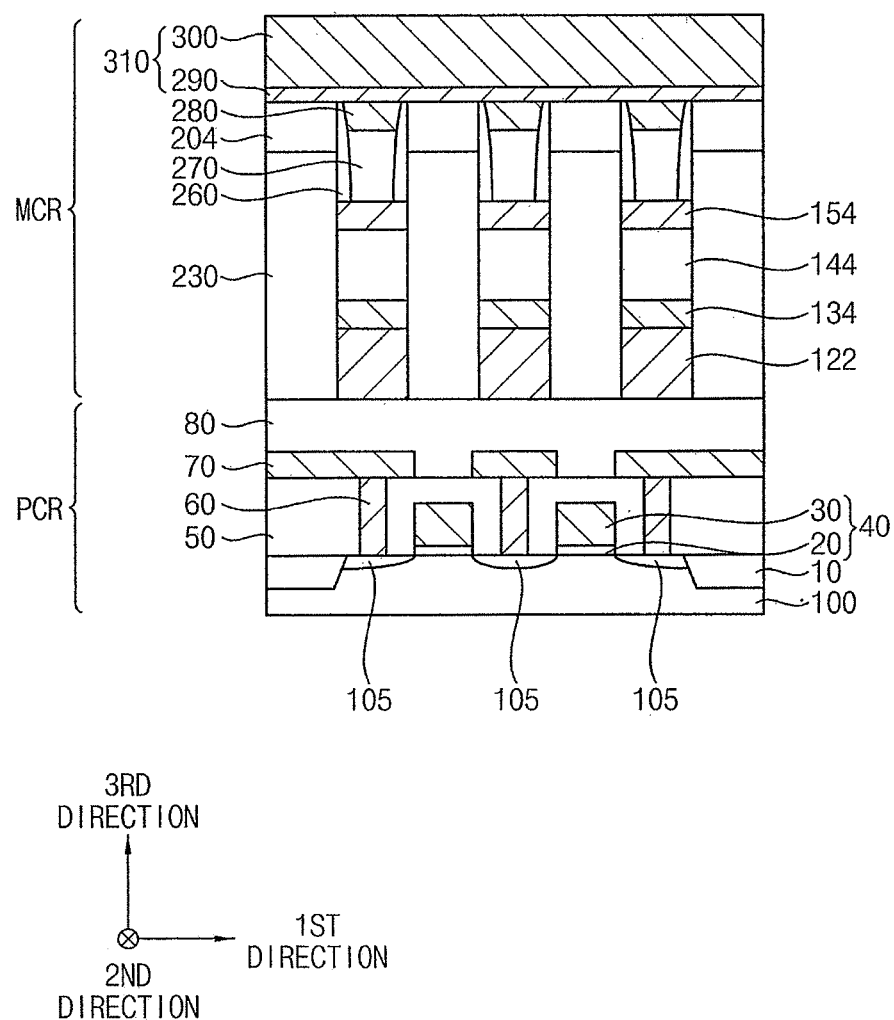
Figure 3:
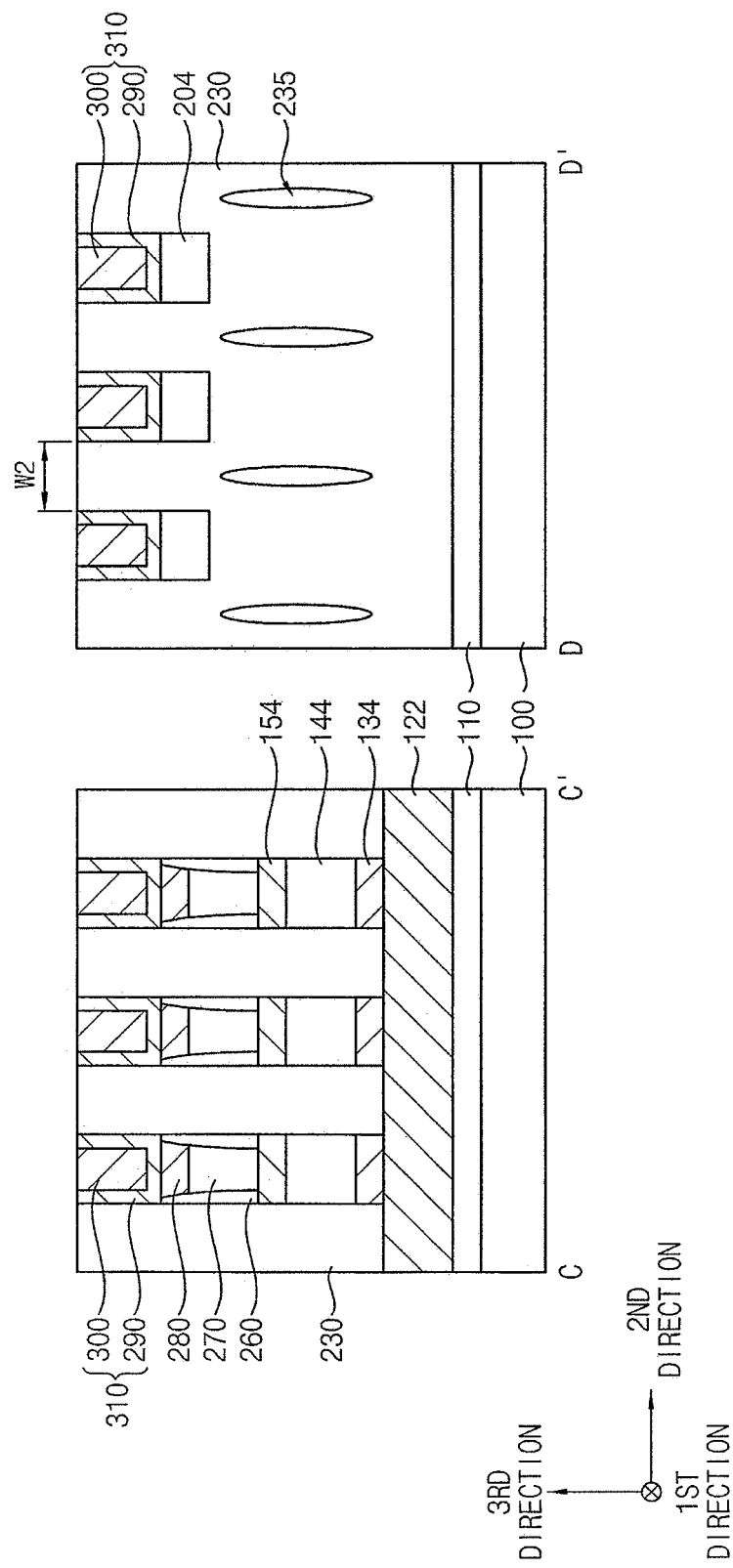

FIG. 1 illustrates a plan view of a variable resistance memory device in accordance with example embodiments, and FIGS. 2A, 2B, and 3 illustrate cross-sectional views of the variable resistance memory device of FIG. 1. FIGS. 2A and 2B illustrate a cross-sectional view including cross-sections taken along lines A-A' and B-B', respectively, in FIG. 1, and FIG. 3 illustrates a cross-sectional view including cross-sections taken along lines C-C' and D-D', respectively, in FIG. 1.

Hereinafter, two directions substantially parallel to an upper surface of a substrate and crossing each other may be defined as first and second directions, respectively, and a direction substantially perpendicular to the upper surface of the substrate may be defined as a third direction. In example embodiments, the first and second directions may cross each other at a right angle so as to be substantially perpendicular to each other.

Referring to FIGS. 1, 2A and 3, the variable resistance memory device may include, e.g., a first conductive line 122, a second conductive line 310, a first memory unit, a second insulation layer 230 having a first air gap 235 therein, and a first filling pattern 204 on a substrate 100.

The variable resistance memory device may further include first and third electrodes 134 and 280, a first spacer 260, and a first insulation layer 110.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be a silicon-on-insulator (SOI) substrate, or a germanium-on-insulator (GOI) substrate. As used herein, the term "or" is not an exclusive term in that an element including A or B covers situations in which the element includes A, includes B, and includes A and B.

Various elements, e.g., gate structures, source/drain layers, contact plugs, wirings, etc. may be formed on the substrate 100, and may be covered by the first insulation layer 110. The first insulation layer 110 may include an insulating material, e.g., silicon oxide, silicon nitride, silicon oxynitride, etc.

The first conductive line 122 may extend in the second direction on the first insulation layer 110, and a plurality of first conductive lines 122 may be spaced apart from each other by a first width W1 in the first direction.

The first conductive line 122 may include a metal, e.g., tungsten, platinum, palladium, rhodium, ruthenium, iridium, copper, aluminum, titanium, tantalum, etc., or a metal nitride.

The second conductive line 310 may be disposed over the first conductive line 122 and spaced apart from the first conductive line 122. The second conductive line 310 may extend in the first direction, and a plurality of second conductive lines 310 may be spaced apart from each other by a second width W2 in the second direction.

The second conductive line 310 may include a first metal pattern 300 and a first barrier pattern 290 covering a sidewall and a lower surface of the first metal pattern 300. The first metal pattern 300 may include a metal, e.g., tungsten, platinum, palladium, rhodium, ruthenium, iridium, copper, aluminum, titanium, tantalum, etc., and the first barrier pattern 290 may include a metal nitride, e.g., titanium nitride, tantalum nitride, tungsten nitride, etc.

The first memory unit may be formed between the first and second conductive lines 122 and 310, e.g., at a region where the first and second conductive lines 122 and 310 overlap each other in the third direction.

The first memory unit may include a first selection pattern 144, a second electrode 154, and a first variable resistance pattern 270.

The first selection pattern 144 may include an ovonic threshold switch (OTS) material that may serve as a switching element by the resistance difference due to the temperature difference in an amorphous state. For example, the first selection pattern 144 may be in an amorphous state within a range of temperature wider than that of the first variable resistance pattern 270. In an implementation, the first selection pattern 144 may have a large resistance difference due to the temperature difference even in the amorphous state.

The OTS material may include, e.g., germanium, silicon, arsenic and/or tellurium. In an implementation, the OTS material may further include selenium or sulfur.

The OTS material may include, e.g., AsTeGeSiIn, GeTe, SnTe, GeSe, SnSe, AsTeGeSiSbS, AsTeGeSiIP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_{7}P$, $As_{10}Te_{21}S_2Ge_{15}Se_{50}Sb_2$, $Si_5Te_{34}As_{28}Ge_{11}S_{21}Se_1$, AsTeGeSiSeNS, AsTeGeSiP, AsSe, AsGeSe, AsTeGeSe, ZnTe, GeTePb, GeSeTe, AlAsTe, SeAsGeC, SeTeGeSi, GeSbTeSe, GeBiTeSe, GeAsSbSe, GeAsBiTe, GeAsBiSe, $Ge_xSe_{1-x}$, etc.

In an implementation, the first selection pattern 144 may include a polysilicon layer doped with n-type impurities and a polysilicon layer doped with p-type impurities sequentially stacked, e.g., a diode.

The second electrode 154 may heat the first variable resistance pattern 270, and the resistance of the first variable resistance pattern 270 may be changed. In example embodiments, the second electrode 154 may include, e.g., carbon, metal containing carbon, or metal nitride containing carbon. In an implementation, the second electrode 154 may include carbon or a carbonitride (e.g., titanium carbonitride and/or tantalum carbonitride).

In example embodiments, the first variable resistance pattern 270 may include a material whose phase may be changed due to the temperature difference, and thus the phase of the first variable resistance pattern 270 may be changed due to the temperature difference. In this case, the variable resistance memory device may be a phase-change random access memory (PRAM) device.

In an example embodiment, the first variable resistance pattern 270 may include a chalcogenide material containing germanium, antimony, or tellurium. In an example embodiment, the first variable resistance pattern 270 may include a super lattice having a germanium-tellurium layer and an antimony-tellurium layer alternately stacked. In an example embodiment, the first variable resistance pattern 270 may include GST (germanium-antimony-tellurium), IST (indium-antimony-tellurium), or BST (bismuth-antimony-tellurium).

In example embodiments, the first variable resistance pattern 270 may include a perovskite-based material or a transition metal. In this case, the variable resistance memory device may be a resistive random access memory (ReRAM) device.

The perovskite-based material may include, e.g., STO ($SrTiO_3$), BTO ($BaTiO_3$), PCMO ($Pr_{1-x}Ca_xMnO_3$), or the like. The transition metal oxide may include titanium oxide (TiOx), zirconium oxide (ZrOx), aluminum oxide (AlOx), hafnium oxide (HfOx), tantalum oxide (TaOx), niobium oxide (NbOx), cobalt oxide (CoOx), tungsten oxide (WOx), lanthanum oxide (LaOx) or zinc oxide (ZnOx). These may be used alone or in combination.

In example embodiments, the first variable resistance pattern 270 may include a material whose resistance may be changed by a magnetic field or a spin transfer torque (STT). In this case, the variable resistance memory device may be a magnetic random access memory (MRAM) device.

In an implementation, the first variable resistance pattern 270 may include a ferromagnetic material, e.g., iron (Fe), nickel (Ni), cobalt (Co), dysprosium (Dy), gadolinium (Gd), or the like.

In example embodiments, a plurality of first memory units may be formed in each of the first and second directions, and may be disposed in a grid pattern in a plan view.

The first memory unit may include the first selection pattern 144, the second electrode 154, and the first variable resistance pattern 270 sequentially stacked in this order from a bottom toward a top thereof. In an implementation, the first memory unit may include the first variable resistance pattern 270, the second electrode 154, and the first selection pattern 144 sequentially stacked in this order from the bottom toward the top thereof.

The first electrode 134 may be formed between the first conductive line 122 and the first selection pattern 144, and the third electrode 280 may be formed between the second conductive line 310 and the first variable resistance pattern 270. A plurality of first electrodes 134 and a plurality of third electrodes 280 may be formed in each of the first and second directions.

Each of the first and third electrodes 134 and 280 may include a metal nitride or a metal silicon nitride, e.g., titanium nitride, titanium silicon nitride, tungsten nitride, tungsten silicon nitride, tantalum nitride, tantalum silicon nitride, zirconium nitride, zirconium silicon nitride, etc.

In an implementation, the first electrode 134 may not be formed, and the third electrode 280 may contact a lower surface of the second conductive line 310 and extend in the first direction.

In example embodiments, sidewalls of the first variable resistance pattern 270 and the third electrode 280 may be covered by the first spacer 260.

The first spacer 260 may include an oxide, e.g., silicon oxide.

In example embodiments, in a plan view, a structure including the first variable resistance pattern 270, the third electrode 280 and the first spacer 260 may have a shape and an area substantially the same as those of the first selection pattern 144 or those of the first electrode 134.

The second insulation layer 230 may be formed between the first conductive lines 122 and between the second conductive lines 310, and may cover the first electrode 134, the first memory unit, the third electrode 280, and the first spacer 260. In an implementation, the second insulation layer 230 may cover sidewalls of the first and second conductive lines 122 and 310.

The second insulation layer 230 may include a nitride, e.g., silicon nitride.

The first filling pattern 204 may be formed under the second conductive line 310, and may cover an upper sidewall of the first spacer 260. In example embodiments, the first filling pattern 204 may contact a lower surface of the second conductive line 310 extending in the first direction, and a plurality of first filling patterns 204 may be formed in the first direction. The first filling pattern 204 may cover an upper portion of one of opposite sidewalls of the first spacer 260 in the first direction.

In example embodiments, a lower surface of the first filling pattern 204 may be higher than an upper surface of the second electrode 154. The lower surface of the first filling pattern 204 may be lower or higher than a lower surface of the third electrode 280.

The first filling pattern 204 may include a material substantially the same as or different from that of the second insulation layer 230. The first filling pattern 204 may include a nitride, e.g., silicon nitride.

In example embodiments, the first air gap 235 in the second insulation layer 230 may be formed in at least a portion of an area overlapping neither the first conductive line 122 nor the second conductive line 310 in the third direction.

In example embodiments, a plurality of first air gaps 235 may be formed in each of the first and second directions, and may be disposed in a grid pattern in a plan view.

In example embodiments, a top of the first air gap 235 may be lower than the lower surface of the first filling pattern 204. Thus, the top of the first air gap 235 may be spaced apart from the lower surfaces of the second conductive lines 310, and when the second conductive lines 310 are formed, the second conductive lines 310 may not electrically short with each other. A bottom of the first air gap 235 may be higher than upper surfaces of the first conductive lines 122.

The top of the first air gap 235 may be higher than an upper surface of the second electrode 154, and the bottom of the first air gap 235 may be lower than an upper surface of the first electrode 134. Thus, the parasitic capacitance between the second electrodes 154 or between the first electrodes 134 may be advantageously reduced.

The variable resistance memory device may have a cell over peri (COP) structure in which peripheral circuits and memory cells are sequentially stacked, which is shown in FIG. 2B.

Referring to FIG. 2B, the variable resistance memory device may include a peripheral circuit region PCR and a memory cell region MCR sequentially stacked.

In example embodiments, a gate structure 40, an impurity layer 105, a first contact plug 60, and a wiring 70 may be formed on the substrate 100 having an isolation layer 10 thereon in the PCR. The first conductive line 122, the second conductive line 310, the first memory unit, and the second insulation layer 230 may have the first air gap 235 therein. The first filling pattern 204, etc. may be formed in the MCR.

The gate structure 40 may include a gate insulation pattern 20 and a gate electrode 30 sequentially stacked. The gate insulation pattern 20 may include, e.g., silicon oxide, metal oxide, etc., and the gate electrode 30 may include, e.g., doped polysilicon, metal, metal silicide, metal nitride, etc. A gate spacer may be further formed on a sidewall of the gate structure 40.

The impurity region 105 may be formed at an upper portion of the substrate 100 adjacent the gate structure 40. The impurity layer 105 may include n-type impurities or p-type impurities.

The gate structure 40 and the impurity layer 105 may form a transistor, and the transistor may serve as a negative-channel metal oxide semiconductor (NMOS) transistor or a positive-channel metal oxide semiconductor (PMOS) transistor according to the conductivity type of the impurities of the impurity layer 105.

The transistor may be covered by a first lower insulating interlayer 50 on the substrate 100. The first lower insulating interlayer 50 may include an oxide, e.g., silicon oxide.

The first contact plug 60 may extend through the first lower insulating interlayer 50, and may contact an upper surface of the impurity layer 105. In example embodiments, a plurality of first contact plugs 60 may be formed.

The wiring 70 may be formed on the first lower insulating interlayer 50, and may contact an upper surface of the first contact plug 60. In example embodiments, the wiring 70 may extend in the first direction and/or in the second direction, and a plurality of wirings 70 may be formed in the second direction and/or in the first direction. According to the circuit layout, at least one of the wirings 70 may directly contact the first conductive lines 122 and/or the second conductive lines 310, or may be electrically connected thereto via a second contact plug.

The wiring 70 may be covered by a second lower insulating interlayer 80 on the first lower insulating interlayer 50. The second lower insulating interlayer 80 may include an oxide, e.g., silicon oxide.

The first contact plug 60 and the wiring 70 may include, e.g., metal, metal nitride, metal silicide, doped polysilicon, etc.

Figure 4:
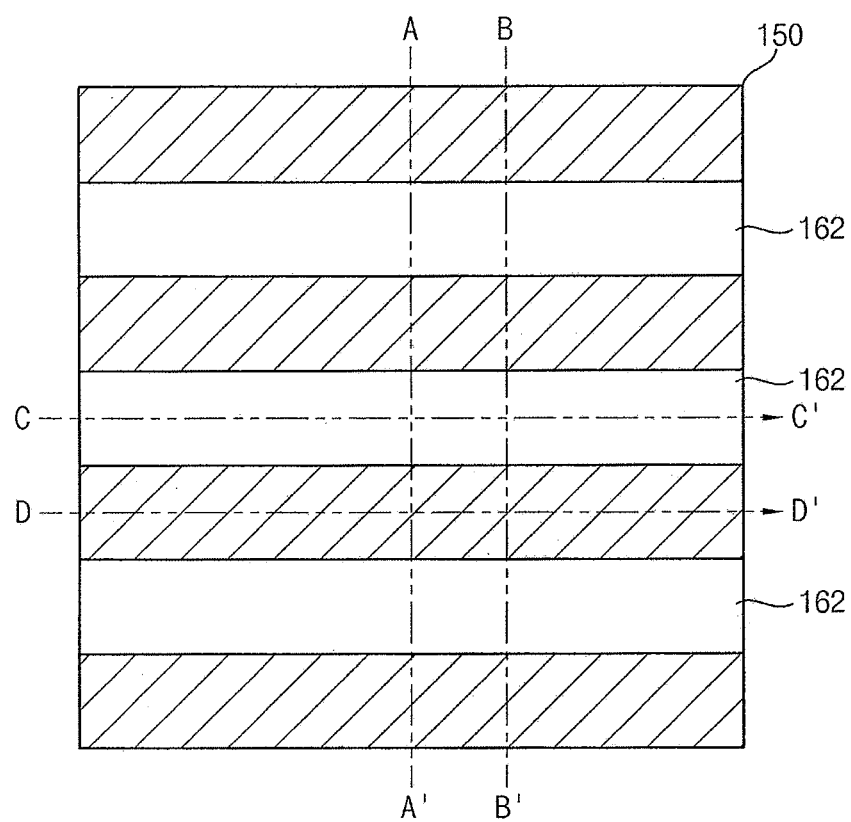
Figure 5:
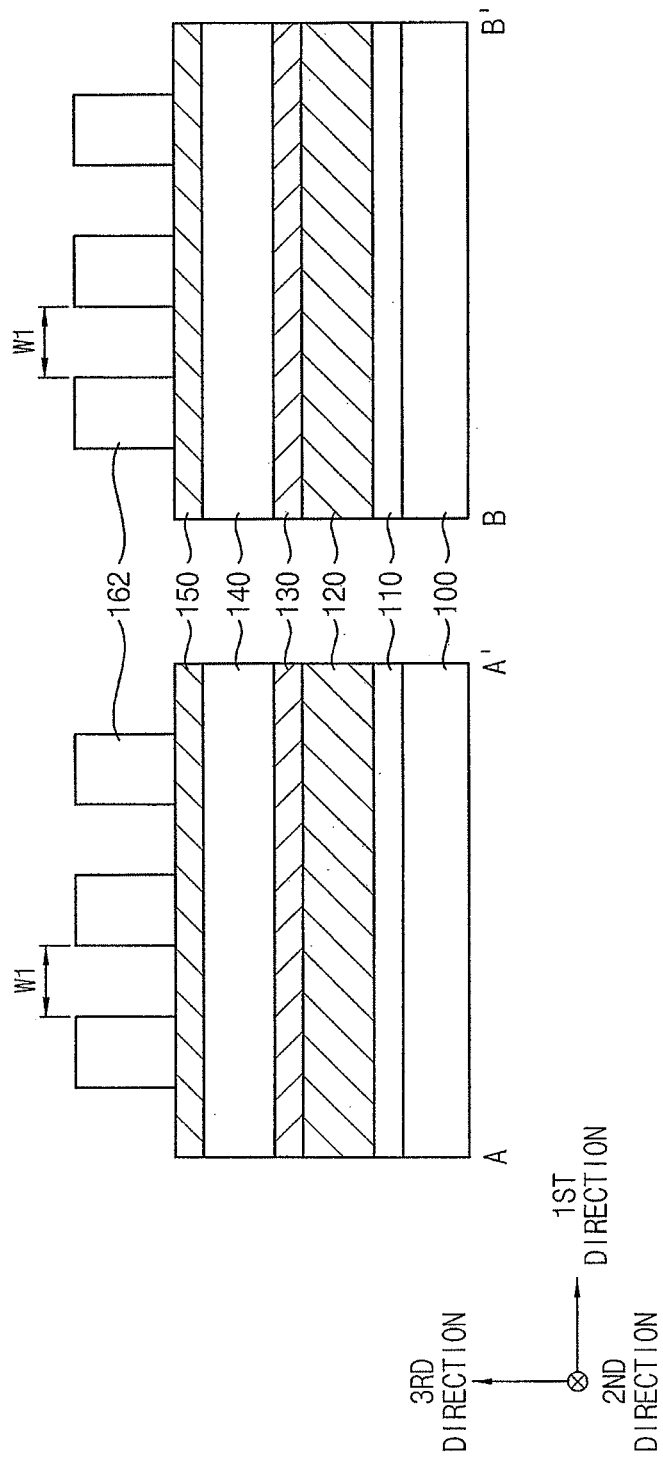
Figure 6:
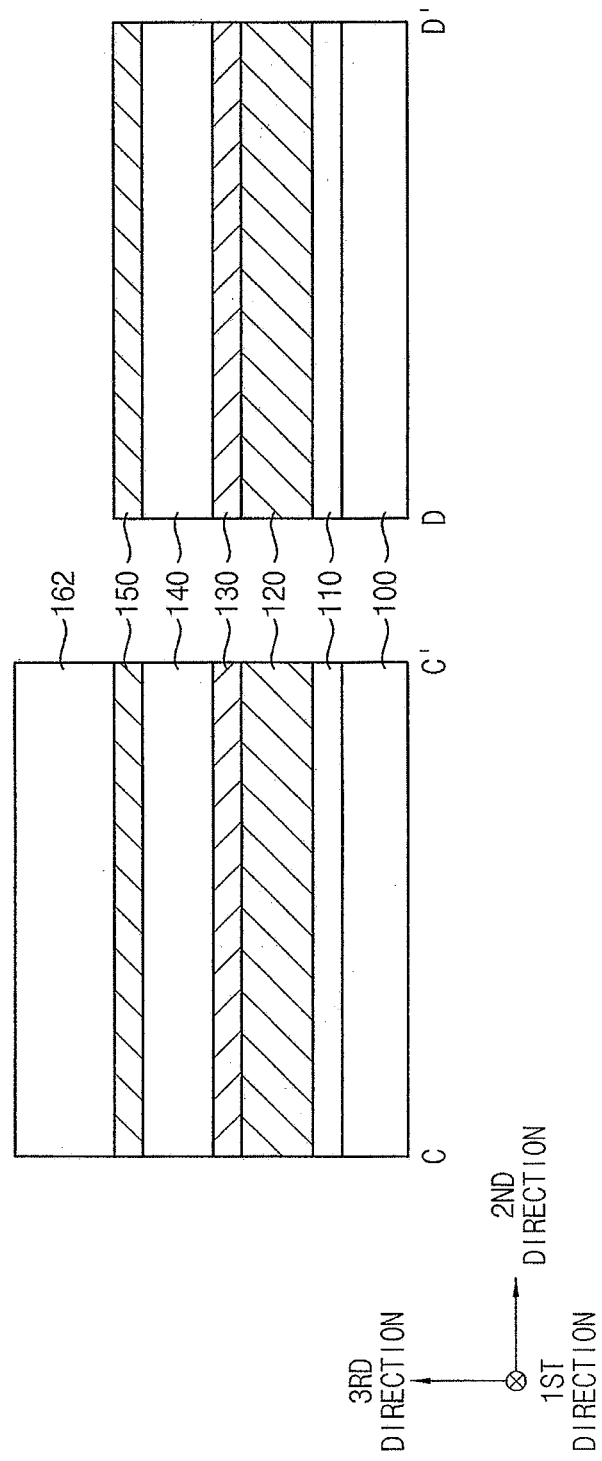

FIGS. 4 to 30 illustrate plan views and cross-sectional views of stages in a method of manufacturing a variable resistance memory device in accordance with example embodiments. FIGS. 4, 7, 10, 13, 16, 19, 22, 25 and 28 are plan views, FIGS. 5, 8, 11, 14, 17, 20, 23, 26 and 29 are cross-sectional views including cross-sections taken along lines A-A' and B-B', respectively, of corresponding plan views, and FIGS. 6, 9, 12, 15, 18, 21, 24, 27 and 30 are cross-sectional views including cross-sections taken along lines C-C' and D-D', respectively, of corresponding plan views. Referring to FIGS. 4 to 6, a first insulation layer 110, a first conductive layer 120, a first electrode layer 130, a first selection layer 140, and a second electrode layer 150 may be sequentially formed on a substrate 100, and a preliminary first mask 162 may be formed on the second electrode layer 150.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be an SOI substrate or a GOI substrate.

Various elements, e.g., gate structures, source/drain layers, contact plugs, wirings, etc. may be formed on the substrate 100, and may be covered by the first insulation layer 110.

The first insulation layer 110 may be formed of an insulating material, e.g., silicon oxide, silicon nitride, silicon oxynitride, etc.

The first conductive layer 120 may be formed of a metal, e.g., tungsten, platinum, palladium, rhodium, ruthenium, iridium, copper, aluminum, titanium, tantalum, etc., or a metal nitride.

The first electrode layer 130 may be formed of a metal nitride or a metal silicon nitride, e.g., titanium nitride, titanium silicon nitride, tungsten nitride, tungsten silicon nitride, tantalum nitride, tantalum silicon nitride, zirconium nitride, zirconium silicon nitride, etc.

In example embodiments, the first selection layer 140 may be formed of an OTS material that may serve as a switching element by the resistance difference due to the temperature difference in an amorphous state.

The OTS material may include, e.g., germanium, silicon, arsenic and/or tellurium. In an implementation, the OTS material may further include selenium and/or sulfur.

In an implementation, the OTS material may include, e.g., AsTeGeSiIn, GeTe, SnTe, GeSe, SnSe, AsTeGeSiSbS, AsTeGeSiIP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P$, $As_{10}Te_{21}S_2Ge_{15}Se_{50}Sb_2$, $Si_5Te_{34}As_{28}Ge_{11}S_{21}Se_1$, AsTeGe-SiSeNS, AsTeGeSiP, AsSe, AsGeSe, AsTeGeSe, ZnTe, GeTePb, GeSeTe, AlAsTe, SeAsGeC, SeTeGeSi, GeSb-TeSe, GeBiTeSe, GeAsSbSe, GeAsBiTe, GeAsBiSe, $Ge_xSe_{1-x}$, etc.

In an implementation, the first selection layer 140 may include a polysilicon layer doped with n-type impurities and a polysilicon layer doped with p-type impurities sequentially stacked, e.g., a diode.

The second electrode layer 150 may be formed of carbon, a metal containing carbon, or a metal nitride containing carbon. In an implementation, the second electrode layer 150 may be formed of carbon or a carbonitride (e.g., titanium carbonitride and/or tantalum carbonitride).

The preliminary first mask 162 may be formed of, e.g., silicon oxide or polysilicon.

In example embodiments, the preliminary first mask 162 may extend in the second direction, and a plurality of preliminary first masks 162 may be formed in the first direction. The preliminary first masks 162 may be spaced apart from each other by a first width W1 in the first direction.

In an implementation, the first electrode layer 130 may be omitted.

Figure 8:
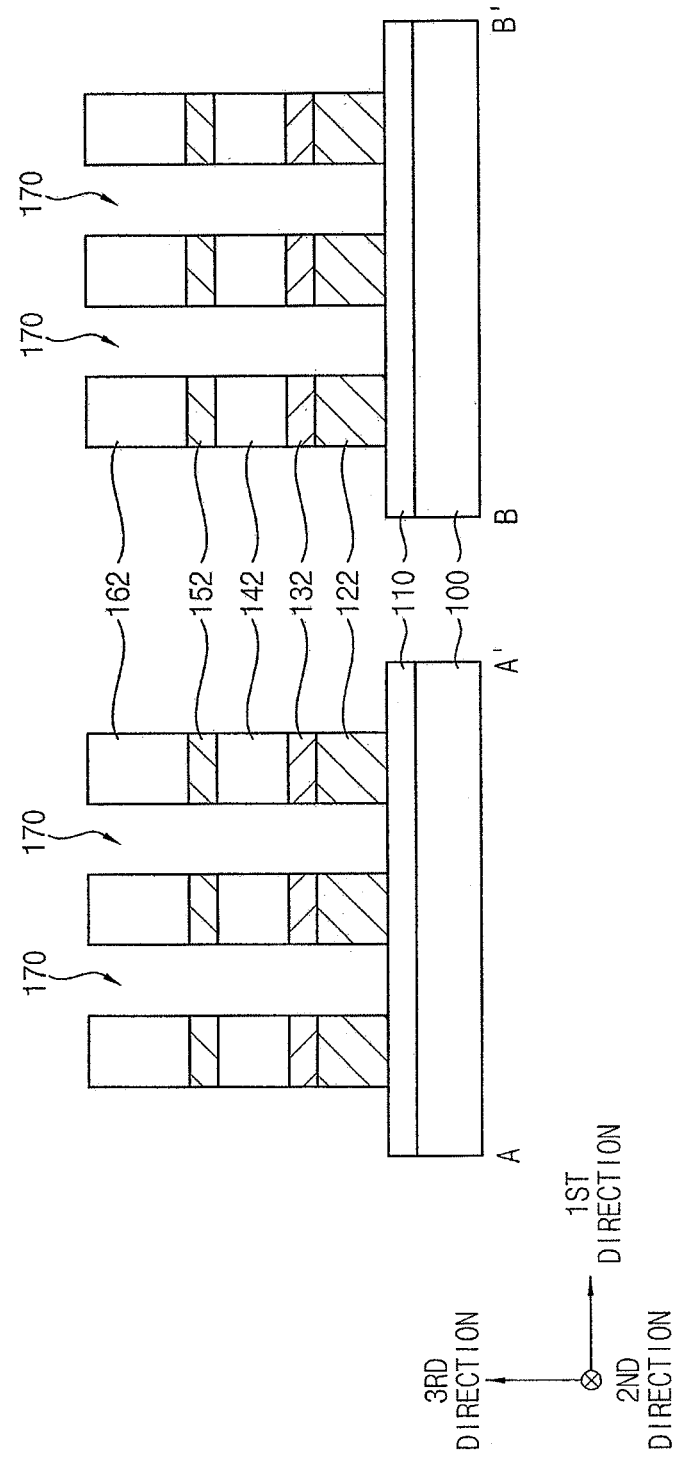
Figure 9:
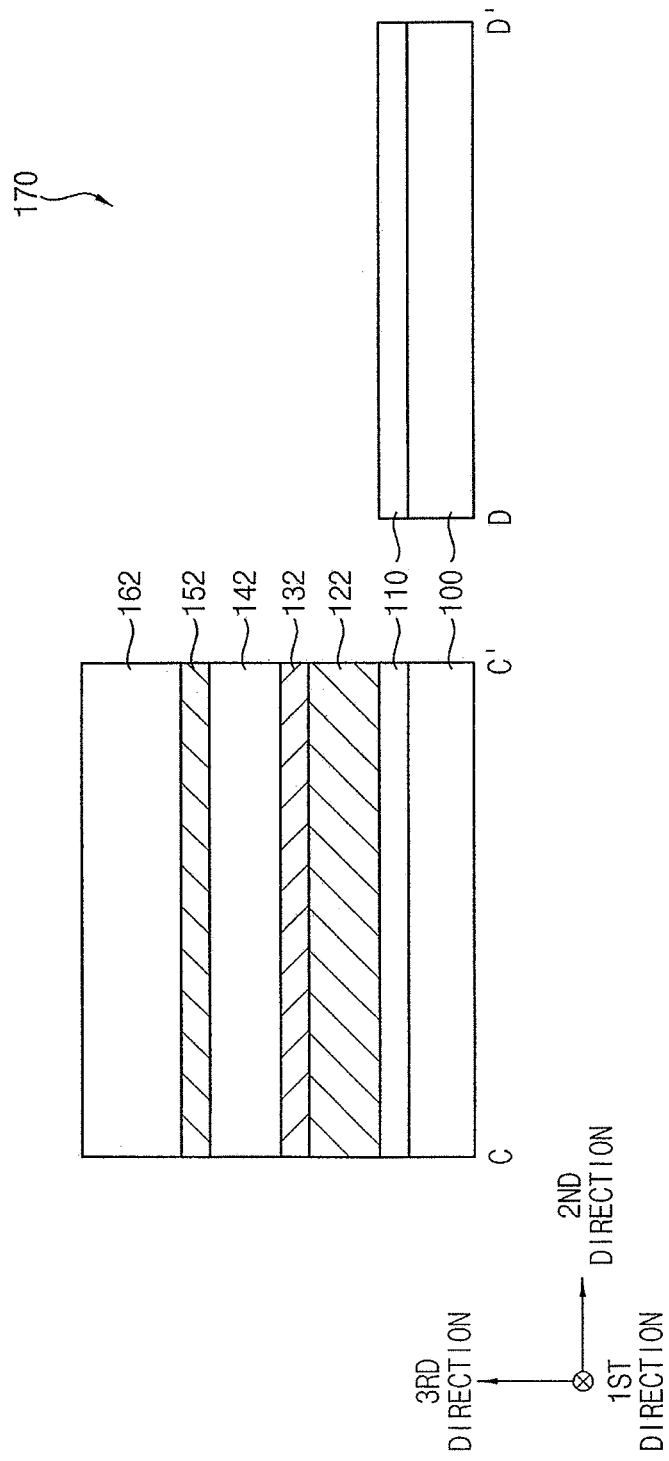

Referring to FIGS. 7 to 9, the second electrode layer 150, the first selection layer 140, the first electrode layer 130, and the first conductive layer 120 may be sequentially etched using the preliminary first mask 162 as an etching mask to form a preliminary second electrode 152, a preliminary first selection pattern 142, a preliminary first electrode 132, and a first conductive line 122, respectively.

Thus, a first structure including the first conductive line 122, the preliminary first electrode 132, the preliminary first selection pattern 142, the preliminary second electrode 152, and the preliminary first mask 162 sequentially stacked may be formed on the first insulation layer 110. The first structure may extend in the second direction, and a plurality of first structures may be formed to be spaced apart from each other in the first direction. A space between the first structures may be defined as a first opening 170.

Figure 11:
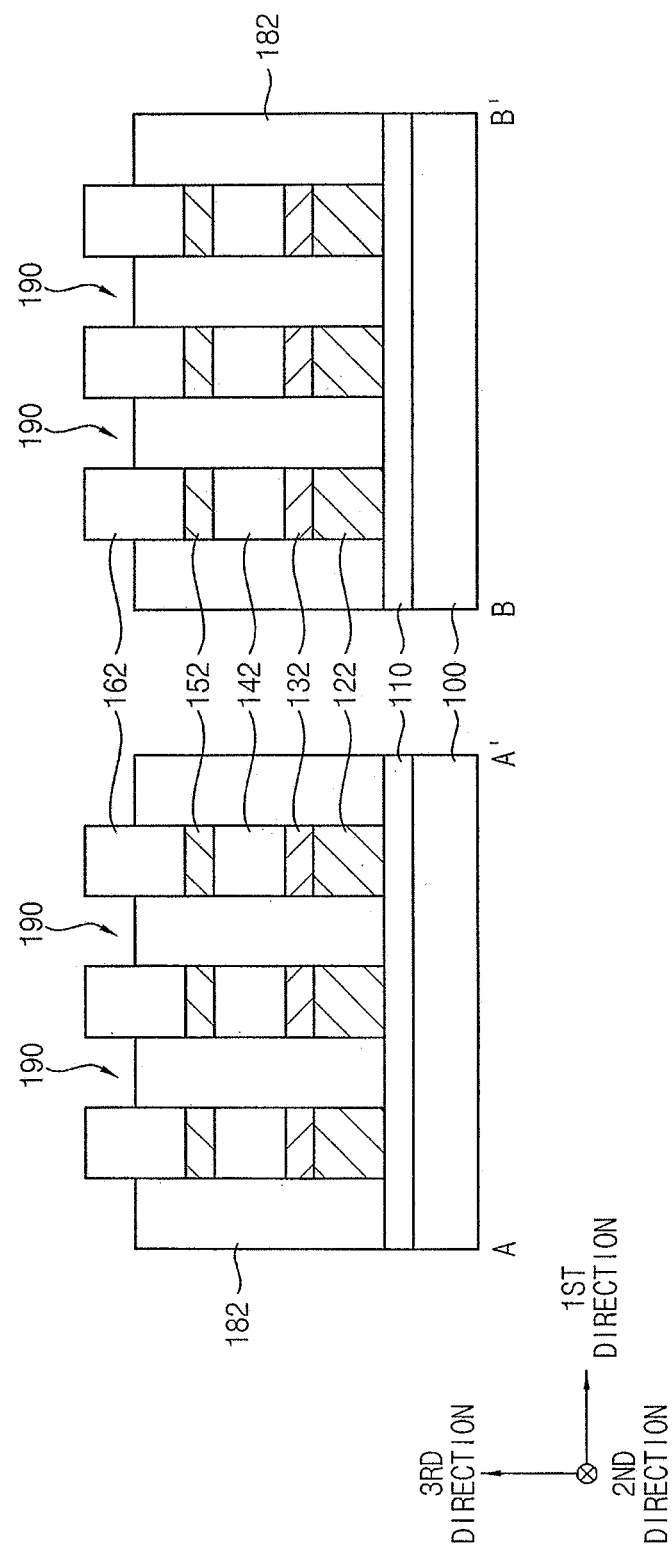
Figure 12:
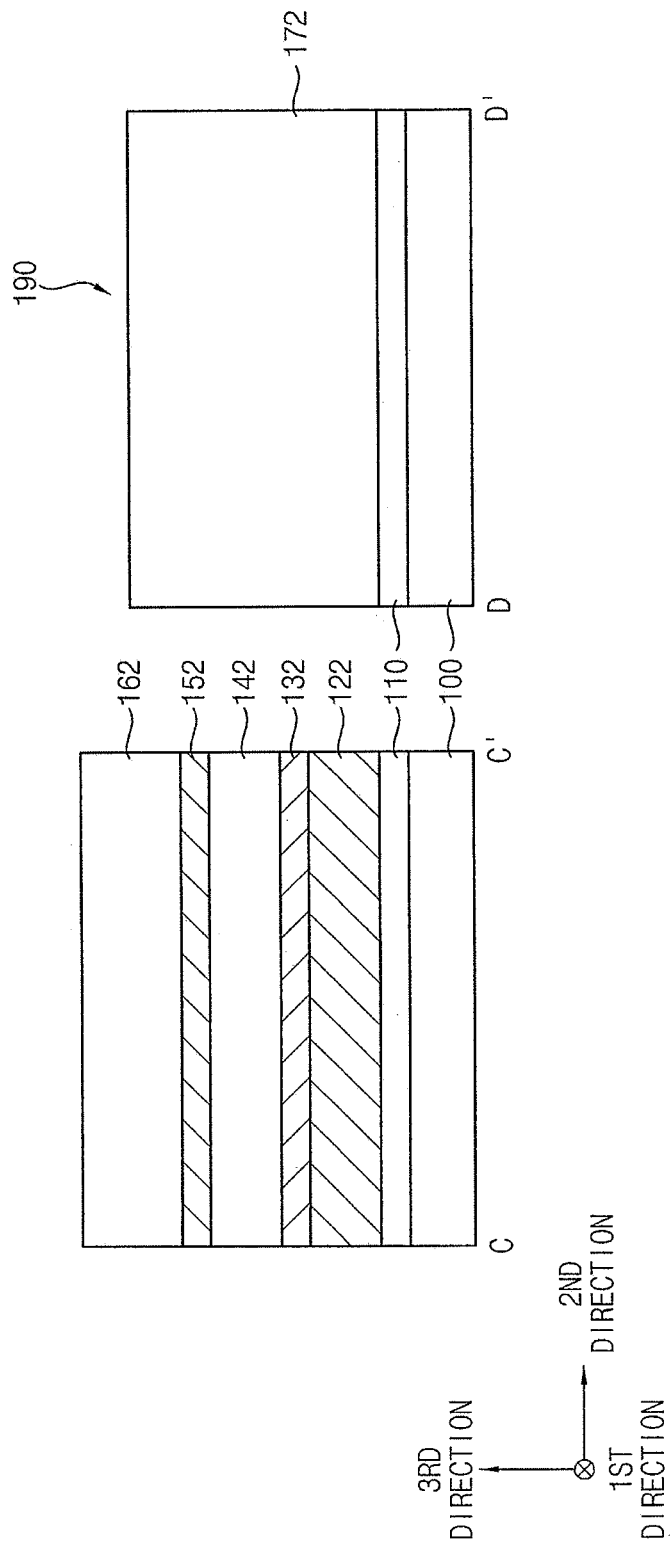

Referring to FIGS. 10 to 12, a preliminary sacrificial pattern 182 may be formed to partially fill the first opening 170.

In example embodiments, a sacrificial layer may be formed on the first insulation layer 110 and the first structure to fill the first opening 170, the sacrificial layer may be planarized until an upper surface of the first structure is exposed to form a preliminary sacrificial pattern 182, and an upper portion of the preliminary sacrificial pattern 182 may be removed so that the preliminary sacrificial pattern 182 may partially fill the first opening 170.

In example embodiments, the planarization process may be performed by a chemical mechanical polishing (CMP) process. The upper portion of the preliminary sacrificial pattern 182 may be removed by an etch back process.

In example embodiments, the sacrificial layer may be formed of a material that may be easily removed by an ashing process. For example, the sacrificial layer may be formed of silicon-on-hardmask (SOH).

As the upper portion of the preliminary sacrificial pattern 182 is removed, a recess 190 may be formed to expose an upper sidewall of the first structure. In example embodiments, the recess 190 may have a bottom higher than an upper surface of the preliminary second electrode 152.

A depth of the recess 190, e.g., a height of the bottom of the recess 190 may determine a height of a top of a first air gap 235 subsequently formed (refer to FIGS. 22 to 24). Thus, the first air gap 235 may have a desired size by controlling the depth of the recess 190.

Figure 14:
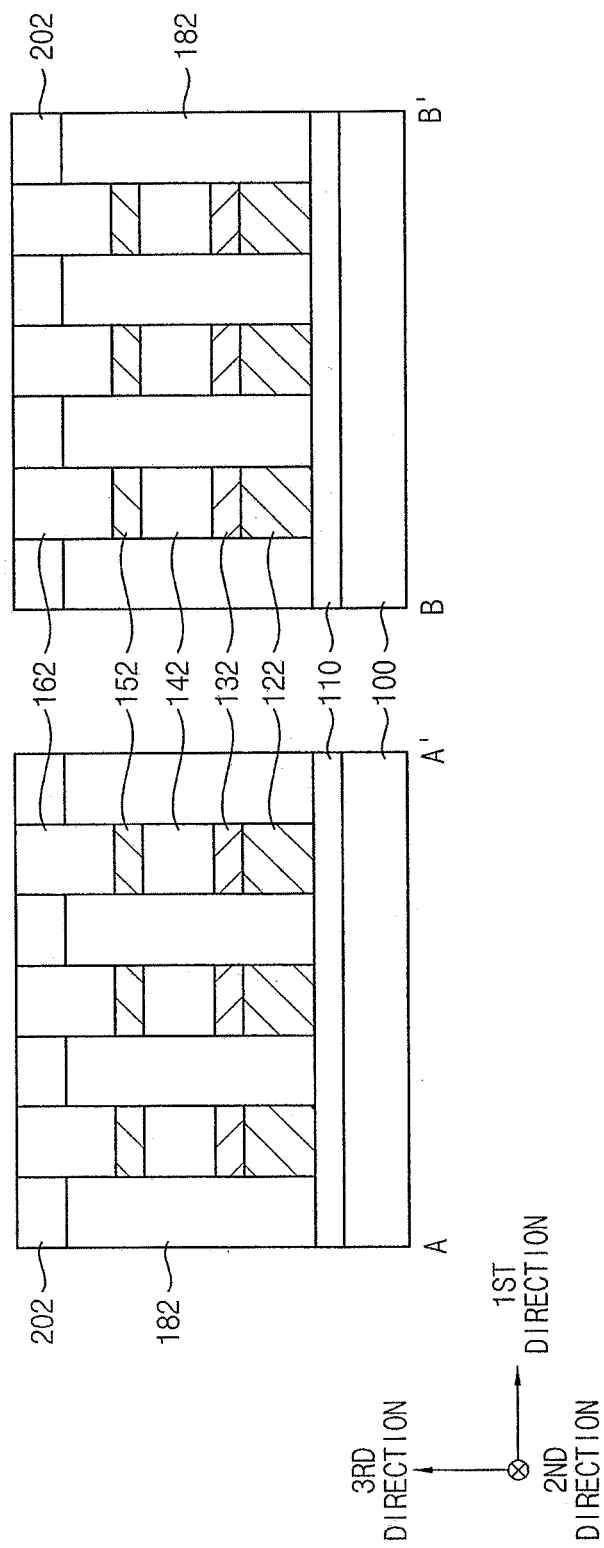
Figure 15:
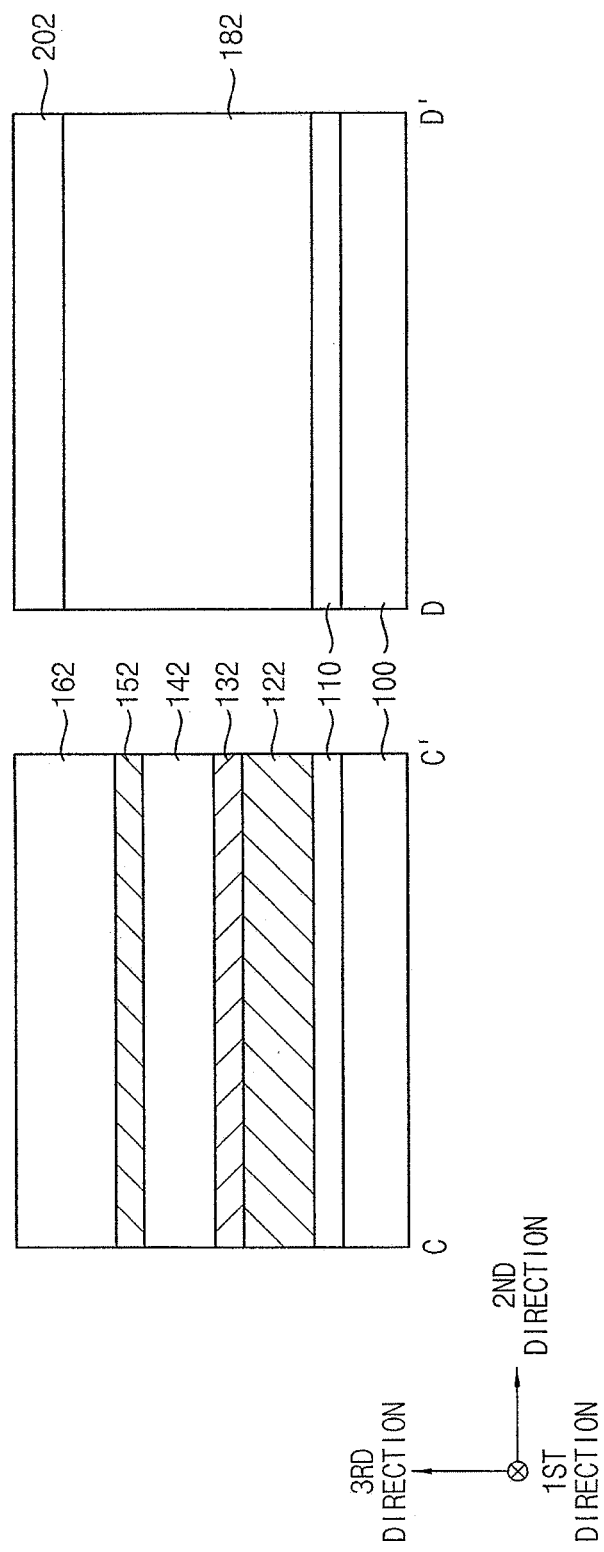

Referring to FIGS. 13 to 15, a preliminary first filling pattern 202 may be formed to fill the recess 190.

In example embodiments, a filling layer may be formed on the preliminary sacrificial pattern 182 and the first structure to fill the recess 190, and may be planarized until the upper surface of the first structure may be exposed to form the preliminary first filling pattern 202 in the recess 190.

In example embodiments, the planarization process may be performed by a CMP process.

The filling layer may be formed of a material having a high etching selectivity with respect to the preliminary first mask 162, e.g., a nitride such as silicon nitride.

Figure 17:
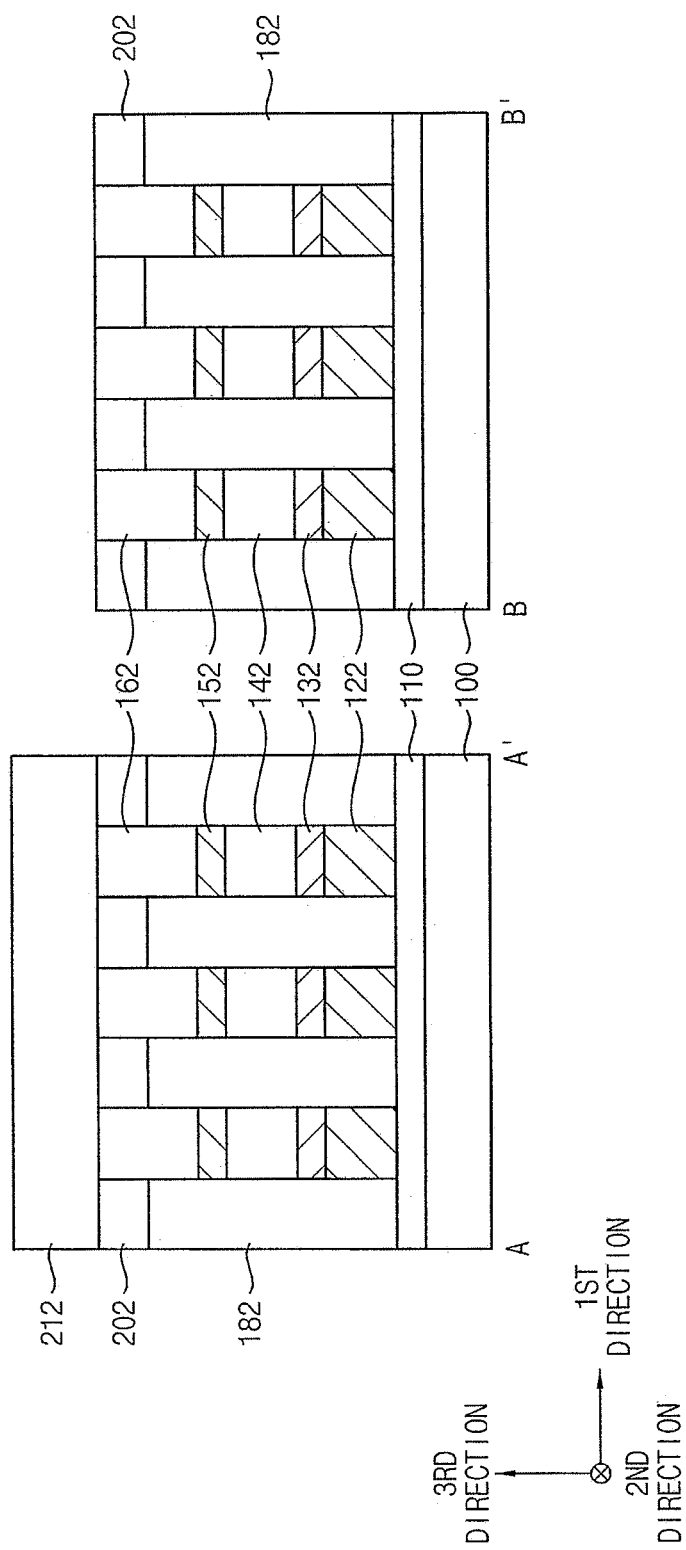
Figure 18:
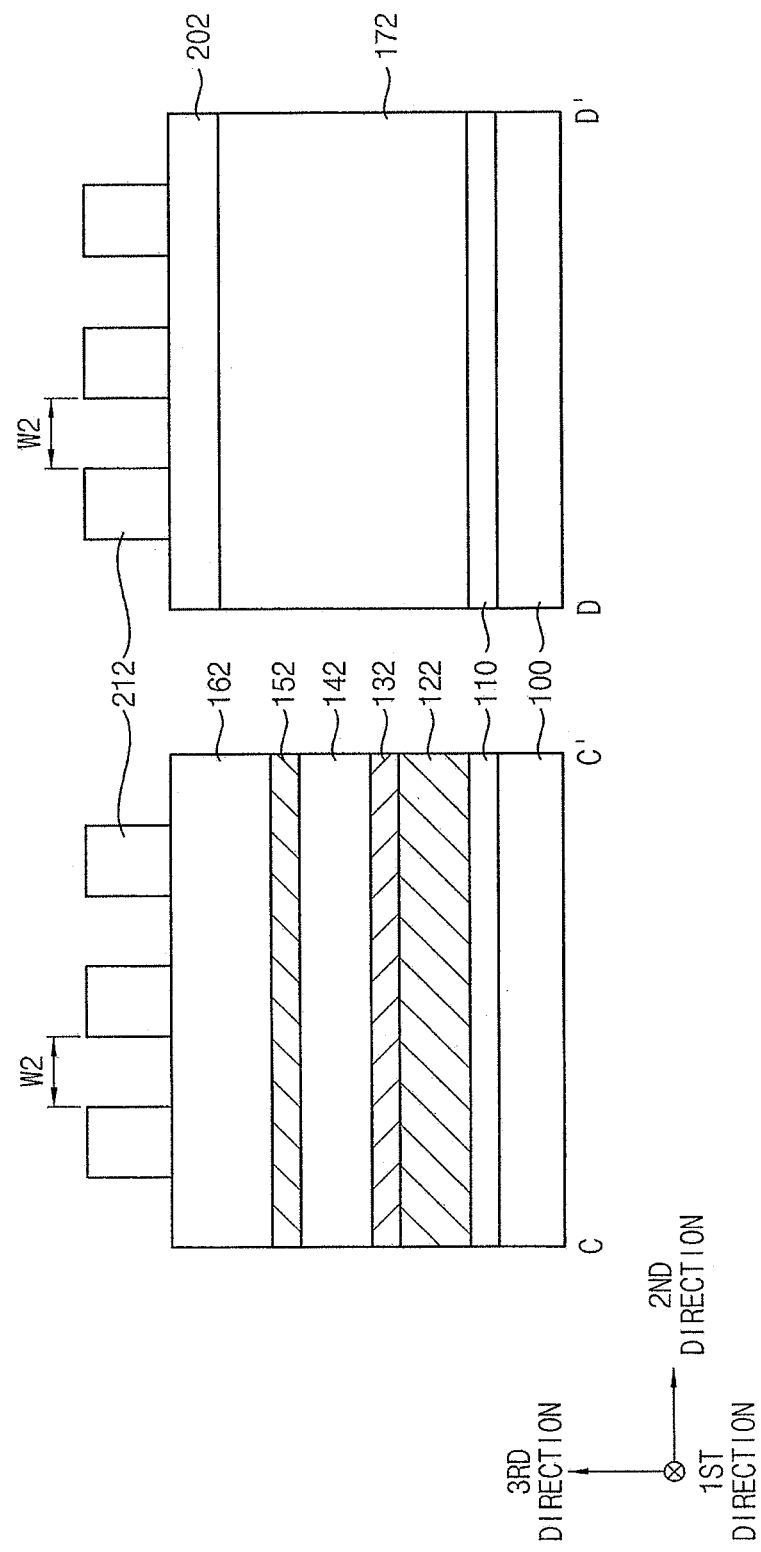

Referring to FIGS. 16 to 18, a second mask 212 may be formed on the first structure and the preliminary first filling pattern 202.

The second mask 212 may be formed of, e.g., silicon oxide or polysilicon. The second mask 212 may include substantially the same material as that of the preliminary first mask 162 so that the second mask 212 may be merged with the preliminary first mask 162, or the second mask 212 may include a material different from that of the preliminary first mask 162.

In example embodiments, the second mask 212 may extend in the first direction, and a plurality of second masks 212 may be formed in the second direction. The second masks 212 may be spaced apart from each other by a second width W2 in the second direction. In example embodiments, the second width W2 may be substantially equal to the first width W1.

Figure 20:
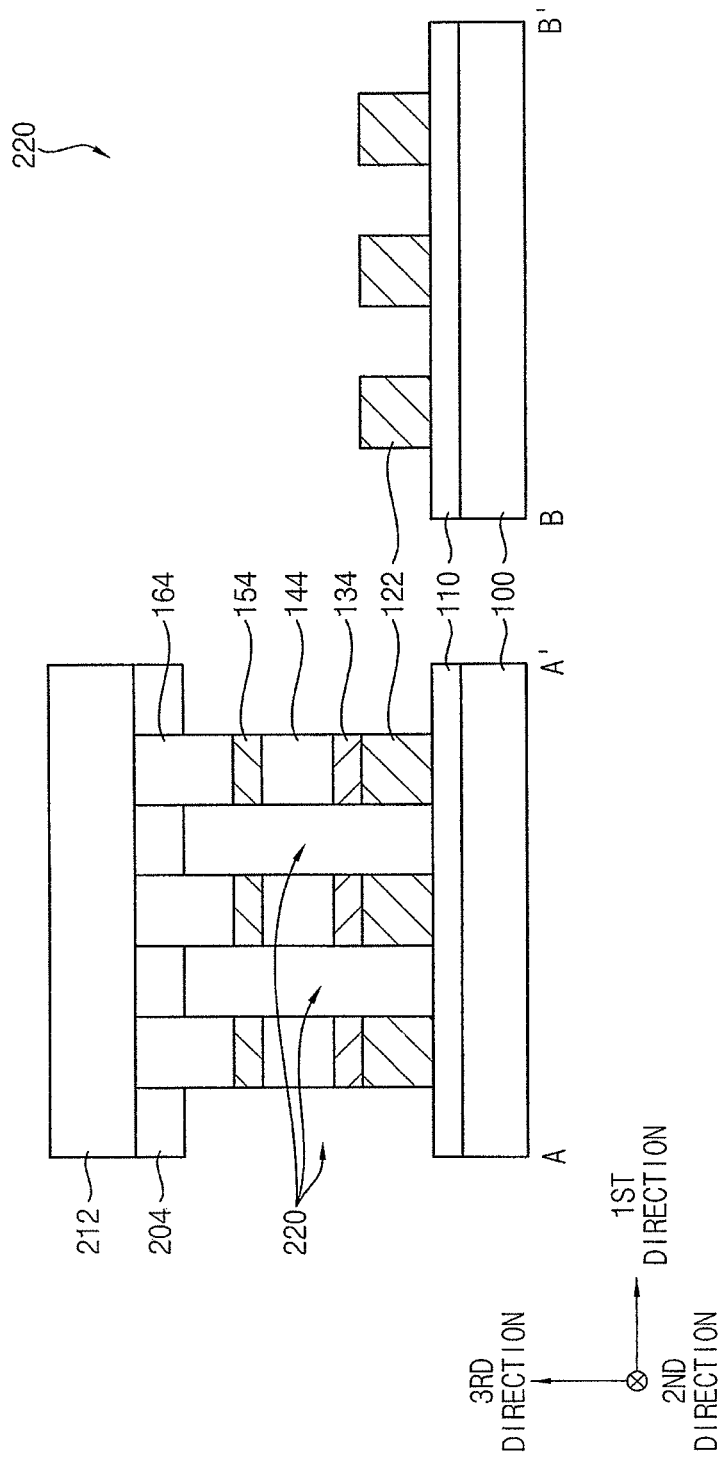
Figure 21:
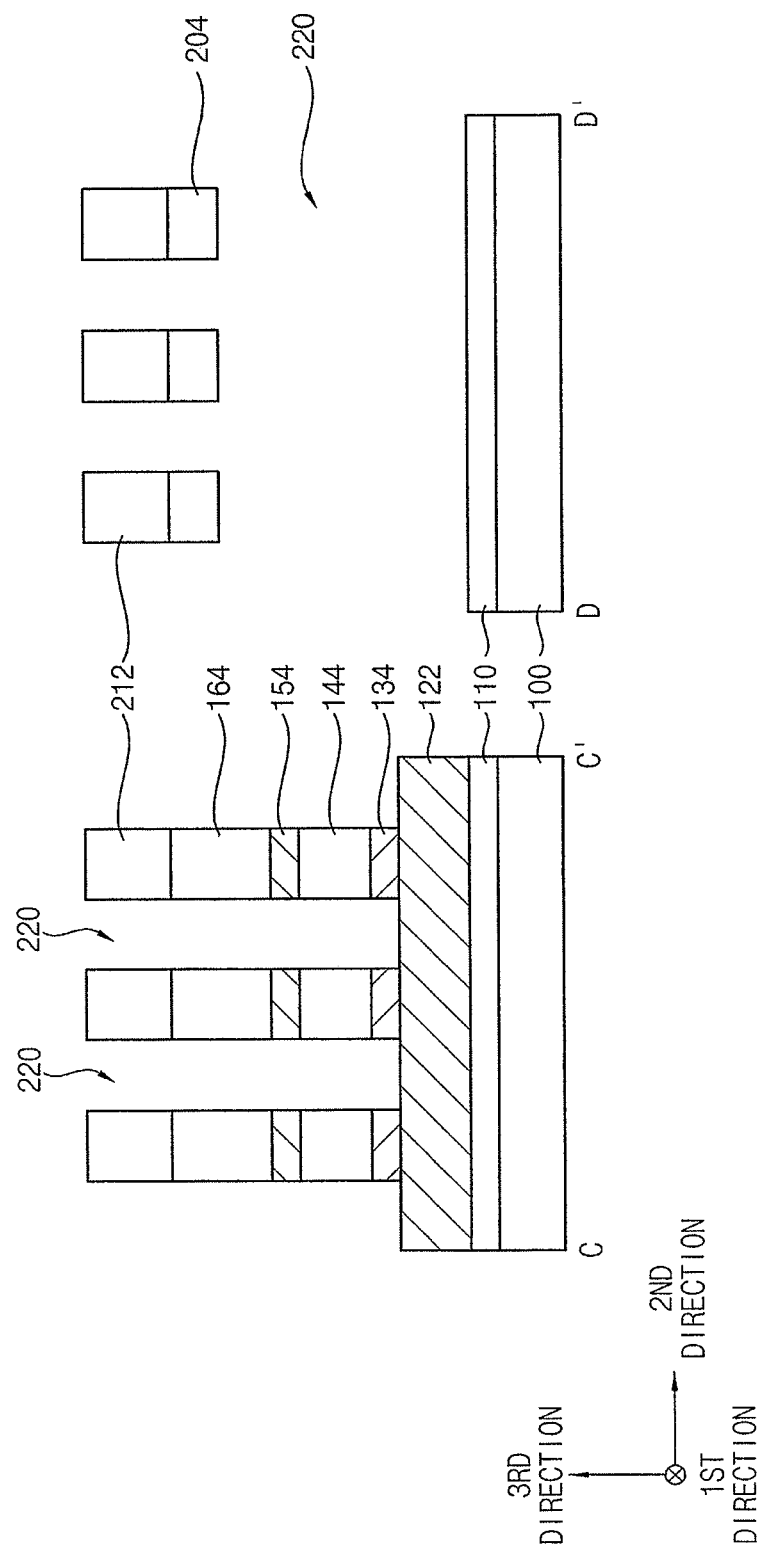

Referring to FIGS. 19 to 21, the preliminary first mask 162, the preliminary second electrode 152, the preliminary first selection pattern 142 and the preliminary first electrode 132, and the preliminary first filling pattern 202, and the preliminary sacrificial pattern 182 may be sequentially etched using the second mask 212 as an etching mask to form a first mask 164, a second electrode 154, a first selection pattern 144 and a first electrode 134, and a first filling pattern 204 and a sacrificial pattern, respectively.

Thus, a second structure including the first electrode 134, the first selection pattern 144, the second electrode 154, and the first mask 164 sequentially stacked may be formed on the first conductive line 122 extending in the second direction. In an implementation, a plurality of first conductive lines 122 may be formed in the first direction, and thus a plurality of second structures may be formed in each of the first and second directions.

The remaining sacrificial pattern may be removed. For example, the sacrificial pattern under the first filling pattern 204 may be removed. In example embodiments, the sacrificial pattern may be removed by an ashing process.

A space on the first insulation layer 110 formed by the etching process and the ashing process may be defined as a second opening 220. The second opening 220 may expose an upper surface of the first insulation layer 110 under the second mask 212, and may expose the first conductive line 122 and the first insulation layer 110 in an area where the second mask 212 is not formed.

Figure 23:
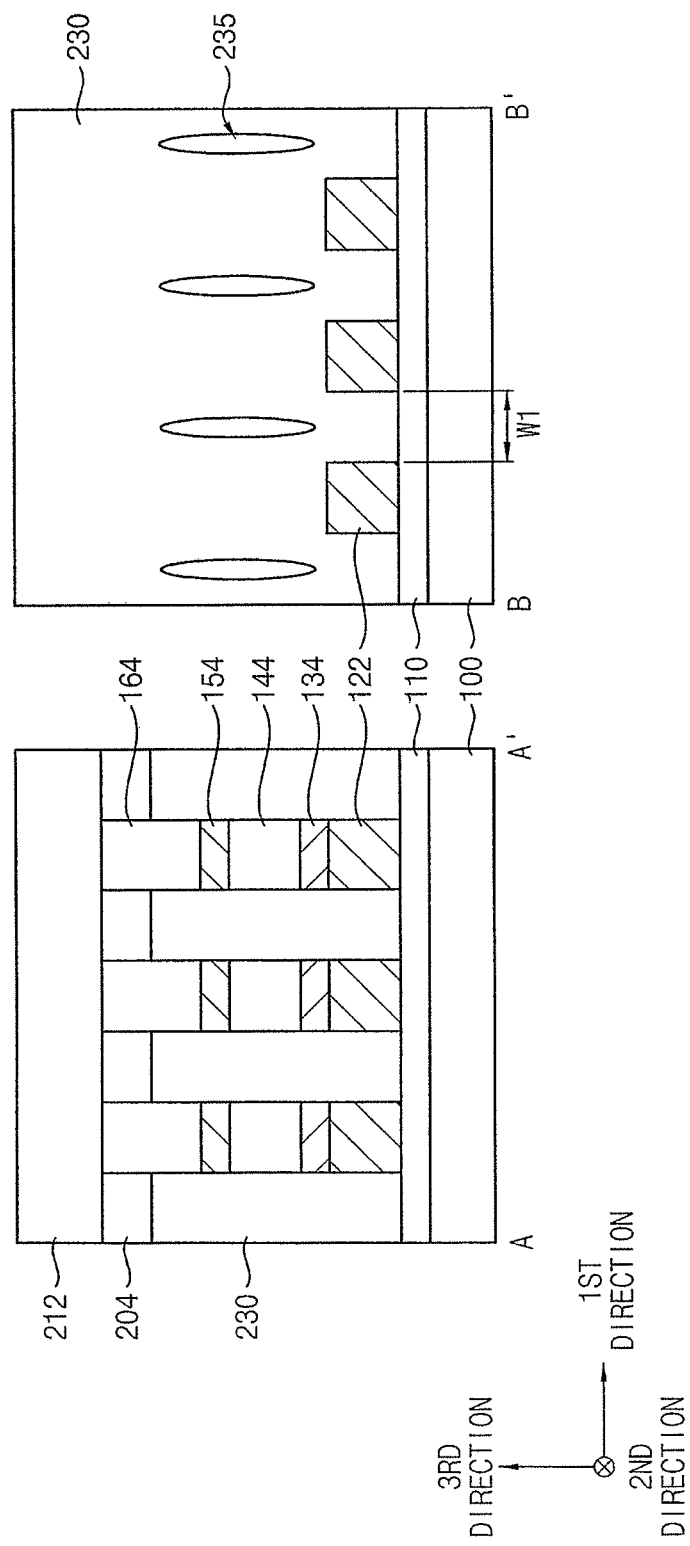
Figure 24:
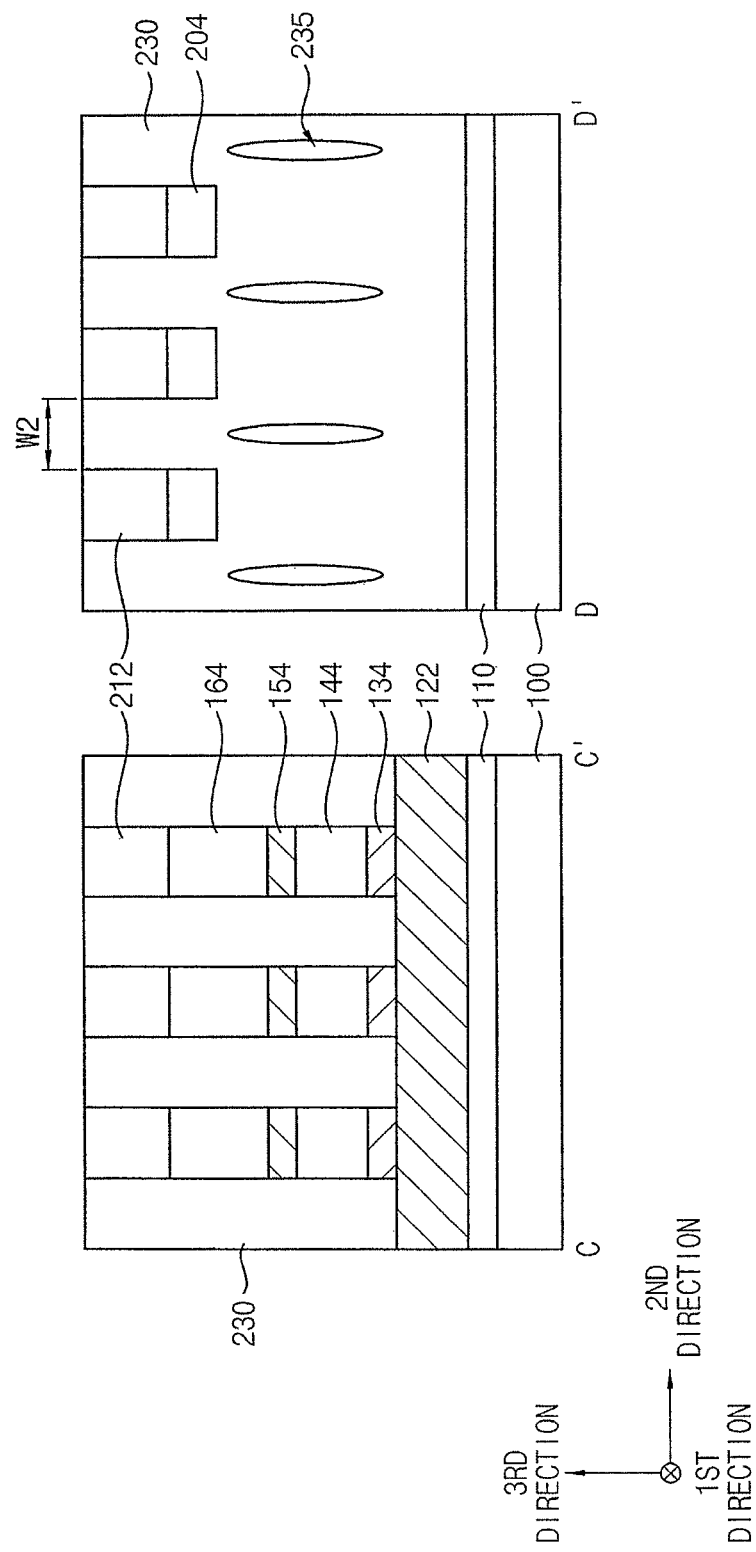

Referring to FIGS. 22 to 24, a second insulation layer 230 may be formed to fill the second opening 220, and a first air gap 235 may be formed in the second insulation layer 230.

The second insulation layer 230 may be formed of a material having a high etching selectivity with respect to the first and second masks 164 and 212, e.g., a nitride such as silicon nitride. The second insulation layer 230 may be formed of a material substantially the same as that of the first filling pattern 204 so that the second insulation layer 230 may be merged with the first filling pattern 204, or may include a material different from that of the first filling pattern 204.

The first air gap 235 may be formed in an area overlapping neither the first conductive lines 122 nor the second conductive lines 212 in the third direction. In example embodiments, the first conductive lines 122 each extending in the second direction may be spaced apart from each other in the first direction by the first width W1, and the second masks 212 each extending in the first direction may be spaced apart from each other in the second direction by the second width W2, and thus the first air gap 235 may be formed at a portion of the area overlapping neither the first conductive lines 122 nor the second conductive lines 212 in the third direction, which may be farthest from the first and second conductive lines 122 and 212. In example embodiments, a plurality of first air gaps 235 may be formed in each of the first and second directions, and may be disposed in a grid pattern in a plan view.

A top of the first air gap 235 may be lower than a lower surface of the first filling pattern 204, and a bottom of the first air gap 235 may be higher than an upper surface of the first conductive line 122. The second insulation layer 230 in which the first air gap 235 is formed may be deposited on sidewalls and lower surfaces of the second masks 212 and the first filling patterns 204 from above, and thus the top of the first air gap 235 may be lower than the lower surfaces of the first filling patterns 204. Likewise, the second insulation layer 230 in which the first air gap 235 is formed may be deposited on sidewalls and upper surfaces of the first insulation layer 110 and the first conductive lines 122 from below, and thus the bottom of the first air gap 235 may be higher than the upper surfaces of the first conductive lines 122.

In example embodiments, the top of the first air gap 235 may be higher than upper surfaces of the second electrodes 154, and thus the parasitic capacitance between the second electrodes 154 may be advantageously reduced.

The bottom of the first air gap 235 may be lower than upper surfaces of the first electrodes 134, and thus the parasitic capacitance between the first electrodes 134 may be reduced.

Figure 25:
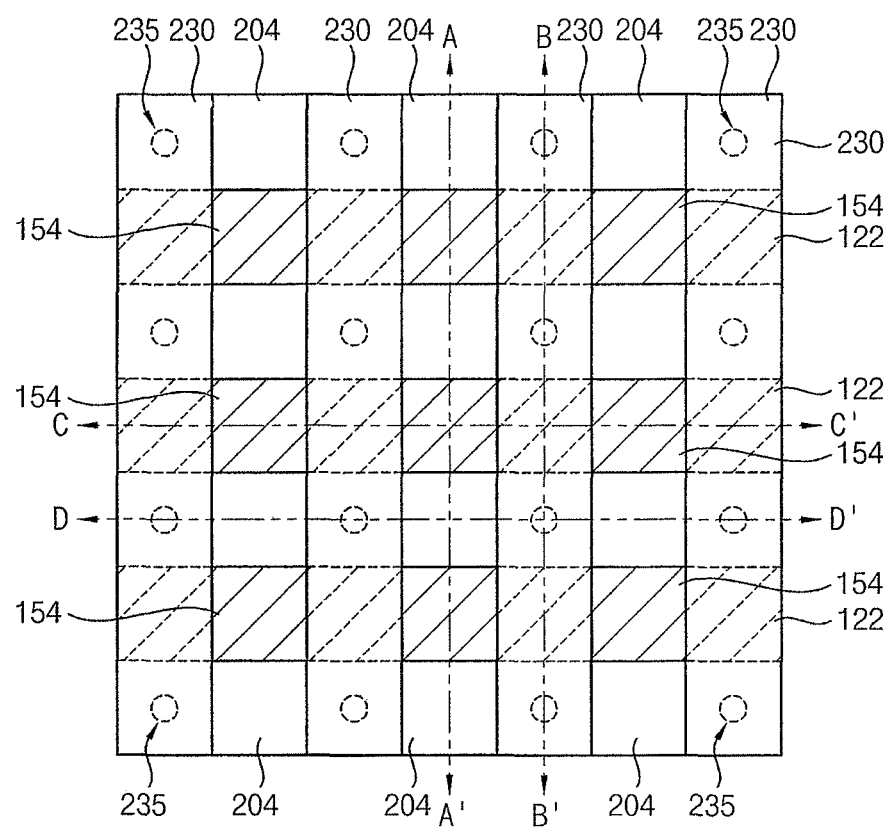
Figure 26:
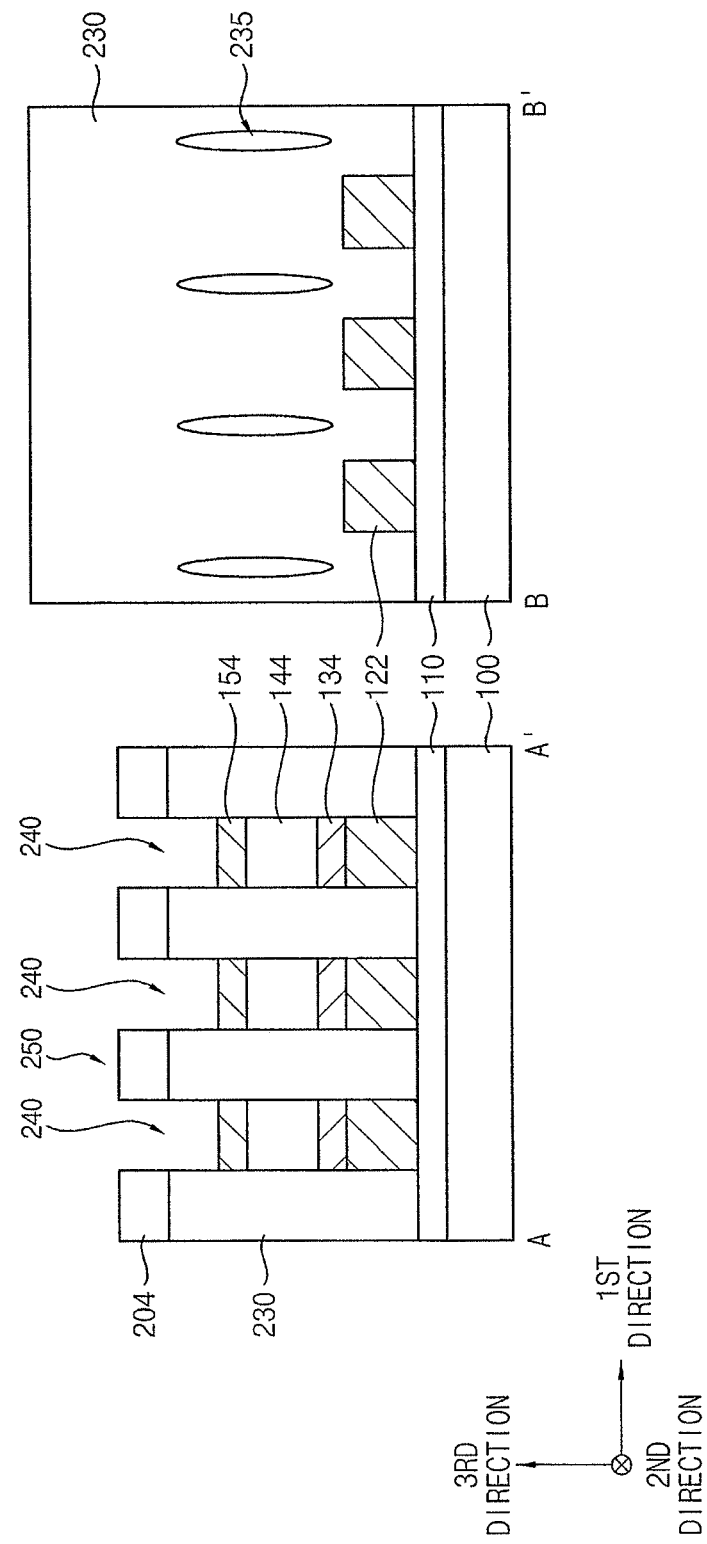
Figure 27:
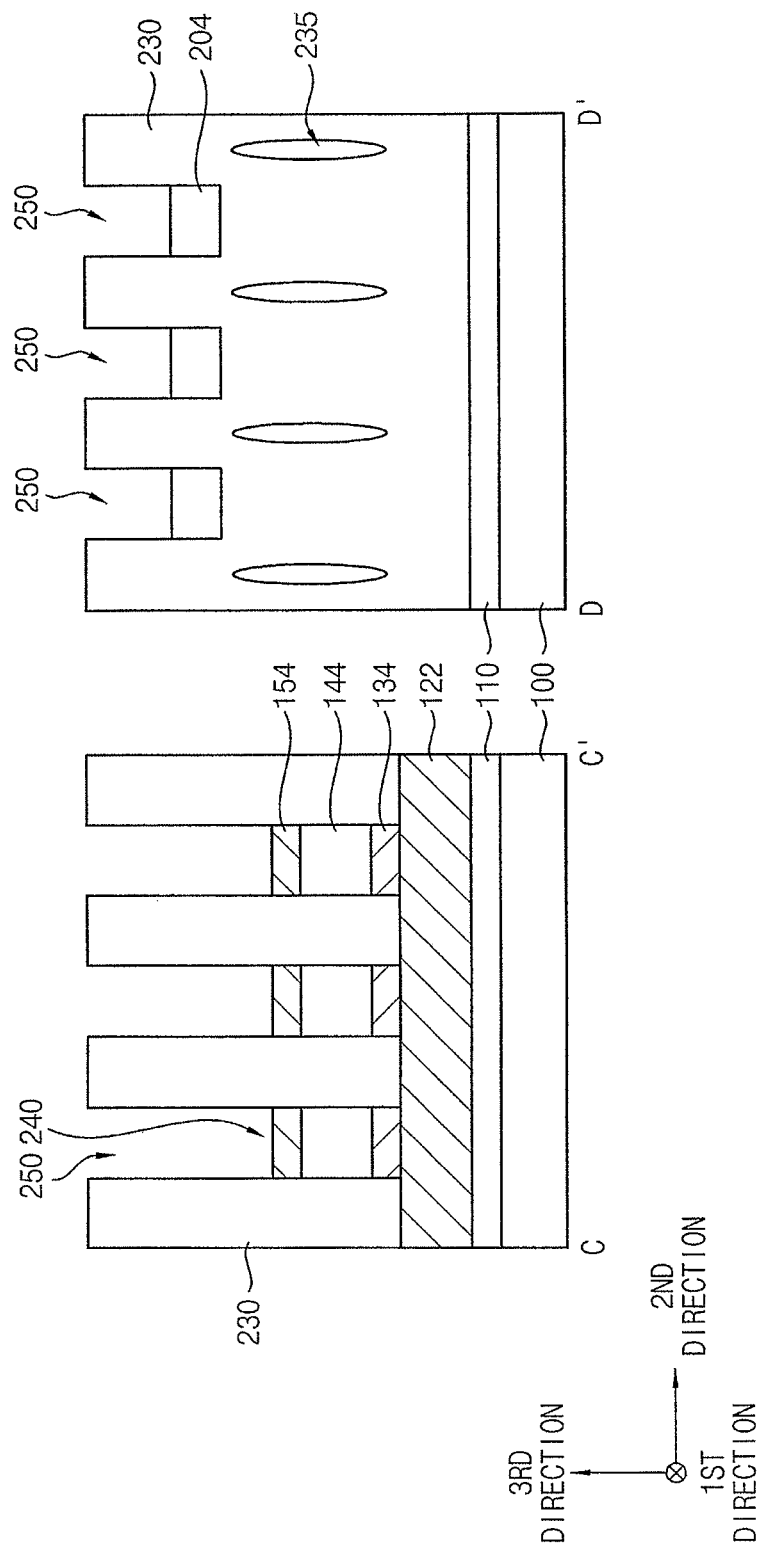

Referring to FIGS. 25 to 27, the first and second masks 164 and 212 may be removed to form third and fourth openings 240 and 250 in communication with each other.

In example embodiments, the first and second masks 164 and 212 may be removed by a wet etching process.

As the third and fourth openings 240 and 250 are formed, upper surfaces of the second electrode 154 and the first filling pattern 204 may be exposed.

Figure 29:
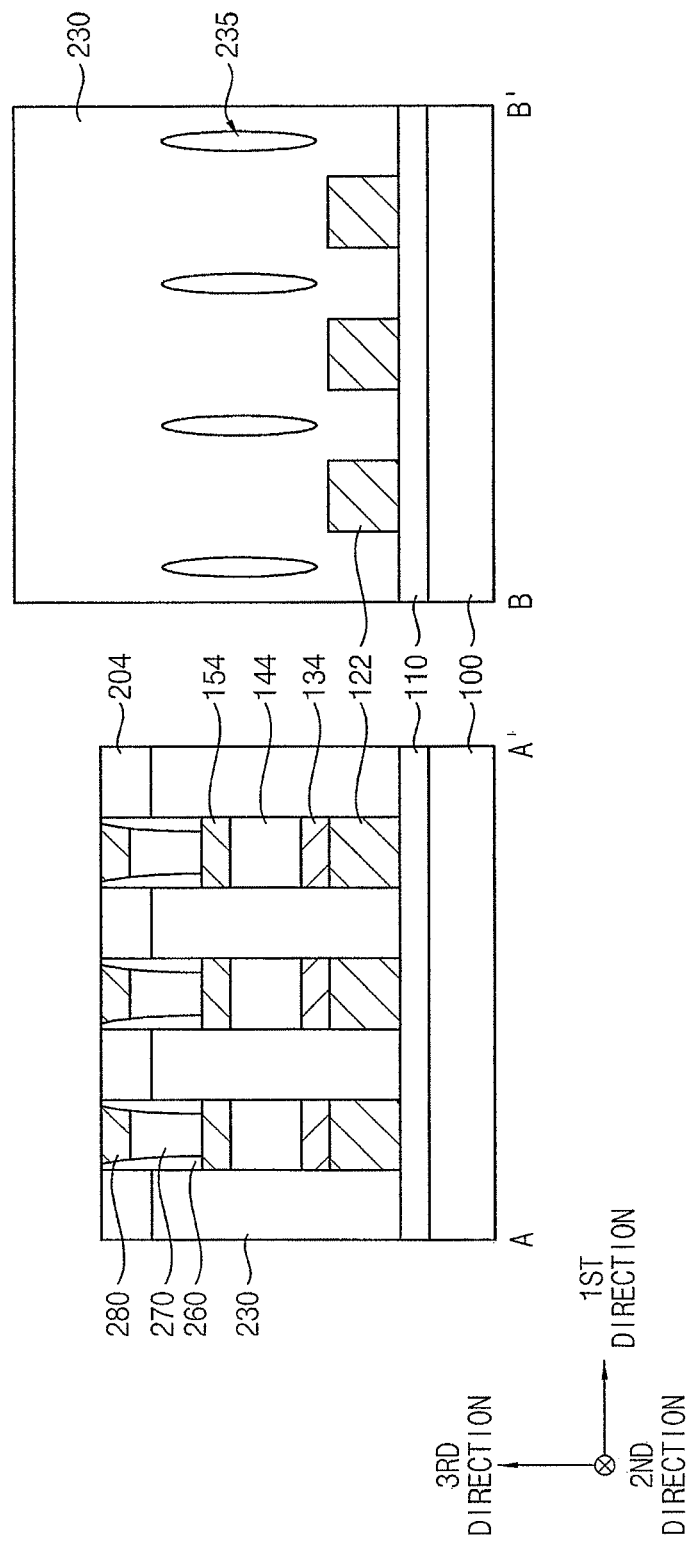
Figure 30:
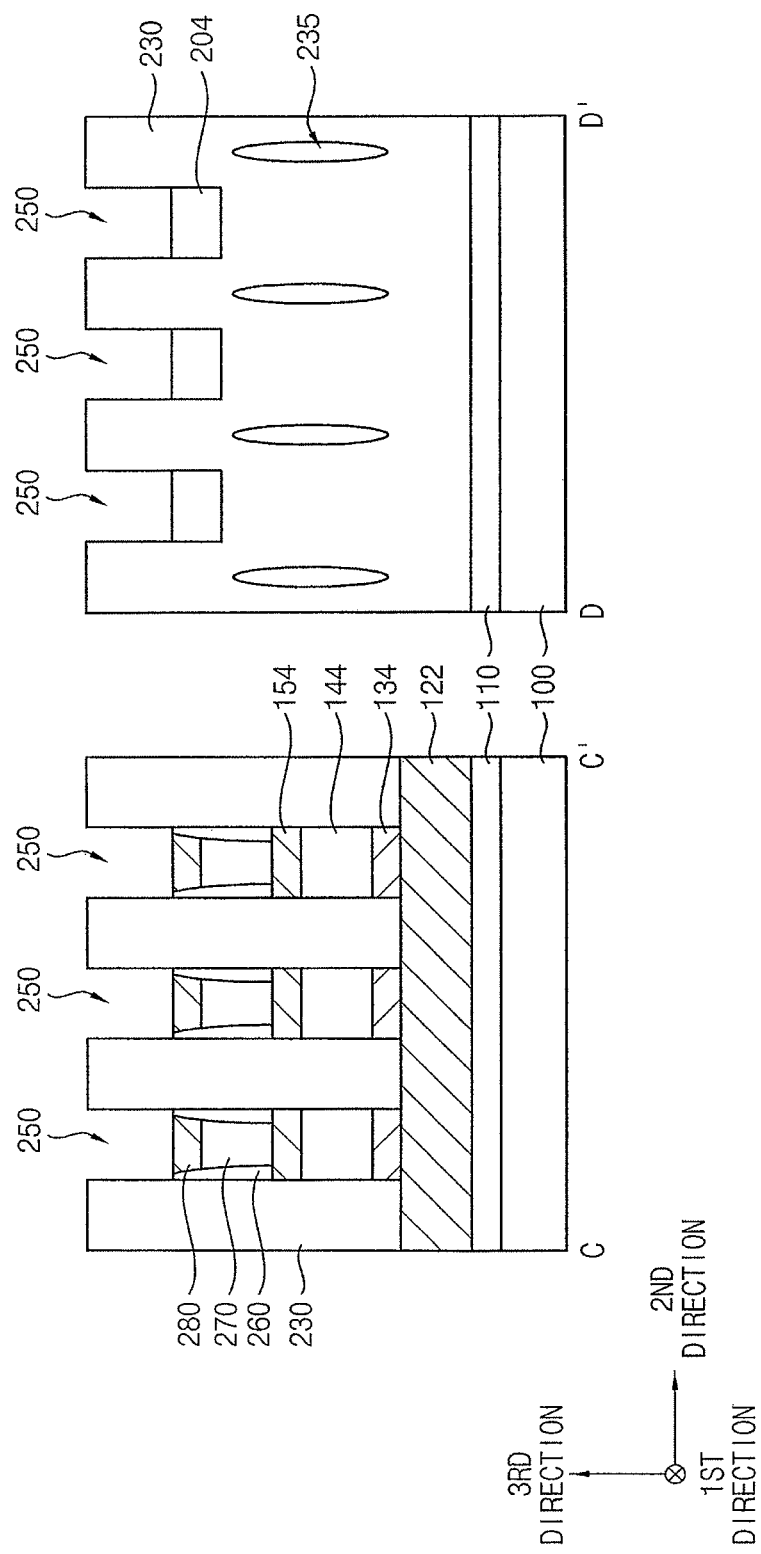

Referring to FIGS. 28 to 30, a first spacer 260, a first variable resistance pattern 270, and a third electrode 280 may be formed in the third opening 240.

First, a spacer layer may be formed on sidewalls of the third and fourth openings 240 and 250, the exposed upper surfaces of the second electrode 154 and the first filling pattern 204, and the second insulation layer 230, and may be anisotropically etched to form a first spacer 260 on the sidewalls of the third and fourth openings 240 and 250.

The spacer layer may be formed of an oxide, e.g., silicon oxide.

A variable resistance layer may be formed on the second electrode 154, the first spacer 260, the first filling pattern 204, and the second insulation layer 230 to fill the third and fourth openings 240 and 250, the variable resistance layer may be planarized until an upper surface of the second insulation layer 230 is exposed, and an upper portion of the variable resistance layer may be removed to form the first variable resistance pattern 270 partially filling the third opening 240.

The planarization process may be performed by a CMP process, and the upper portion of the variable resistance layer may be removed by an etch back process.

In example embodiments, the variable resistance layer may be formed of a material whose resistance may be changed according to the phase change. In an example embodiment, the variable resistance layer may be formed of a chalcogenide material containing germanium, antimony, and/or tellurium. In an example embodiment, the first variable resistance layer may include a super lattice having a germanium-tellurium layer and an antimony-tellurium layer alternately stacked. In an example embodiment, the first variable resistance layer may include GST (germanium-antimony-tellurium), IST (indium-antimony-tellurium), or BST (bismuth-antimony-tellurium).

In example embodiments, the first variable resistance layer may be formed of a perovskite-based material or a transition metal. The perovskite-based material may include, e.g., STO (SrTiO$_3$), BTO (BaTiO$_3$), PCMO (Pr$_{1-x}$Ca$_x$MnO$_3$) or the like. The transition metal oxide may include titanium oxide (TiOx), zirconium oxide (ZrOx), aluminum oxide (AlOx), hafnium oxide (HfOx), tantalum oxide (TaOx), niobium oxide (NbOx), cobalt oxide (CoOx), tungsten oxide (WOx), lanthanum oxide (LaOx) or zinc oxide (ZnOx). These may be used alone or in combination.

In example embodiments, the first variable resistance layer may be formed of a material whose resistance may be changed by a magnetic field or a spin transfer torque (STT). In an implementation, the first variable resistance layer may include a ferromagnetic material, e.g., iron (Fe), nickel (Ni), cobalt (Co), dysprosium (Dy), gadolinium (Gd) or the like.

A third electrode layer may be formed on the first variable resistance pattern 270, the first spacer 260, the first filling pattern 204 and the second insulation layer 230 to fill an upper portion of the third opening 240 and the fourth opening 250, the third electrode layer may be planarized until an upper surface of the second insulation layer 230 may be exposed, and an upper portion of the third electrode layer may be removed to form the third electrode 280 filling a remaining portion of the third opening 240.

The third electrode layer may be formed of a metal nitride or a metal silicon nitride, e.g., titanium nitride, titanium silicon nitride, tungsten nitride, tungsten silicon nitride, tantalum nitride, tantalum silicon nitride, zirconium nitride, zirconium silicon nitride, etc.

The first selection pattern 144, the second electrode 154 and the first variable resistance pattern 270 sequentially stacked may define a first memory unit.

Referring to FIGS. 1 to 3 again, a second conductive line 310 filling the fourth opening 250 may be formed to complete the variable resistance memory device.

For example, a first barrier layer may be formed on a sidewall of the fourth opening 250, the third electrode 280, the first spacer 260, the first filling pattern 204 and the second insulation layer 230, a first metal layer may be formed on the first barrier layer to fill a remaining portion of the fourth opening 250, and the first metal layer and the first barrier layer may be planarized until an upper surface of the second insulation layer 230 may be exposed to form the second conductive line 310.

The first metal layer may be formed of a metal, e.g., tungsten, platinum, palladium, rhodium, ruthenium, iridium, copper, aluminum, titanium, tantalum, etc., and the first barrier layer may be formed of a metal nitride, e.g., titanium nitride, tantalum nitride, tungsten nitride, etc.

The second conductive line 310 may include a first metal pattern 300 and a first barrier pattern 290 covering a sidewall and a lower surface of the first metal pattern 300.

In example embodiments, the first conductive line 122 may serve as a word line of the variable resistance memory device, and the second conductive line 310 may serve as a bit line of the variable resistance memory device. In an implementation, the first conductive line 122 may serve as a bit line of the variable resistance memory device, and the second conductive line 310 may serve as a word line of the variable resistance memory device.

As illustrated above, in the method of manufacturing the variable resistance memory device, the preliminary sacrificial pattern 182 and the preliminary first filling pattern 202 may be formed on the substrate 100 to cover the first structures, the first structures may be patterned using the second masks 212 as an etching mask to form the second structures on each of the first conductive lines 122, and the preliminary sacrificial pattern 182 may be removed to form the second opening 220. As the second insulation layer 230 may be formed to fill the second opening 220, the first air gap 235 may be formed at a portion of the area overlapping neither the first conductive lines 122 nor the second masks 212, which may be farthest from the first conductive lines 122 and the second masks 212, and the top of the first air gap 235 may be formed to be lower than the lower surfaces of the second conductive lines 310 subsequently formed due to the remaining first filling pattern 204. Thus, the parasitic capacitance may be reduced by the first air gap 235, and the second conductive lines 310 may not be electrically short.

Figure 31:
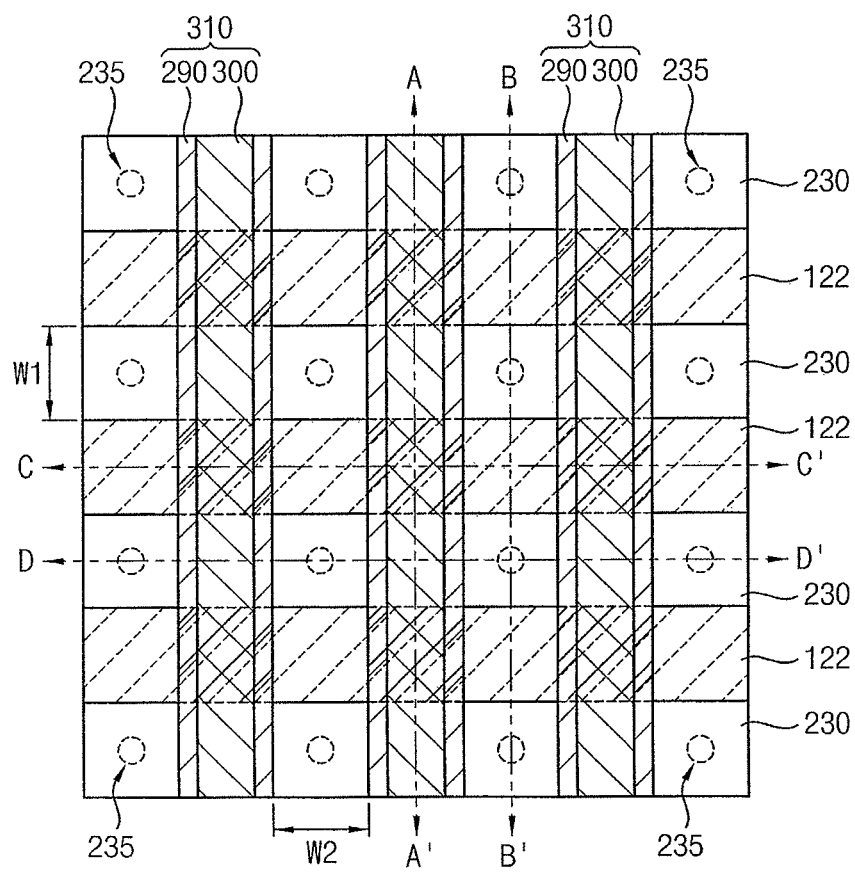
FIG. 31 illustrates a plan view of a variable resistance memory device in accordance with example embodiments.
Figure 32:
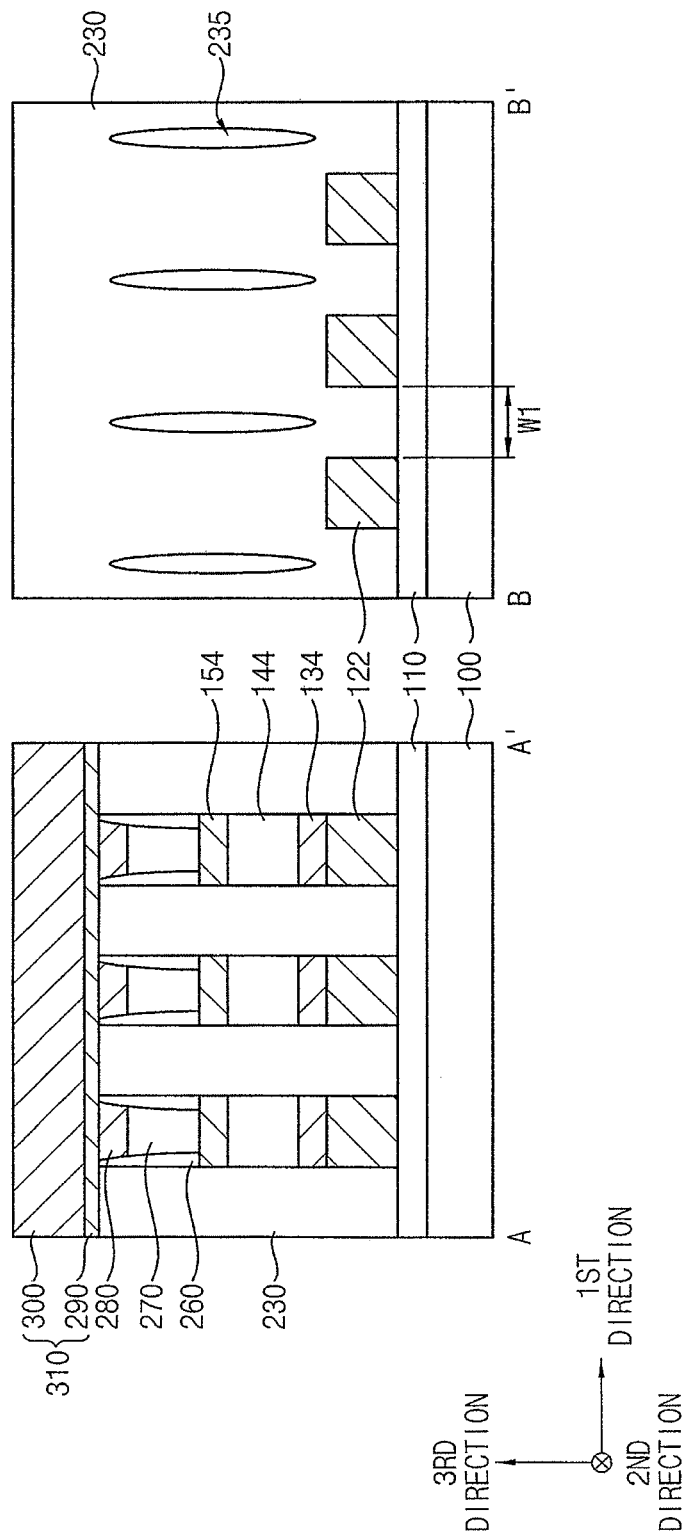
FIGS. 32 and 33 illustrate cross-sectional views of the variable resistance memory device of FIG. 31.
Figure 33:
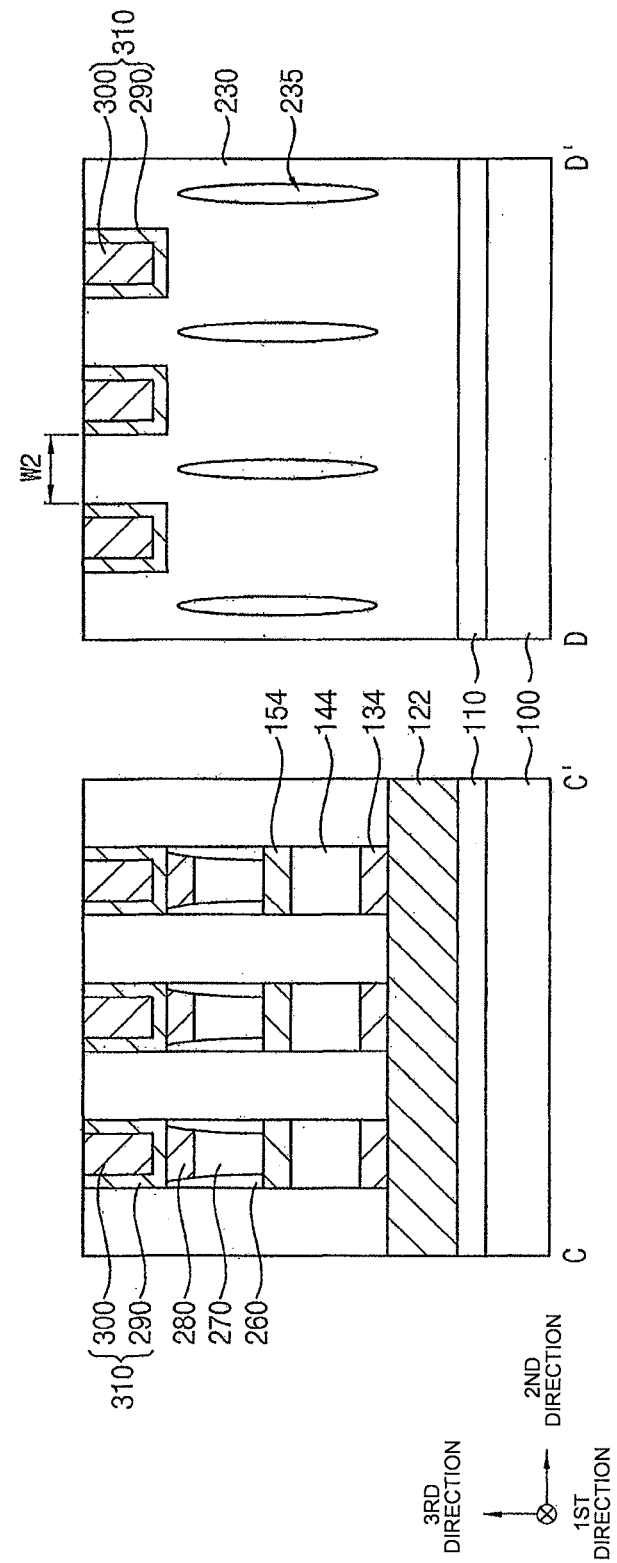

FIG. 31 illustrates a plan view of a variable resistance memory device in accordance with example embodiments, and FIGS. 32 and 33 illustrate cross-sectional views of the variable resistance memory device of FIG. 31. FIG. 32 is a cross-sectional view including cross-sections taken along lines A-A' and B-B', respectively, in FIG. 31, and FIG. 33 is a cross-sectional view including cross-sections taken along lines C-C' and D-D', respectively, in FIG. 31.

The variable resistance memory device may be substantially the same as or similar to that of FIGS. 1 to 3, except for the filling pattern and the air gap. Thus, like reference numerals refer to like elements, and repeated detailed descriptions thereof may be omitted below in the interest of brevity.

Referring to FIGS. 31 to 33, the variable resistance memory device may include the first conductive line 122, the second conductive line 310, the first memory unit, and the second insulation layer 230 (having the first air gap 235 therein) on the substrate 100.

The variable resistance memory device may further include the first and third electrodes 134 and 280, the first spacer 260, and the first insulation layer 110.

The variable resistance memory device may not have the first filling pattern 204, which may be formed under the second conductive line 310 and cover the upper sidewall of the first spacer 260. Thus, the upper sidewall of the first spacer 260 may be covered by the second insulation layer 230.

The first filling pattern 204 may not be formed, and the top of the first air gap 235 may be lower than the lower surfaces of the second conductive lines 310. For example, the possibility of an electrical short between the second conductive lines 310 through the first air gap 235 in the variable resistance memory device of FIGS. 31 to 33 may be higher than that in the variable resistance memory device of FIGS. 1 to 3. However, the first air gap 235 may be formed as far as possible in an area not vertically overlapping the second conductive lines 310, and thus the electrical short between the second conductive lines 310 may not be so high.

Figure 35:
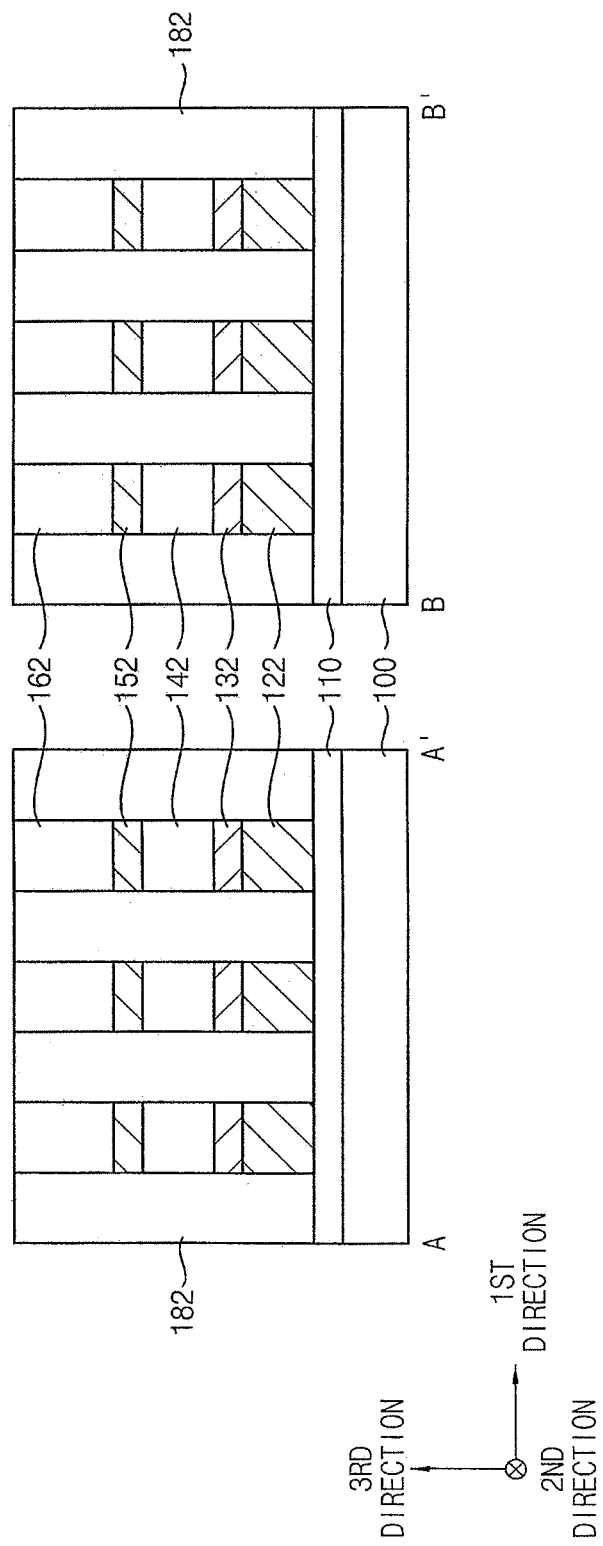
Figure 36:
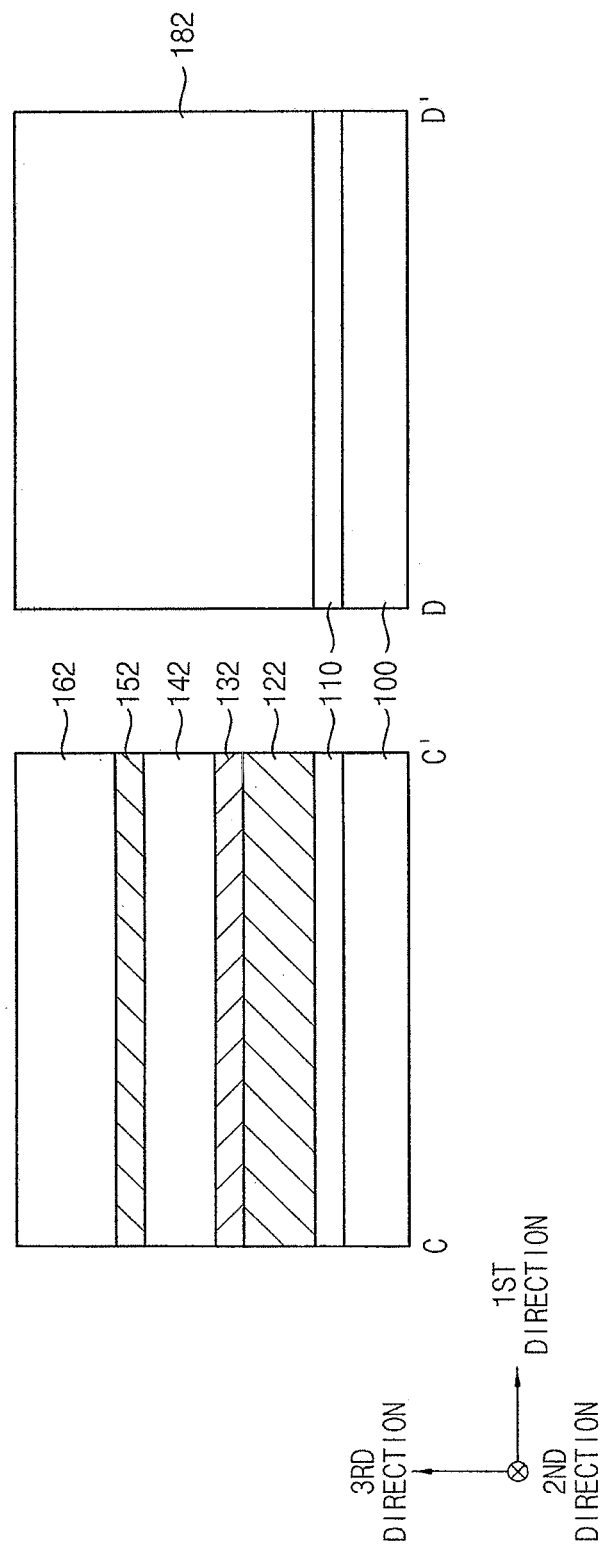
Figure 38:
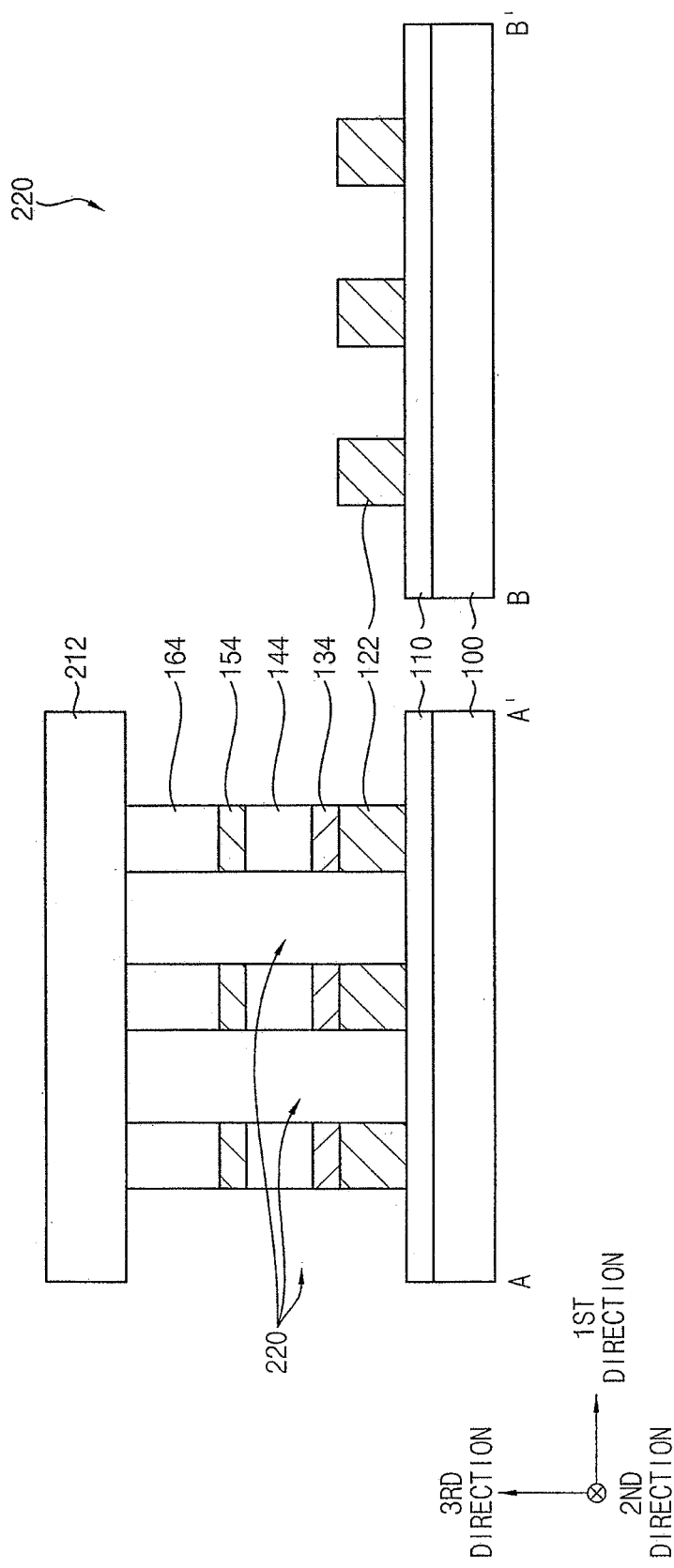
Figure 39:
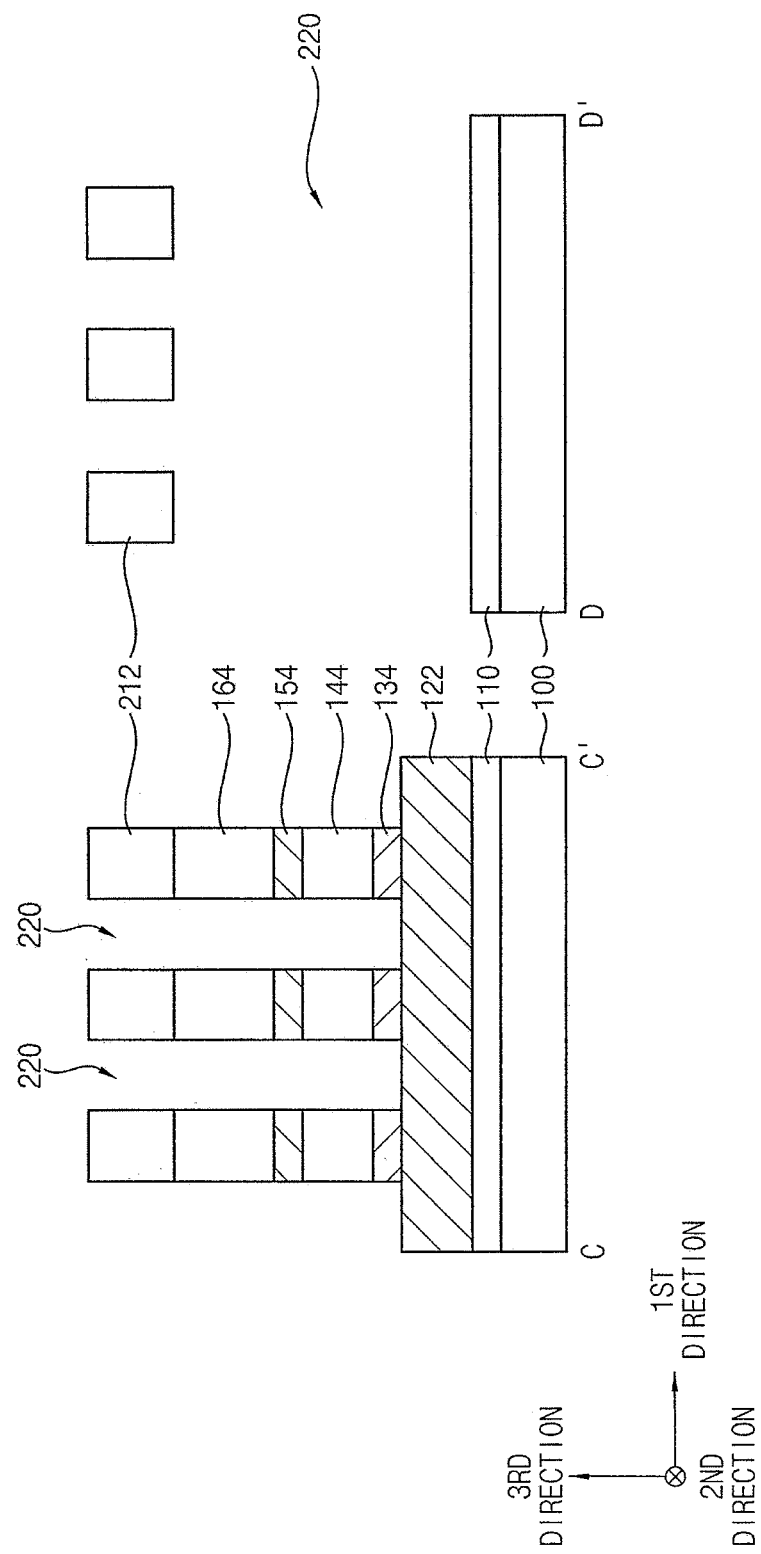

FIGS. 34 to 39 illustrate plan views and cross-sectional views of stages in a method of manufacturing a variable resistance memory device in accordance with example embodiments. FIGS. 34 and 37 are plan views, FIGS. 35 and 38 are cross-sectional views including cross-sections taken along lines A-A' and B-B', respectively, of corresponding plan views, and FIGS. 36 and 39 are cross-sectional views including cross-sections taken along lines C-C' and D-D', respectively, of corresponding plan views. This method may include processes substantially the same as or similar to those illustrated with reference to FIGS. 1 to 30, and thus repeated detailed descriptions thereon may be omitted herein.

Referring to FIGS. 34 to 36, processes substantially the same as or similar to those illustrated with reference to FIGS. 4 to 12 may be performed.

In the present embodiment, the preliminary sacrificial pattern 182 may not partially fill the first opening 170 but may completely fill the first opening 170. For example, the sacrificial layer may be formed on the first insulation layer 110 and the first structures to fill the first opening 170, and may be planarized until the upper surfaces of the first structures are exposed to form the preliminary sacrificial pattern 182. Unlike the processes illustrated with reference to FIGS. 10 to 12, the upper portion of the preliminary sacrificial pattern 182 may not be removed.

Referring to FIGS. 37 to 39, processes substantially the same as or similar to those illustrated with reference to FIGS. 13 to 21 may be performed.

Thus, a plurality of second structures each including the first electrode 134, the first selection pattern 144, the second electrode 154, and the first mask 164 may be formed on each of the first conductive lines 122 in the second direction, and the remaining sacrificial pattern may be removed to form the second opening 220 on the first insulation layer 110.

The first filling pattern 204 (refer to FIGS. 19 to 21) may not be formed.

Referring to FIGS. 31 to 33 again, processes substantially the same as or similar to those illustrated with reference to FIGS. 22 to 30 and FIGS. 1 to 3 may be performed to complete the variable resistance memory device.

Thus, the first air gap 235 may be formed in the second insulation layer 230. In the present embodiment, the top of the first air gap 235 may be lower than the lower surfaces of the second conductive lines 310.

For example, in the variable resistance memory device of FIGS. 1 to 3, the first filling pattern 204 may be formed under the second conductive lines 310, and thus the top of the first air gap 235 may be lower than the lower surface of the first filling pattern 204. Accordingly, the first air gap 235 may be certainly spaced apart from the lower surfaces of the second conductive lines 310. In the present embodiment, there may be no first filling pattern in the variable resistance memory device as illustrated in FIGS. 31 to 33, and thus the top of the first air gap 235 may be lower than the lower surfaces of the second conductive lines 310.

Figure 40:
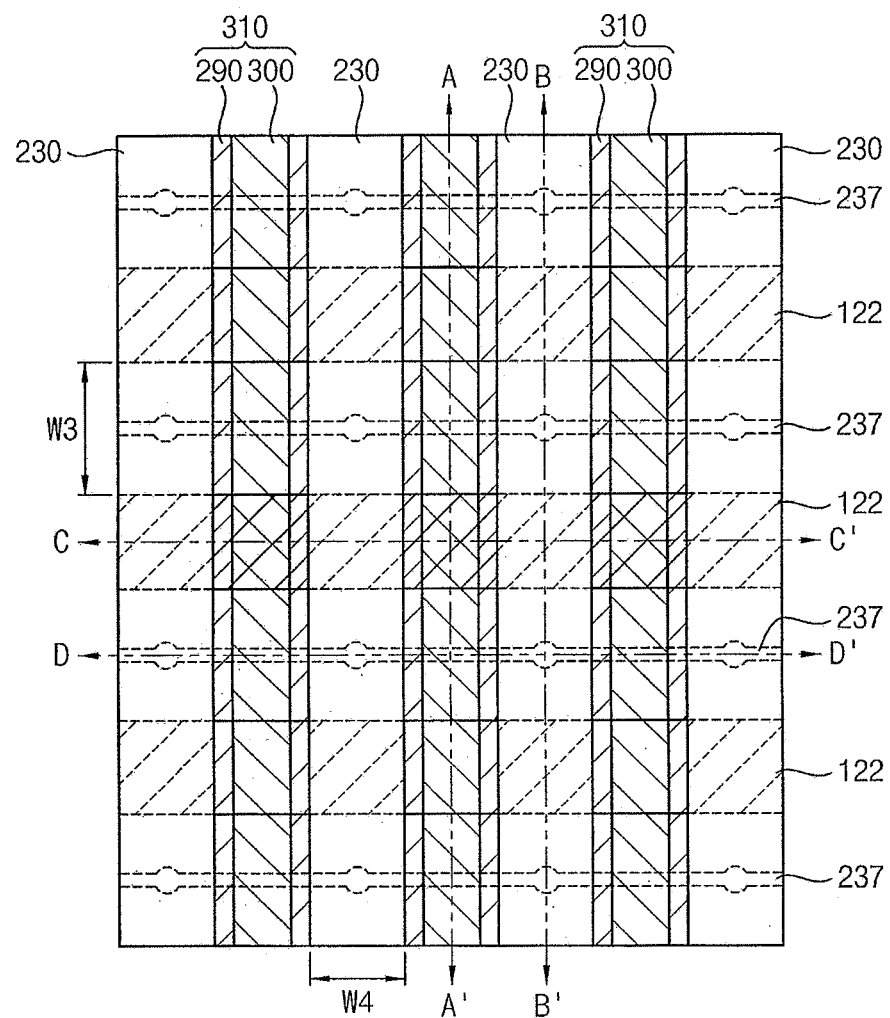
FIG. 40 illustrates a plan view of a variable resistance memory device in accordance with example embodiments.
Figure 41:
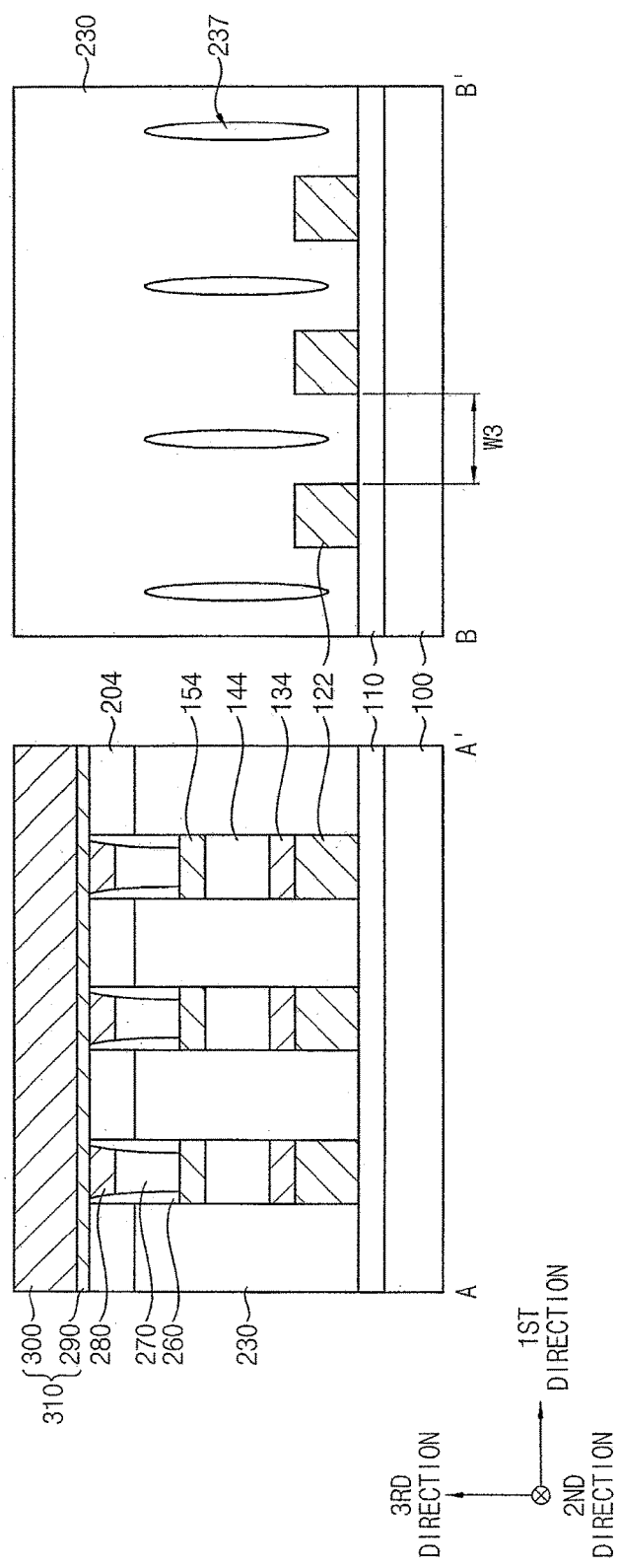
FIGS. 41 and 42 illustrate cross-sectional views of the variable resistance memory device of FIG. 40.
Figure 42:
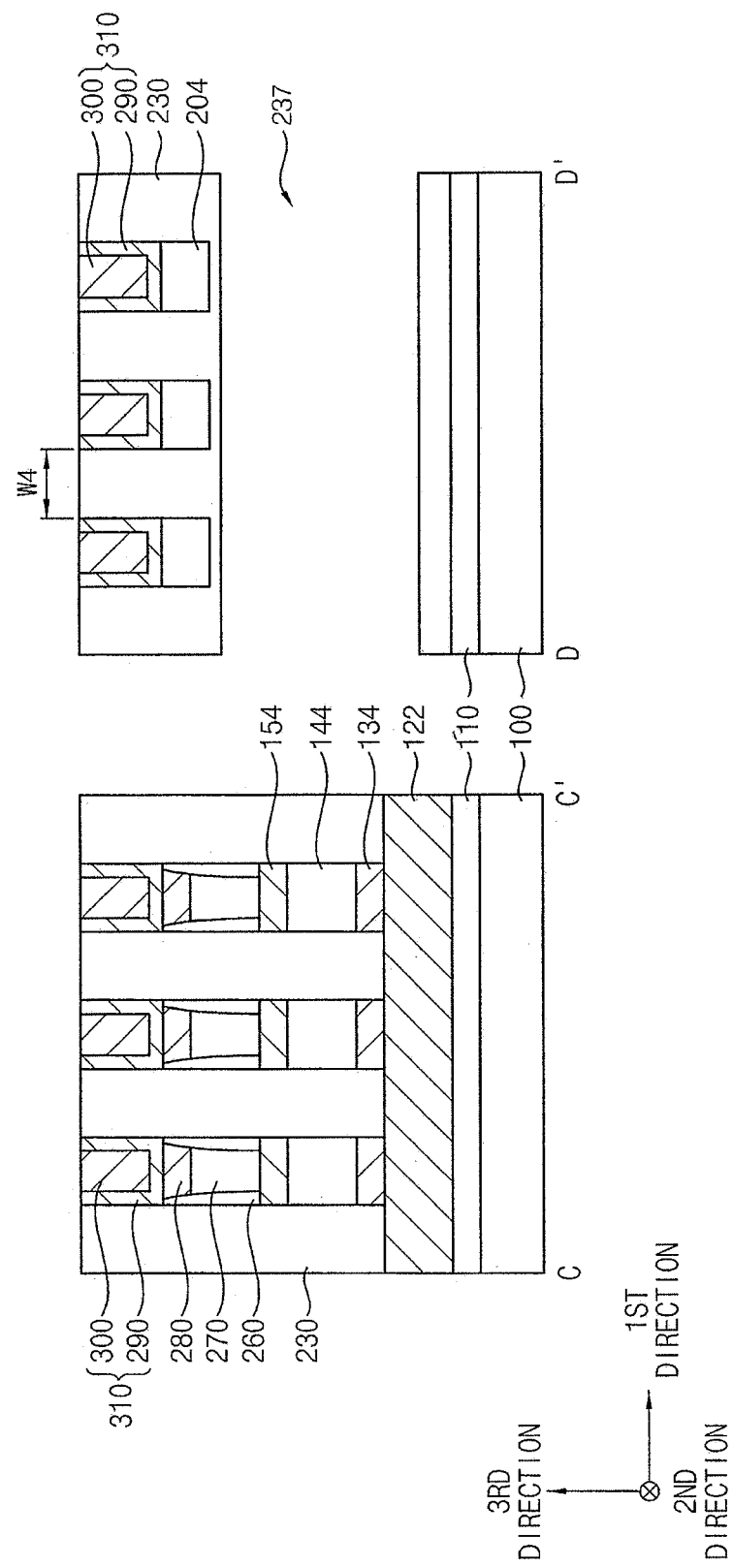

FIG. 40 illustrates a plan view of a variable resistance memory device in accordance with example embodiments, and FIGS. 41 and 42 illustrate cross-sectional views of the variable resistance memory device of FIG. 40. FIG. 41 is a cross-sectional view including cross-sections taken along lines A-A' and B-B', respectively, in FIG. 40, and FIG. 42 is a cross-sectional view including cross-sections taken along lines C-C' and D-D', respectively, in FIG. 40.

The variable resistance memory device may be substantially the same as or similar to that of FIGS. 1 to 3, except for the second conductive lines and the air gap. Thus, like reference numerals refer to like elements, and repeated detailed descriptions thereon may be omitted below.

Referring to FIGS. 40 to 42, the variable resistance memory device may include the first conductive line 122, the second conductive line 310, the first memory unit, the second insulation layer 230 (having a first air gap 237 therein), and the first filling pattern 204 on the substrate 100.

The variable resistance memory device may further include the first and third electrodes 134 and 280, the first spacer 260, and the first insulation layer 110.

The first conductive lines 122 may be spaced apart from each other by a third width W3 in the first direction, and the second masks 212 may be spaced apart from each other by a fourth width W4 in the second direction. In example embodiments, the third width W3 may be greater than the fourth width W4.

In example embodiments, the first air gap 237 in the second insulation layer 230 may extend in the second direction between the first conductive lines 122 each extending in the second direction. A bottom of the first air gap 237 may be lower than upper surfaces of the first conductive lines 122.

For example, the third width W3 between the first conductive lines 122 that may be disposed over the second conductive lines 310 may be greater than the fourth width W4 between the second conductive lines 310, and thus the first air gap 237 in the second insulation layer 230 covering the first conductive lines 122 and sidewalls of the second conductive lines 310 may horizontally overlap at least a portion of the first conductive lines 122. Accordingly, the bottom of the first air gap 237 may be lower than the upper surfaces of the first conductive lines 122.

Figure 44:
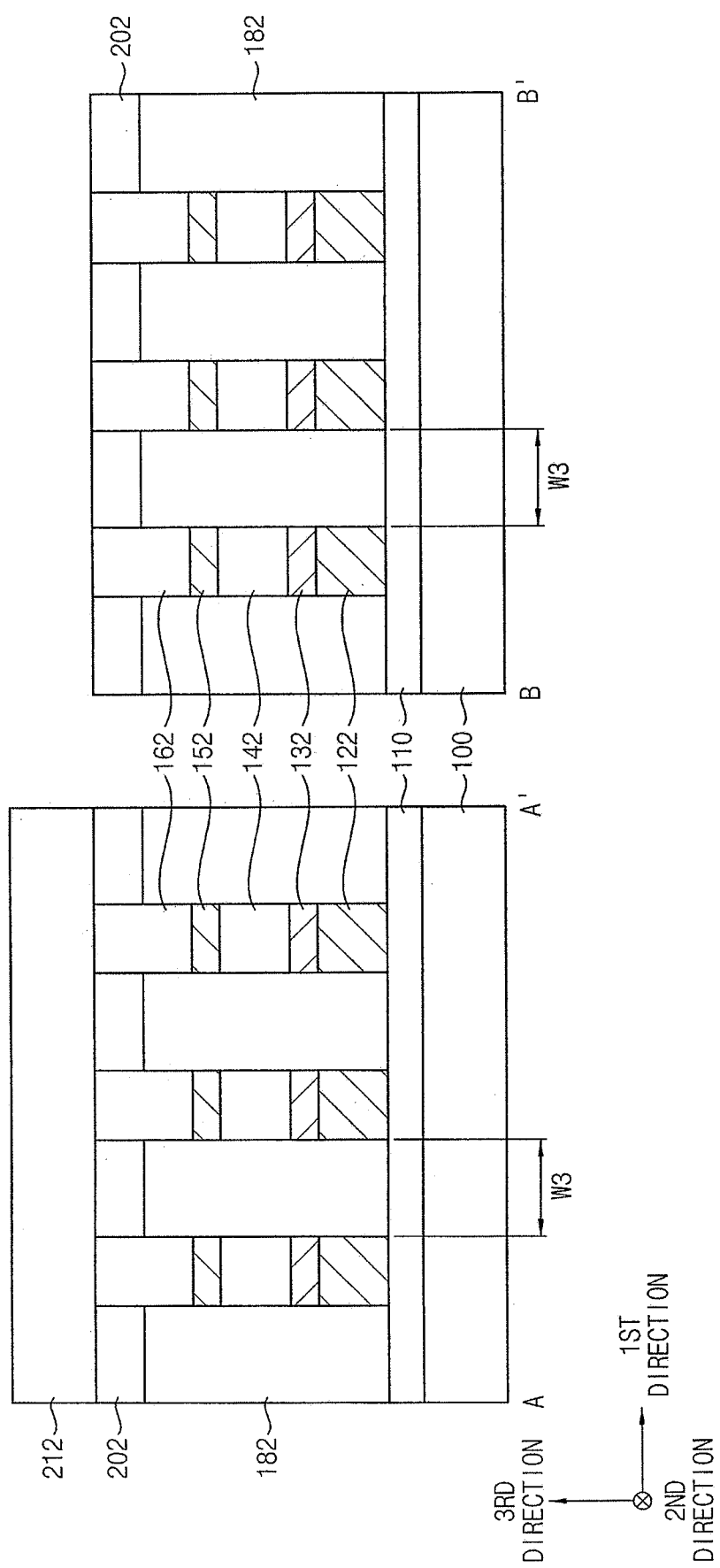
Figure 45:
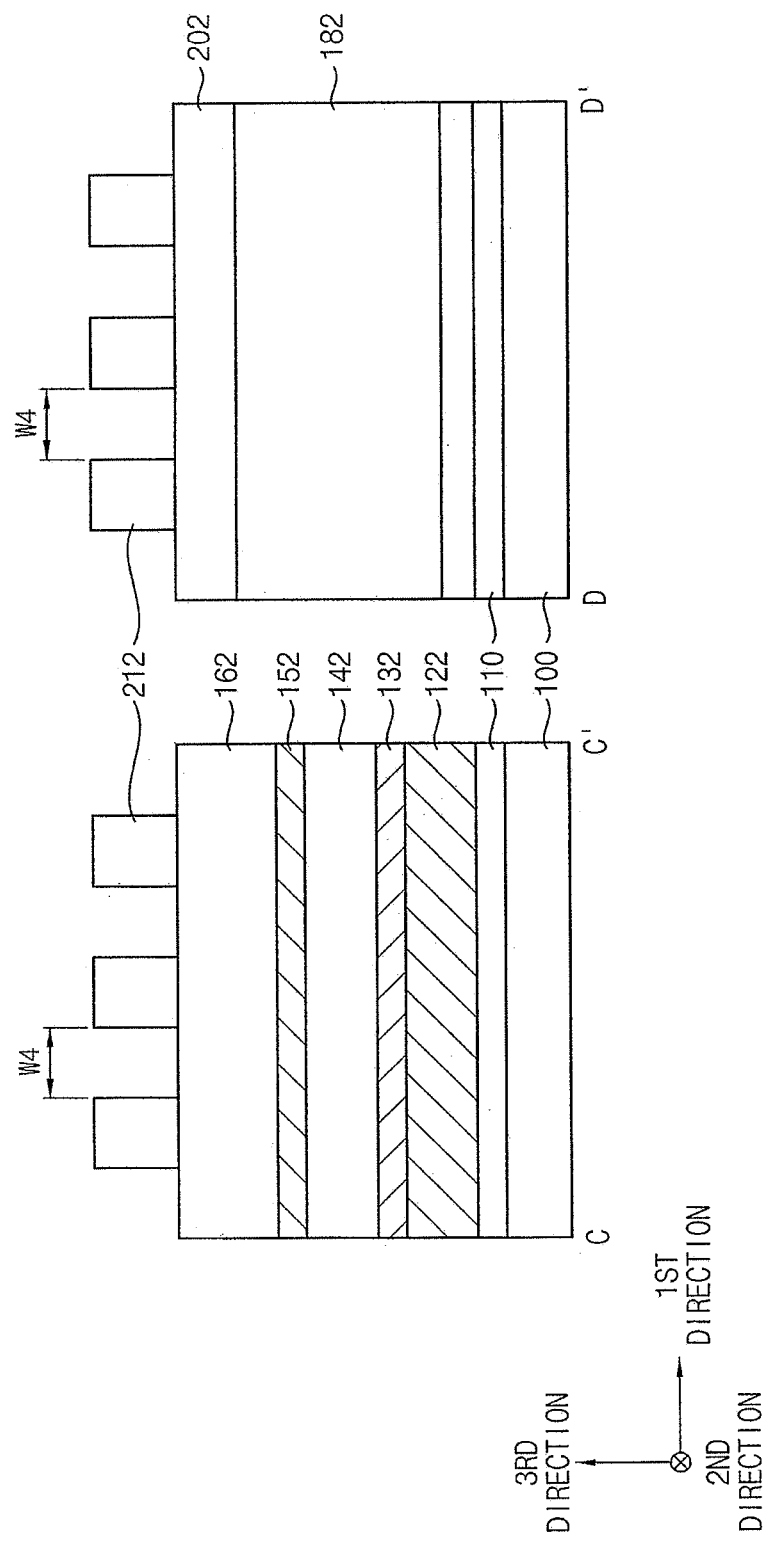
Figure 46:
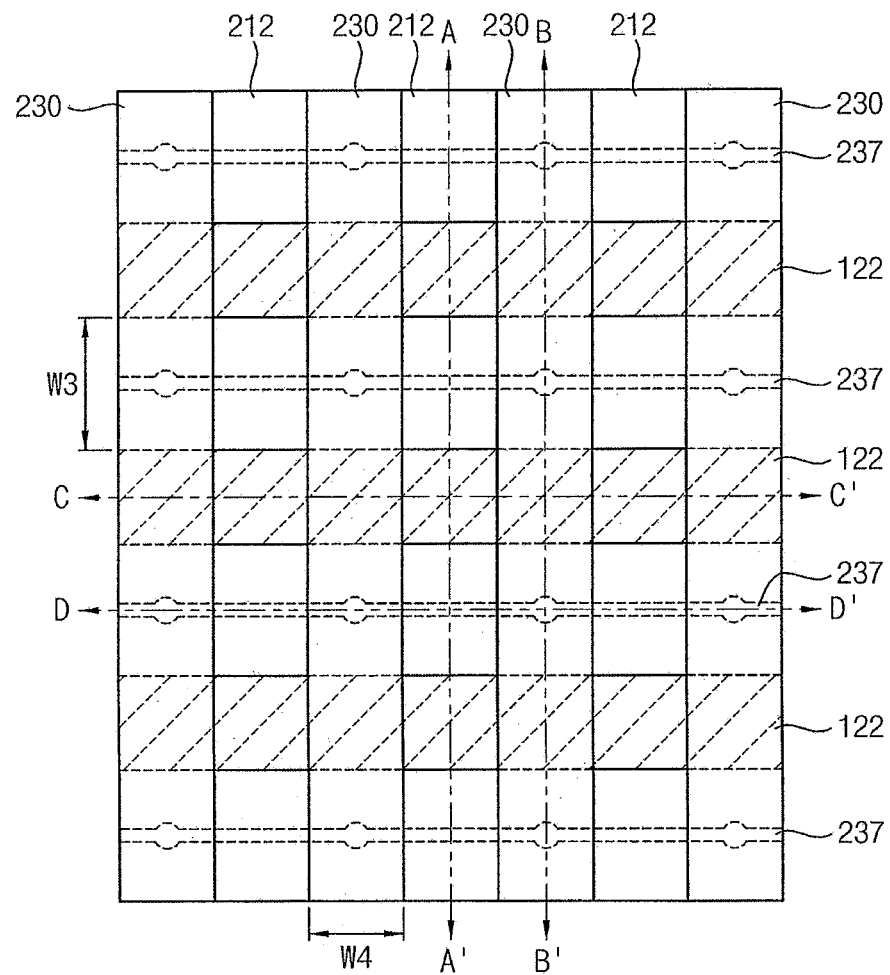
Figure 47:
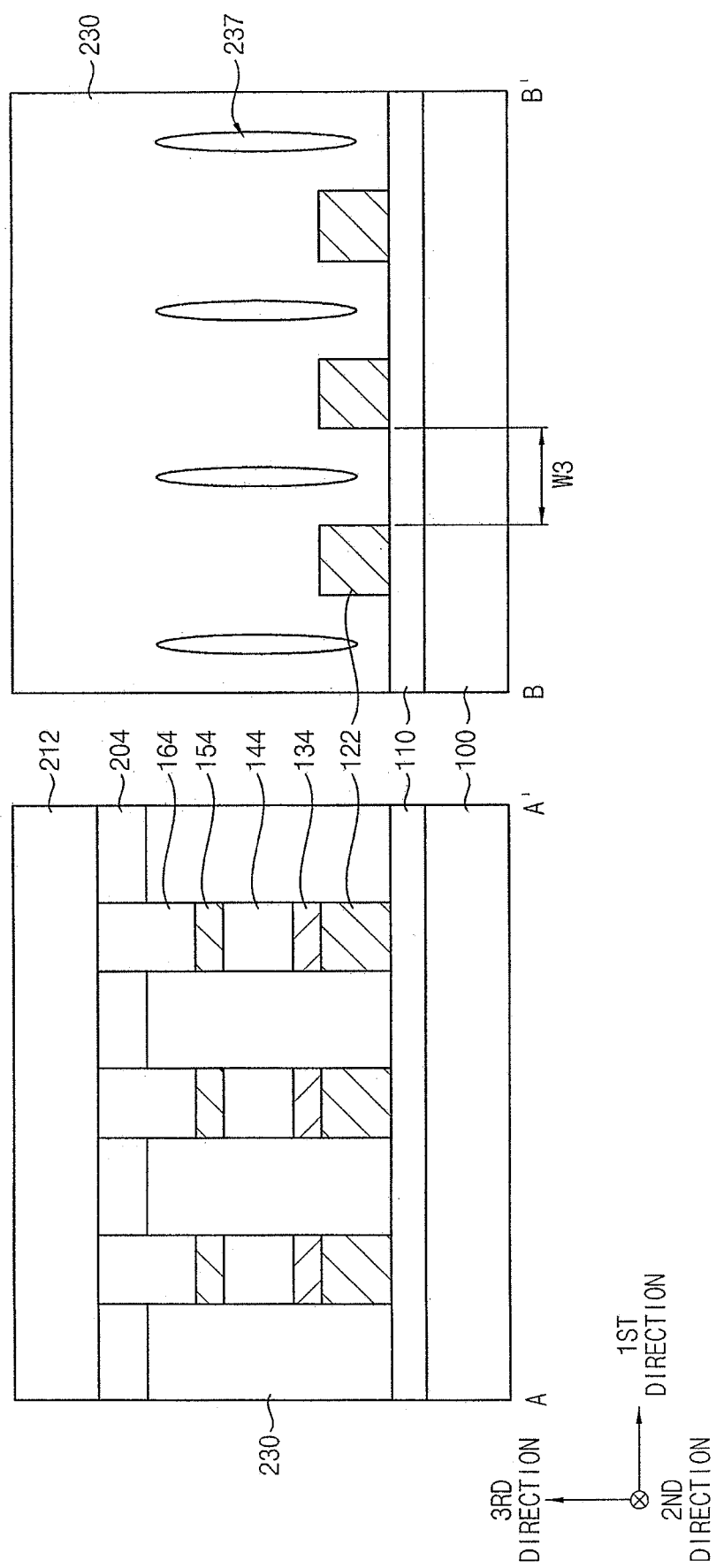
Figure 48:
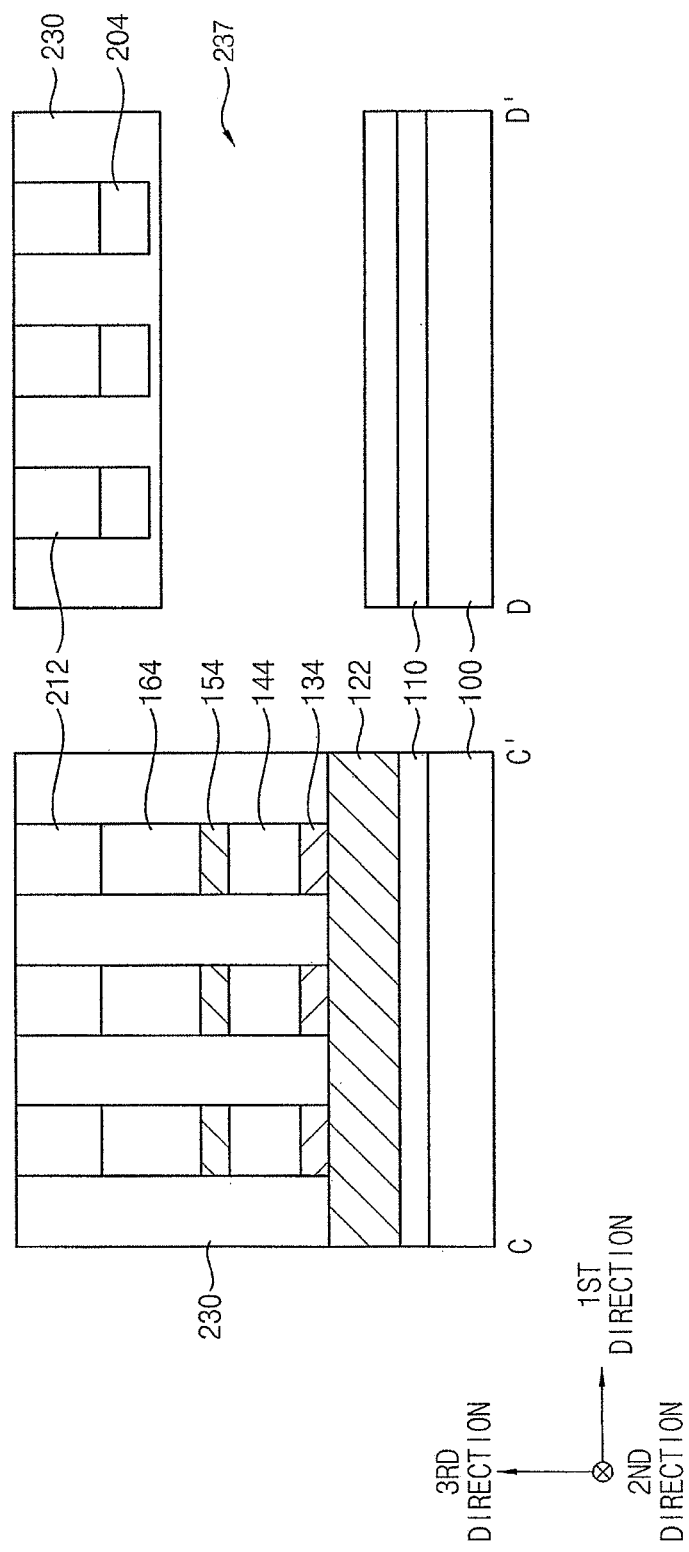

FIGS. 43 to 48 illustrate plan views and cross-sectional views of stages in a method of manufacturing a variable resistance memory device in accordance with example embodiments. FIGS. 43 and 46 are plan views, FIGS. 44 and 47 illustrate cross-sectional views including cross-sections taken along lines A-A' and B-B', respectively, of corresponding plan views, and FIGS. 45 and 48 are cross-sectional views including cross-sections taken along lines C-C' and D-D', respectively, of corresponding plan views. This method may include processes substantially the same as or similar to those illustrated with reference to FIGS. 1 to 30, and thus repeated detailed descriptions thereon may be omitted herein.

Referring to FIGS. 43 to 45, processes substantially the same as or similar to those illustrated with reference to FIGS. 4 to 18 may be performed.

In the present embodiment, the first conductive lines 122 may be spaced apart from each other by a third width W3 in the first direction, and the second masks 212 may be spaced apart from each other by a fourth width W4 in the second direction. In example embodiments, the third width W3 may be greater than the fourth width W4.

Referring to FIGS. 46 to 48, processes substantially the same as or similar to those illustrated with reference to FIGS. 19 to 24 may be performed.

Thus, a first air gap 237 may be formed in the second insulation layer 230.

In example embodiments, the first air gap 237 may be formed to extend in the second direction between the first conductive lines 122. A bottom of the first air gap 237 may be lower than upper surfaces of the first conductive lines 122.

For example, the third width W3 between the first conductive lines 122 (that may be disposed over the second masks 212) may be greater than the fourth width W4 between the second masks 212, and thus the first air gap 237 in the second insulation layer 230 covering the first conductive lines 122 and the second masks 212 may horizontally overlap at least a portion of the first conductive lines 122. Accordingly, the bottom of the first air gap 237 may be lower than the upper surfaces of the first conductive lines 122.

Referring to FIGS. 40 to 42 again, processes substantially the same as or similar to those illustrated with reference to FIGS. 25 to 30 and FIGS. 1 to 3 may be performed to complete the variable resistance memory device.

Figure 49:
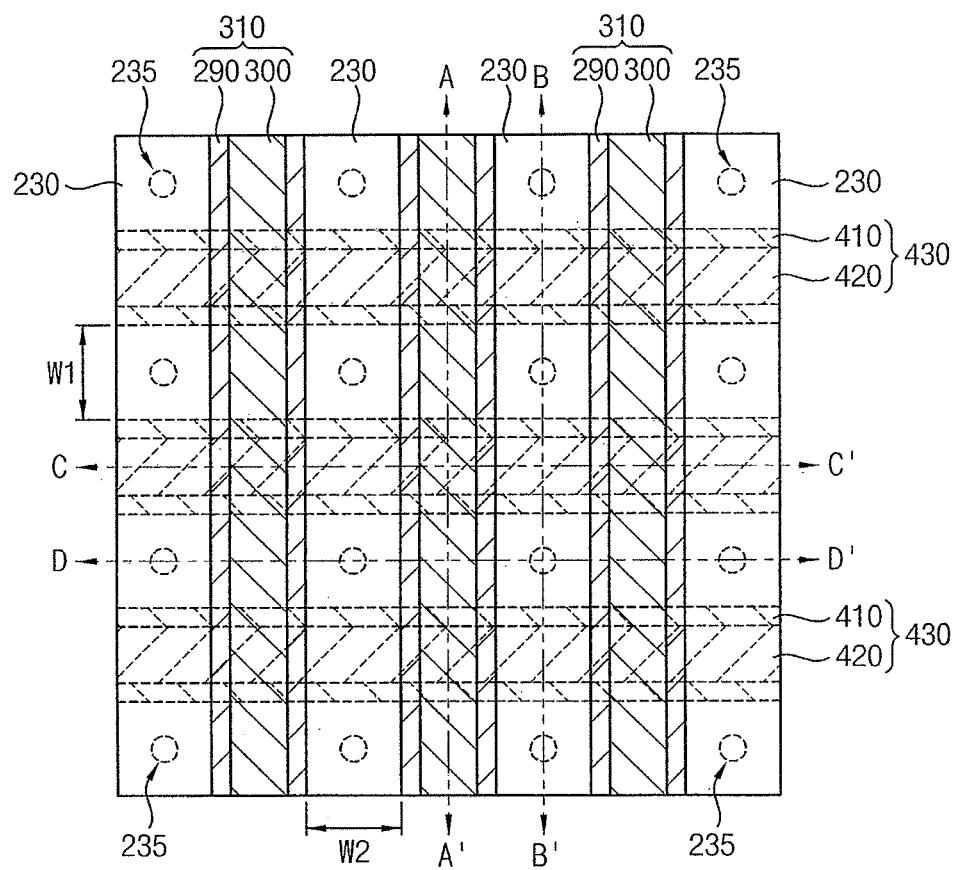
FIG. 49 illustrates a plan view of a variable resistance memory device in accordance with example embodiments.
Figure 50:
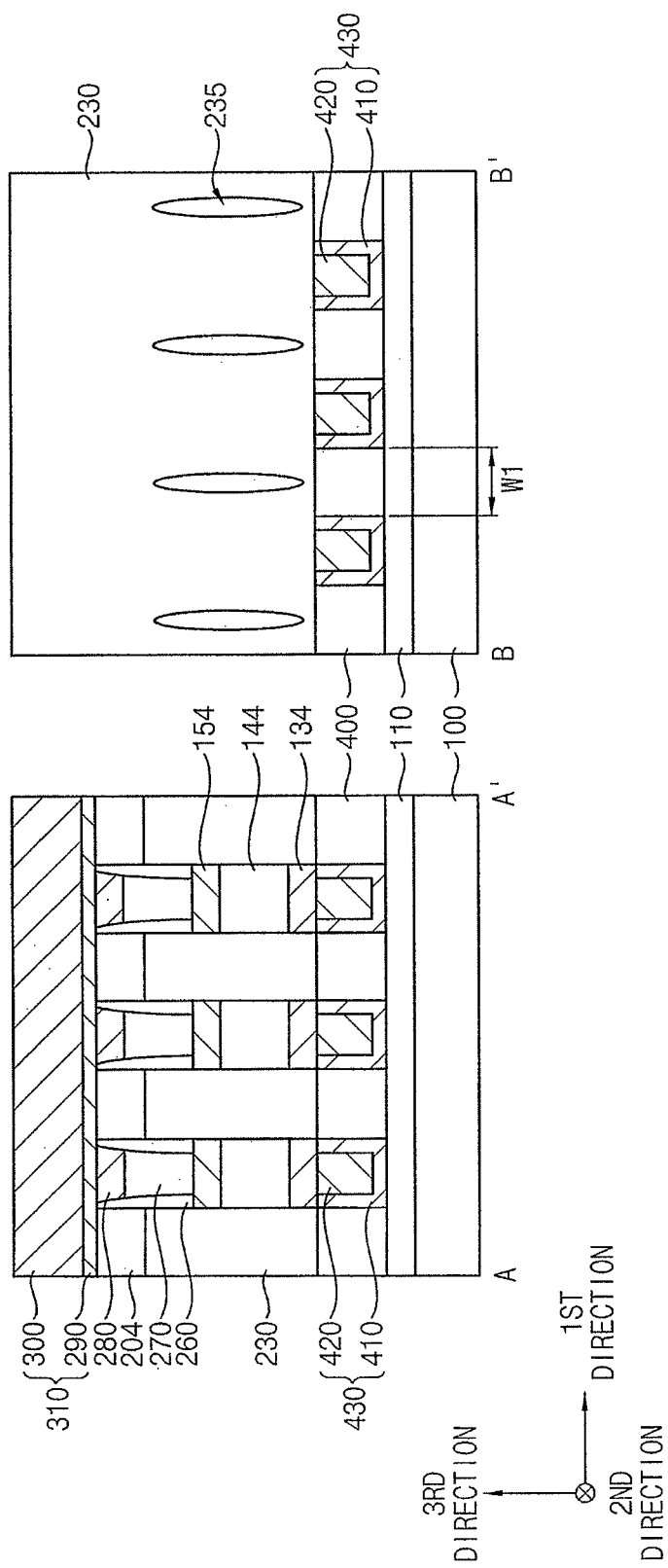
FIGS. 50 and 51 illustrate cross-sectional views of the variable resistance memory device of FIG. 49.
Figure 51:
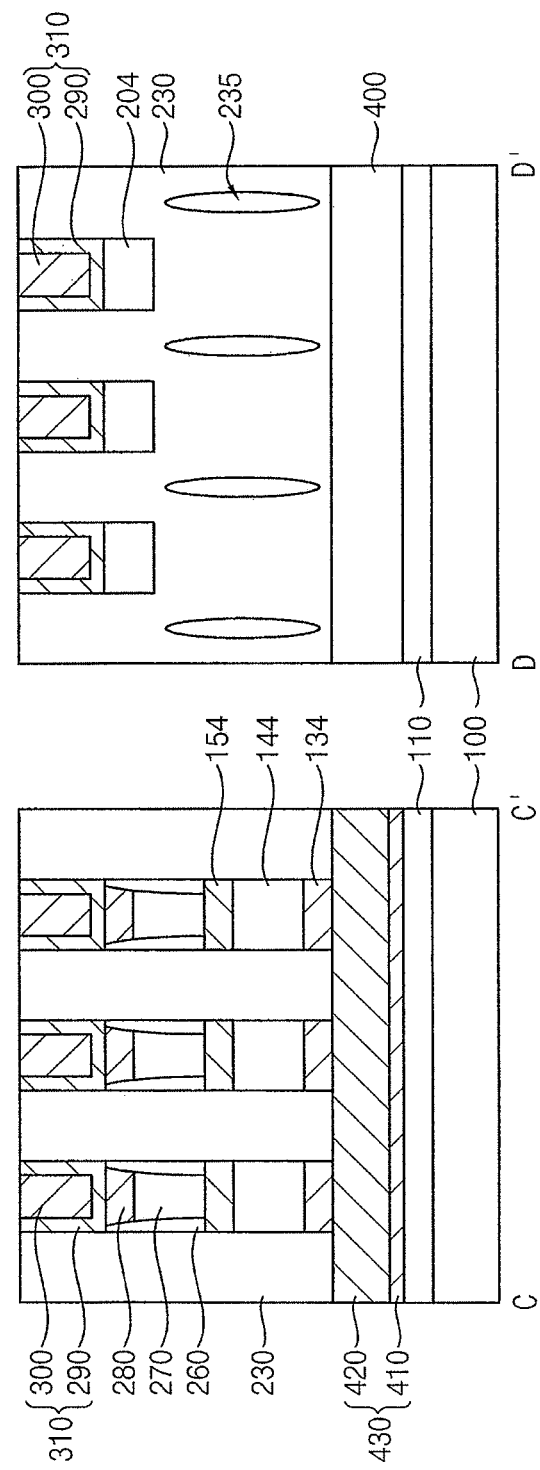

FIG. 49 illustrates a plan view of a variable resistance memory device in accordance with example embodiments, and FIGS. 50 and 51 illustrate cross-sectional views illustrating the variable resistance memory device of FIG. 49. FIG. 50 is a cross-sectional view including cross-sections taken along lines A-A' and B-B', respectively, in FIG. 49, and FIG. 51 is a cross-sectional view including cross-sections taken along lines C-C' and D-D', respectively, in FIG. 49.

The variable resistance memory device may be substantially the same as or similar to that of FIGS. 1 to 3, except for the first and third conductive lines and the third insulation layer. Thus, like reference numerals refer to like elements, and repeated detailed descriptions thereof may be omitted.

Referring to FIGS. 49 to 51, the variable resistance memory device may include a third conductive line 430, the second conductive line 310, the first memory unit, the second insulation layer 230 (having the first air gap 235 therein), and the first filling pattern 204 on the substrate 100.

The variable resistance memory device may further include the first and third electrodes 134 and 280, the first spacer 260, the first insulation layer 110, and a third insulation layer 400.

The third insulation layer 400 may contain the third conductive line 430 therein, and may be formed on the first insulation layer 110. The third insulation layer 400 may be formed of an insulating material, e.g., silicon oxide, silicon nitride, silicon oxynitride, etc.

The third conductive line 400 may be formed by a damascene process, and may include a second metal pattern 420 and a second barrier pattern 410 covering a sidewall and a lower surface of the second metal pattern 420. In example embodiments, a plurality of third conductive lines 430 may be formed to be spaced apart from each other by the first width W1 in the first direction.

The second metal pattern 420 may be formed of a metal, e.g., tungsten, platinum, palladium, rhodium, ruthenium, iridium, copper, aluminum, titanium, tantalum, etc., and the second barrier pattern 410 may be formed of a metal nitride, e.g., titanium nitride, tantalum nitride, tungsten nitride, etc.

FIGS. 52 to 63 illustrate plan views and cross-sectional views of stages in a method of manufacturing a variable resistance memory device in accordance with example embodiments. FIGS. 52, 55, 58 and 61 are plan views, FIGS. 53, 56, 59 and 62 are cross-sectional views including cross-sections taken along lines A-A' and B-B', respectively, of corresponding plan views, and FIGS. 54, 57, 60 and 63 are cross-sectional views including cross-sections taken along lines C-C' and D-D', respectively, of corresponding plan views. This method may include processes substantially the same as or similar to those illustrated with reference to FIGS. 1 to 30, and thus repeated detailed descriptions thereon may be omitted herein.

Figure 53:
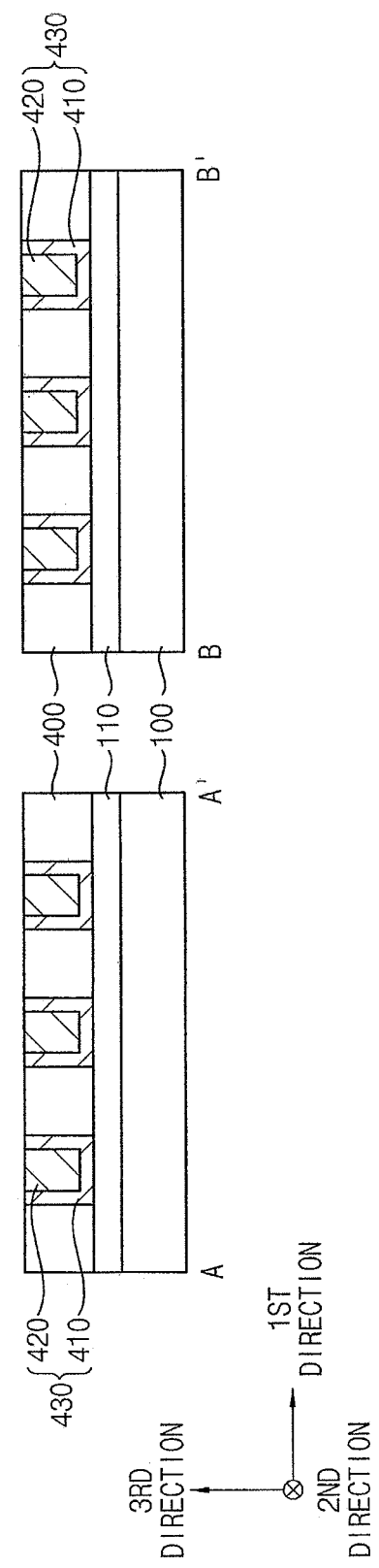
Figure 54:
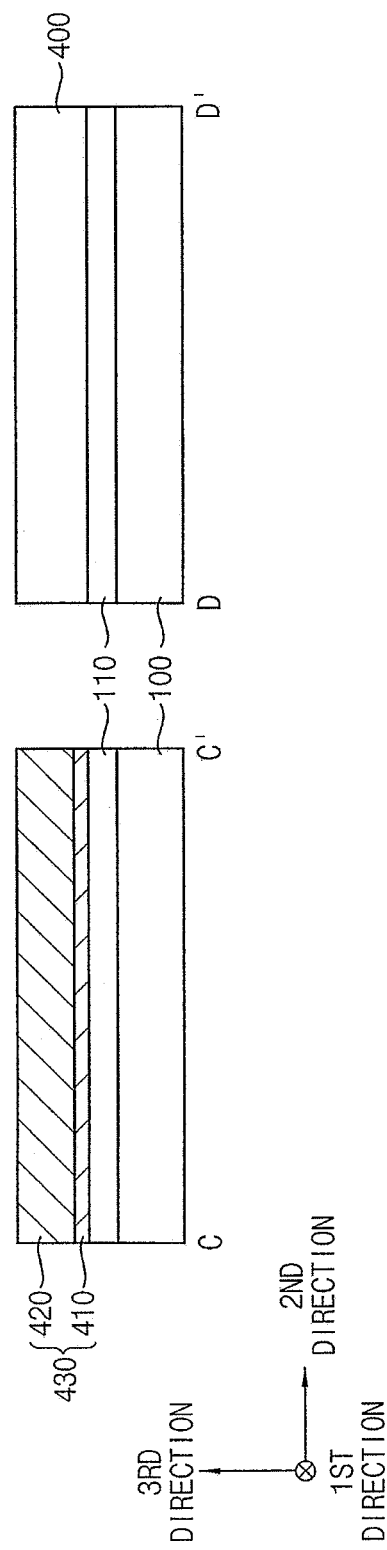

Referring to FIGS. 52 to 54, the first insulation layer 110 may be formed on the substrate 100, and a third insulation layer 400 containing third conductive lines 430 therein may be formed on the first insulation layer 110.

For example, a plurality of fifth openings (each of which may be formed through the third insulation layer 400 to expose an upper surface of the first insulation layer 110 and may extend in the second direction) may be formed in the first direction, a second barrier layer may be formed on a sidewall of the fifth opening, the exposed upper surface of the first insulation layer 110 and an upper surface of the third insulation layer 400, a second metal layer may be formed on the second barrier layer to fill the fifth openings, and the second metal layer and the second barrier layer may be planarized until the upper surface of the third insulation layer 400 is exposed to form the third conductive lines 430.

The third insulation layer 400 may be formed of an insulating material, e.g., silicon oxide, silicon nitride, silicon oxynitride, etc. The second metal layer may be formed of a metal, e.g., tungsten, platinum, palladium, rhodium, ruthenium, iridium, copper, aluminum, titanium, tantalum, etc., and the second barrier layer may be formed of a metal nitride, e.g., titanium nitride, tantalum nitride, tungsten nitride, etc.

Each of the third conductive lines 430 may include a second metal pattern 420 extending in the second direction, and a second barrier pattern 410 covering a sidewall and a lower surface of the second metal pattern 420.

Figure 56:
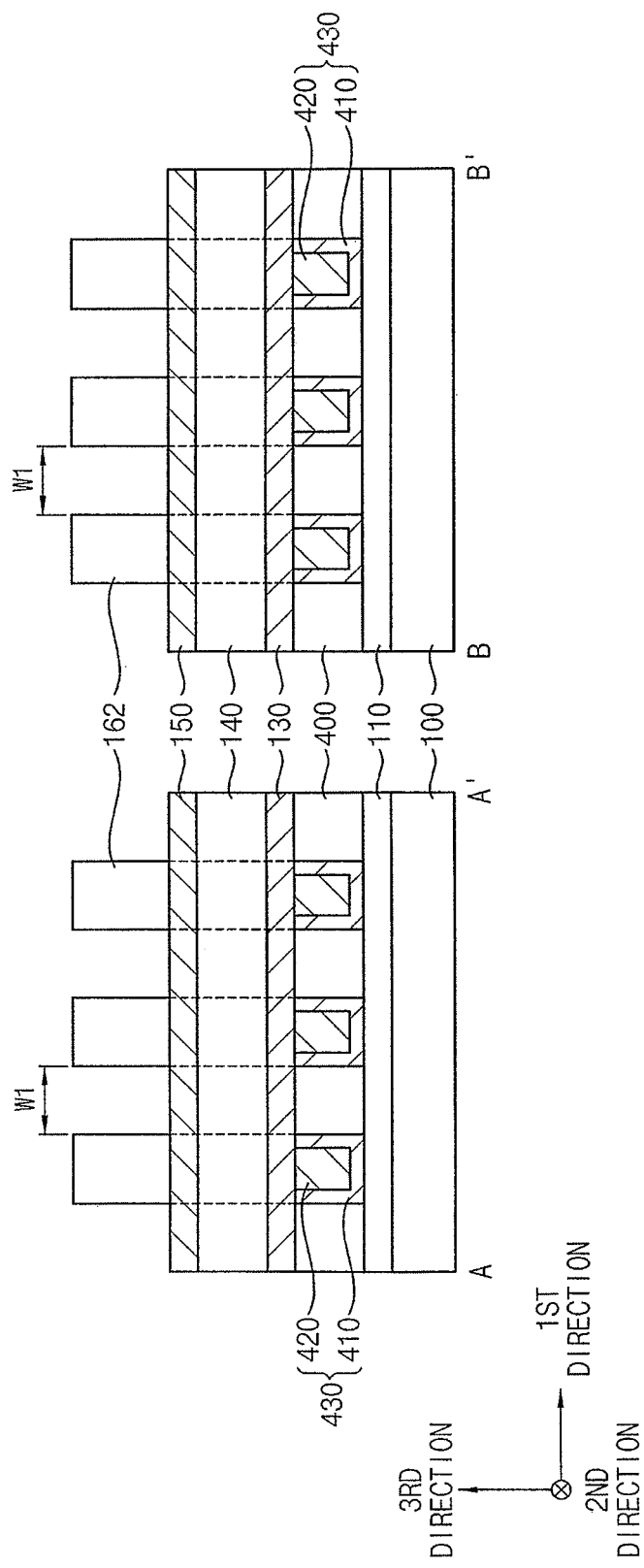
Figure 57:
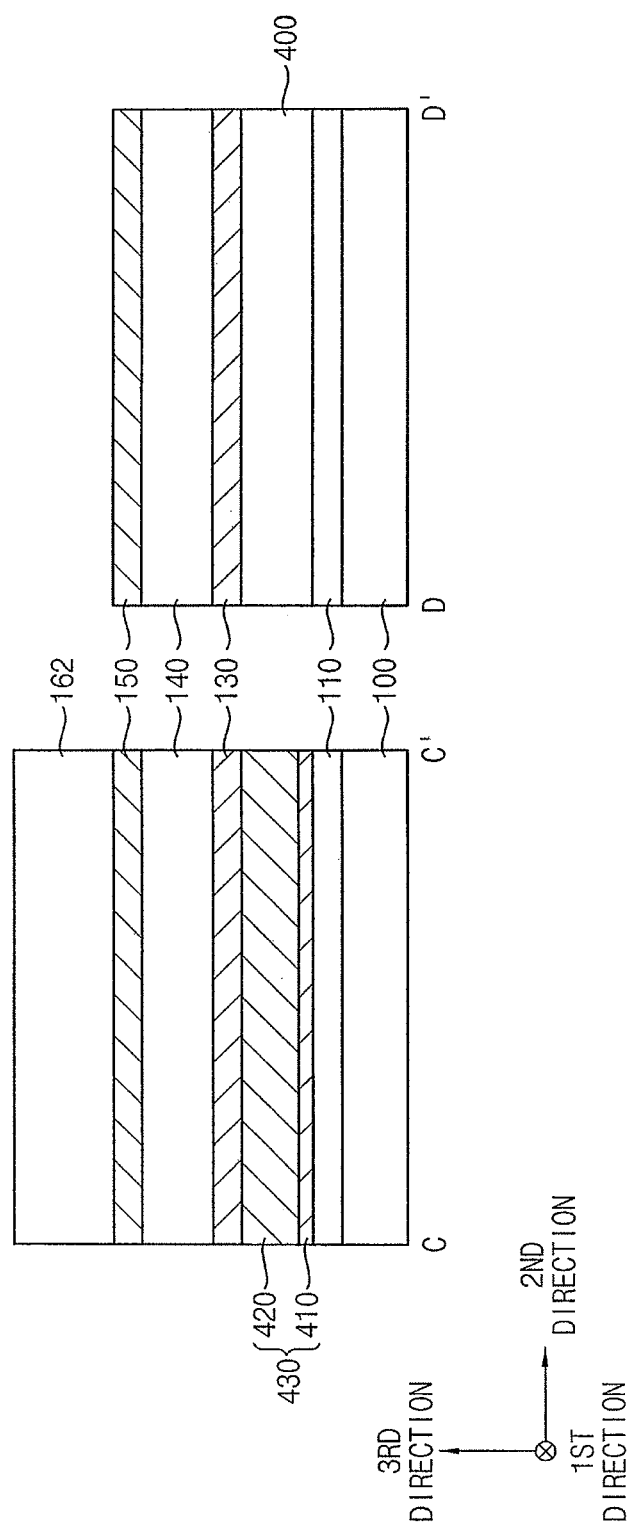

Referring to FIGS. 55 to 57, processes substantially the same as or similar to those illustrated with reference to FIGS. 4 to 6 may be performed.

Thus, the first electrode layer 130, the first selection layer 140 and the second electrode layer 150 may be sequentially formed on the third insulation layer 400 containing the third conductive lines 430, and the preliminary first mask 162 may be formed on the second electrode layer 150.

In example embodiments, the preliminary first mask 162 may extend in the second direction, and a plurality of preliminary first masks 162 may be formed in the first direction to be spaced apart from each other by the first width W1. Each of the preliminary first mask 162 may be formed to have a width in the first direction substantially equal to that of each of the underlying third conductive lines 430.

Figure 58:
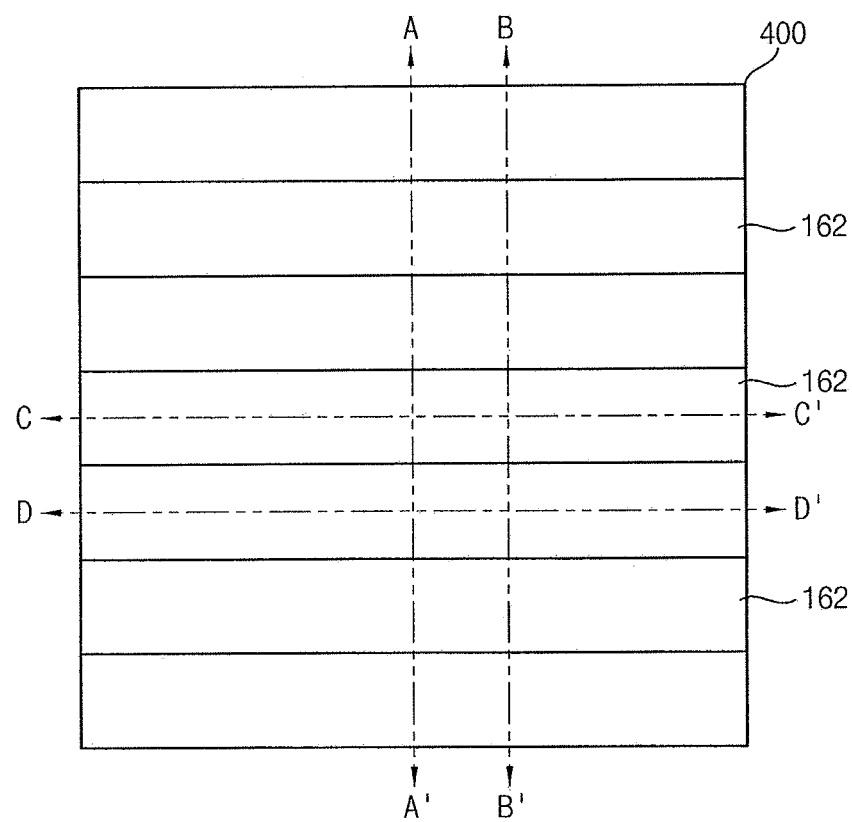
Figure 59:
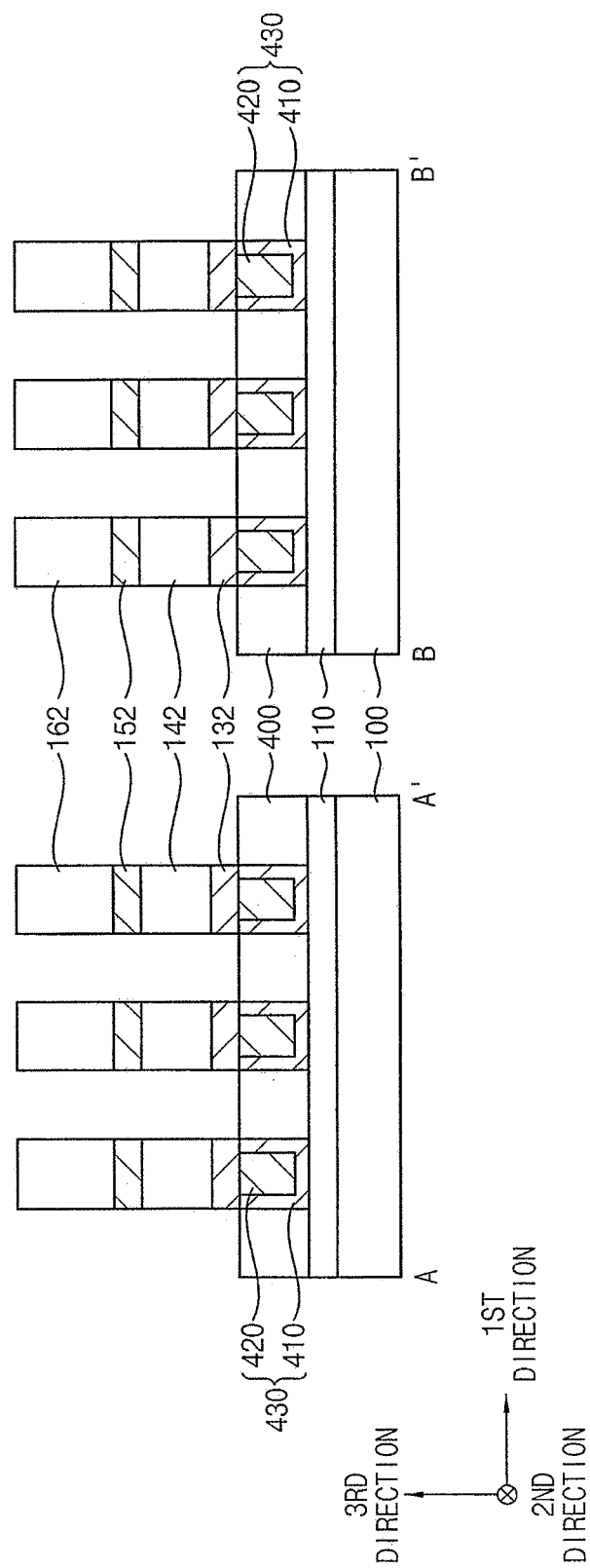
Figure 60:
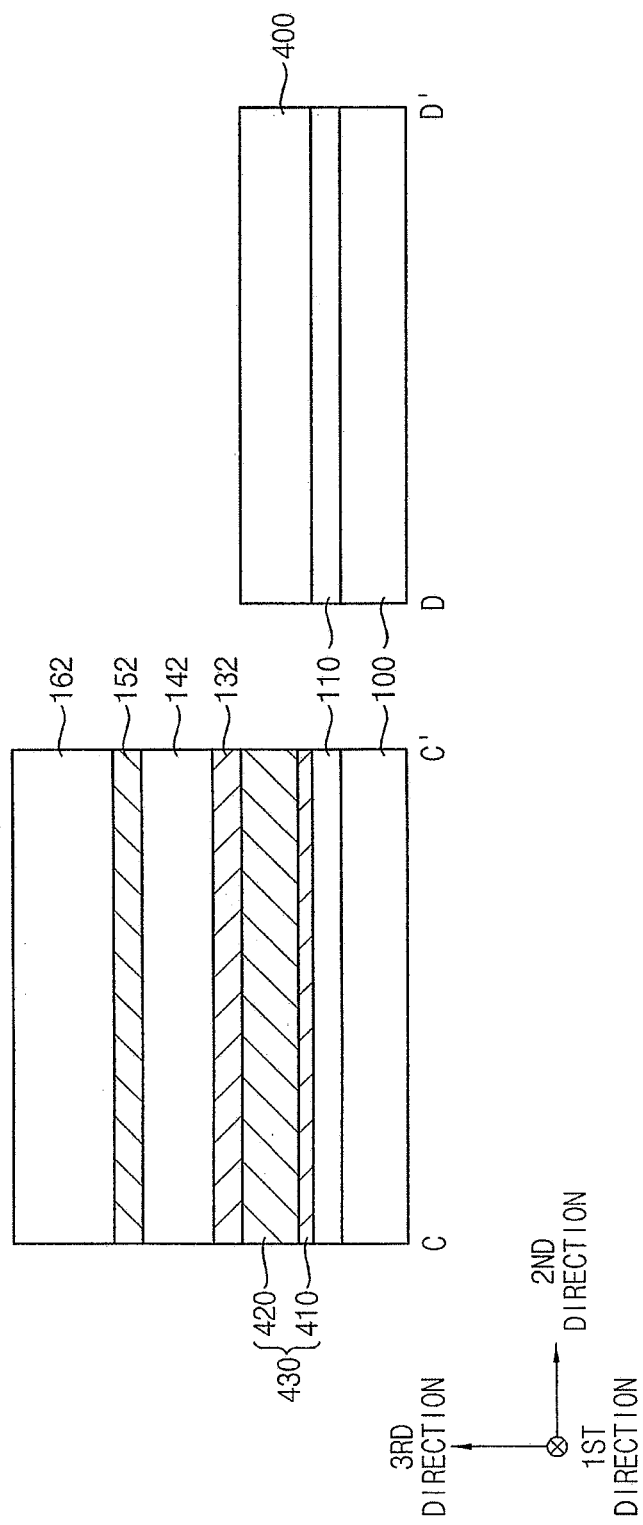

Referring to FIGS. 58 to 60, process substantially the same as or similar to that illustrated with reference to FIGS. 7 to 9 may be performed.

Thus, a third structure including the preliminary first electrode 132, the preliminary first selection pattern 142, the preliminary second electrode 152 and the preliminary first mask 162 sequentially stacked may be formed on the third conductive line 430. The third structure may extend in the second direction, and a plurality of third structures may be formed in the first direction.

Figure 61:
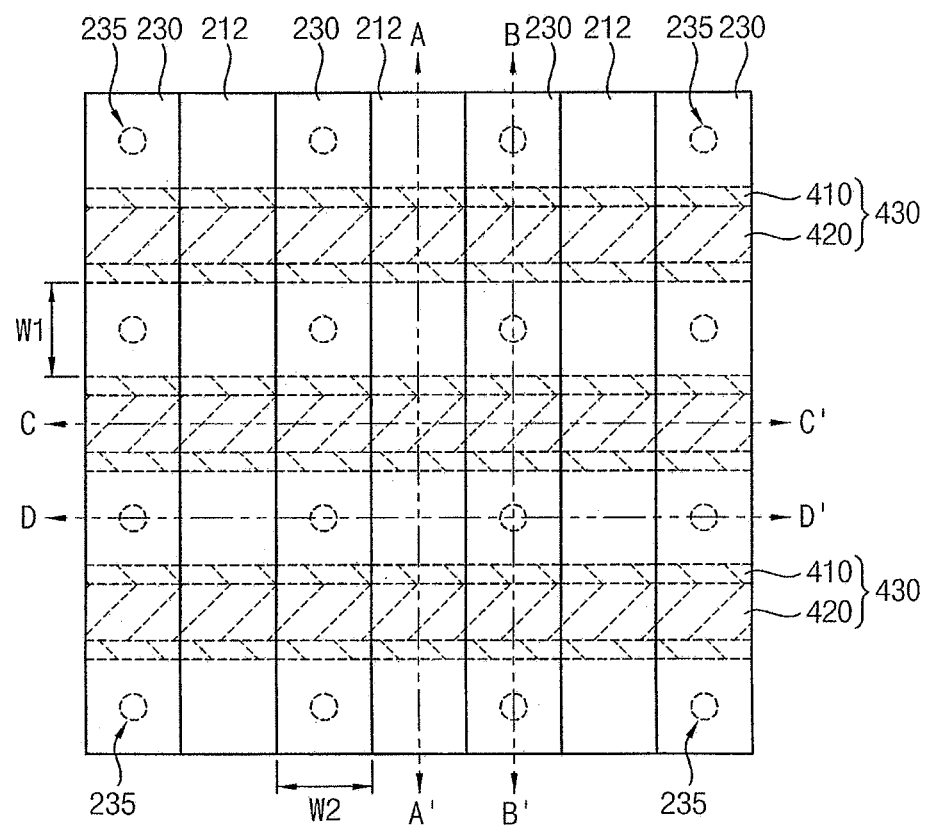
Figure 62:
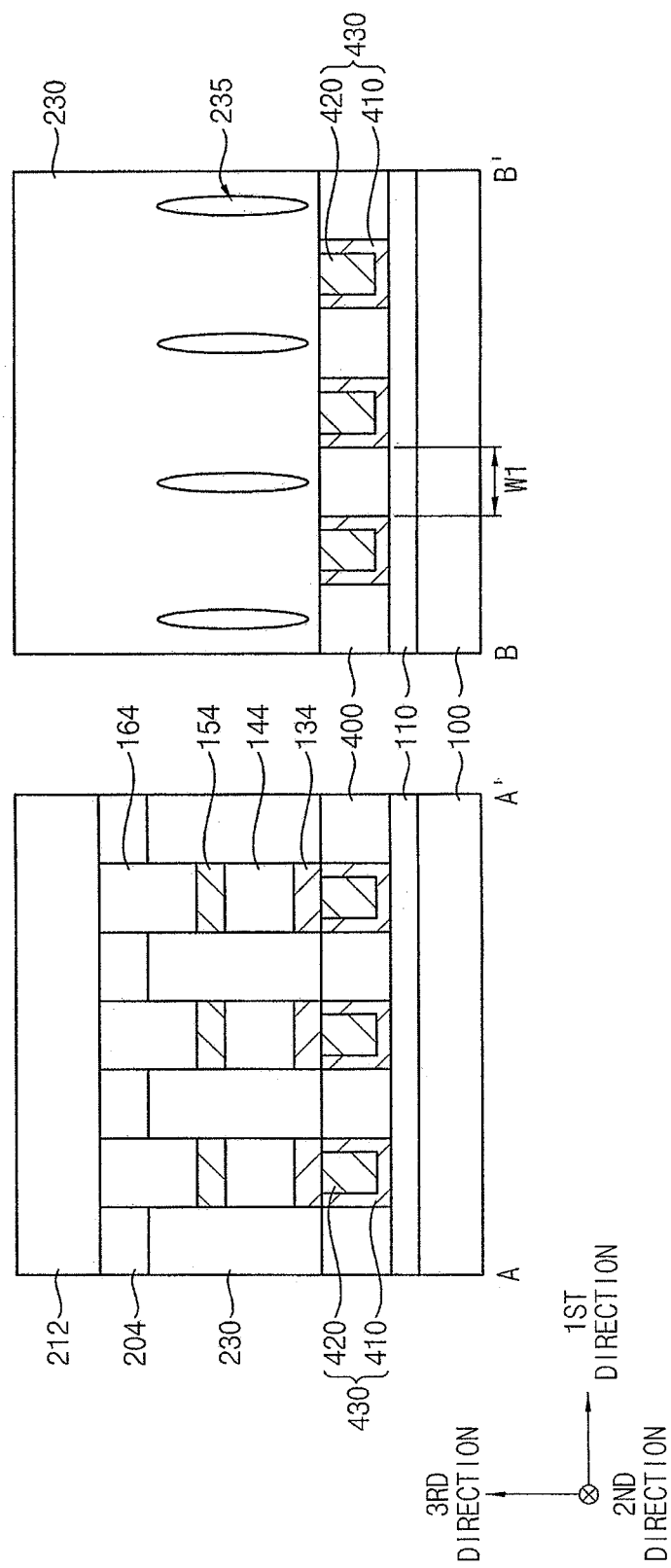
Figure 63:
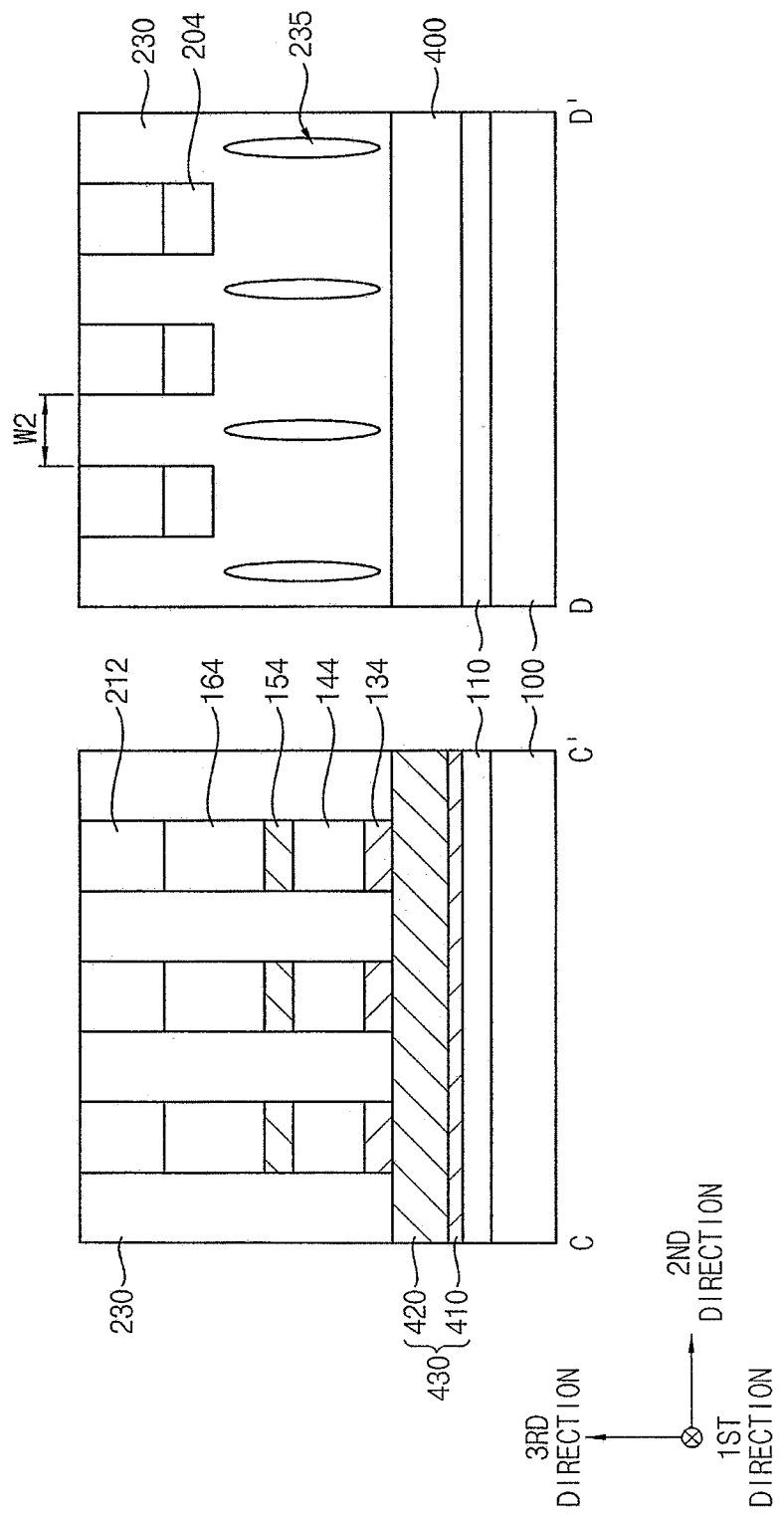

Referring to FIGS. 61 to 63, processes substantially the same as or similar to those illustrated with reference to FIGS. 10 to 24 may be performed.

Thus, the second insulation layer 230 may be formed to cover the third structure, the first filling pattern 204 and the second mask 212, and the first air gap 235 may be formed in the second insulation layer 230.

Referring to FIGS. 49 to 51 again, processes substantially the same as or similar to those illustrated with reference to FIGS. 25 to 30 and FIGS. 1 to 3 may be performed to complete the variable resistance memory device.

Figure 65:
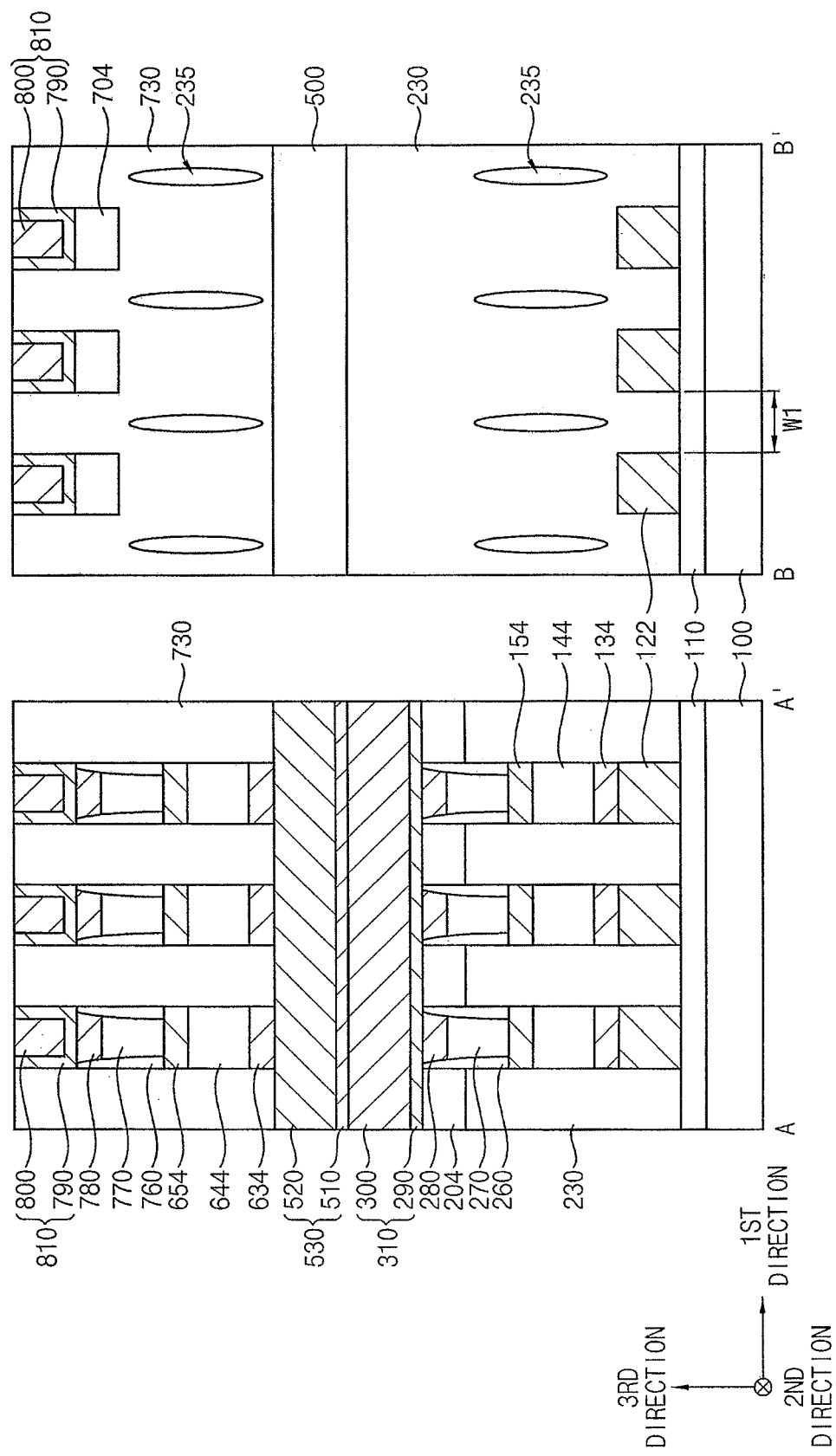
FIGS. 65 and 66 illustrate cross-sectional views of the variable resistance memory device of FIG. 64.
Figure 66:
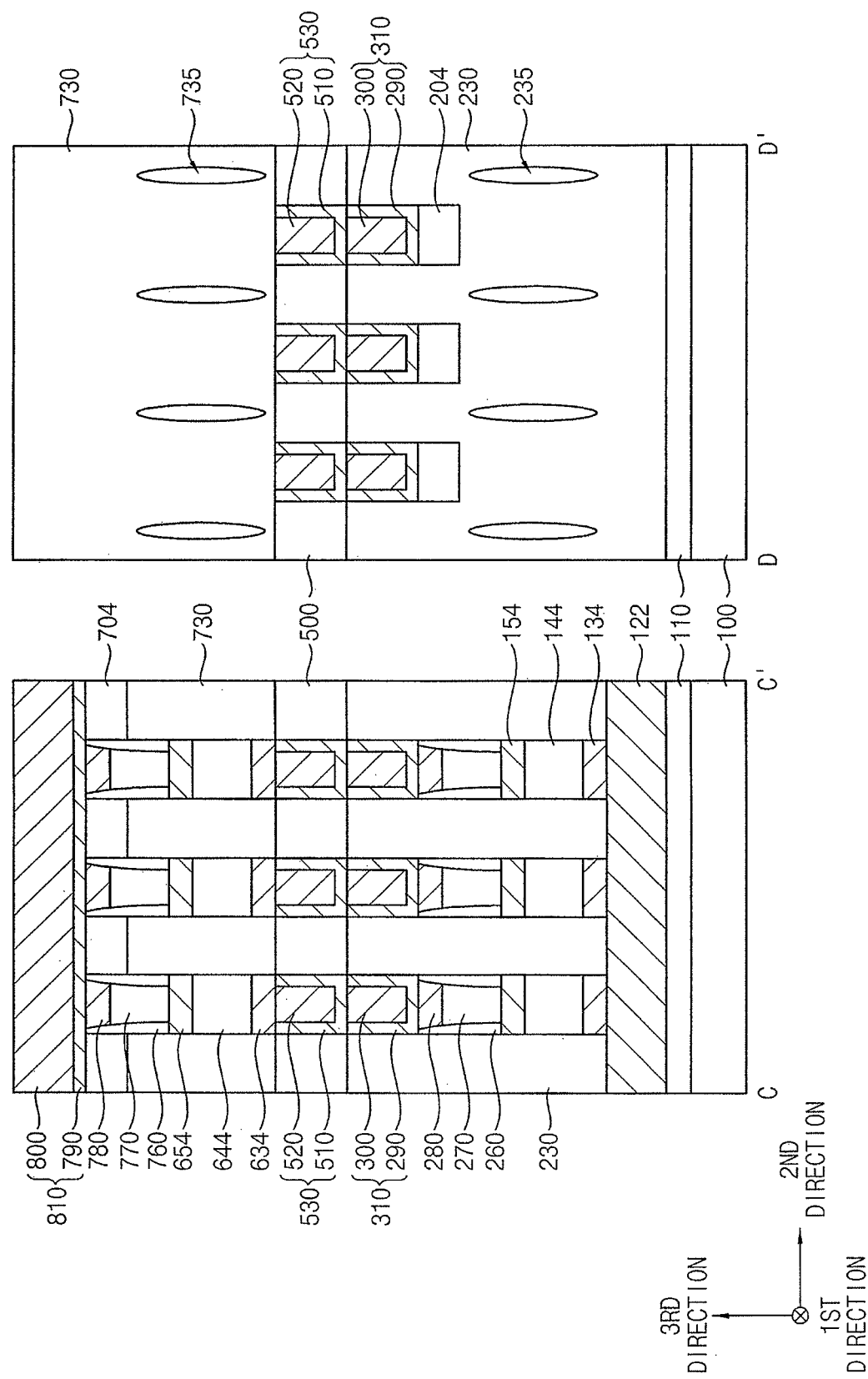

FIG. 64 illustrates a plan view of a variable resistance memory device in accordance with example embodiments, and FIGS. 65 and 66 illustrate cross-sectional views of the variable resistance memory device of FIG. 64. FIG. 65 is a cross-sectional view including cross-sections taken along lines A-A' and B-B', respectively, in FIG. 64, and FIG. 66 is a cross-sectional view including cross-sections taken along lines C-C' and D-D', respectively, in FIG. 64.

The variable resistance memory device may have a stacked structure including the variable resistance memory device of FIGS. 1 to 3 and the variable resistance memory device of FIGS. 49 to 51 sequentially stacked. Thus, like reference numerals refer to like elements, and repeated detailed descriptions thereon may be omitted below in the interest of brevity.

Referring to FIGS. 64 to 66, the variable resistance memory device may include first and second memory structures sequentially stacked in the third direction. The first memory structure may be substantially the same as the variable resistance memory device of FIGS. 1 to 3.

The second memory structure may be similar to the variable resistance memory device of FIGS. 49 to 51.

For example, the second memory structure may be formed on the first memory structure, and may include a fourth insulation layer 500 containing a fourth conductive line 530 therein, a fifth conductive line 810 over the fourth conductive line 530, a second memory unit between the fourth and fifth conductive lines 530 and 810, a fifth insulation layer 730 covering the second memory unit and containing a second air gap 735 therein, and a second filling pattern 704. The second memory unit may include a second selection pattern 644, a fifth electrode 654 and a second variable resistance pattern 770 sequentially stacked.

The second memory structure may further include fourth and sixth electrodes 634 and 780, and a second spacer 760.

The second air gap 735 in the fifth insulation layer 730 may be formed in an area overlapping neither the fourth conductive lines 530 nor the fifth conductive lines 810 in the third direction. Each of the fifth conductive lines 810 may include a fourth metal pattern 800 extending in the second direction, and a fourth barrier pattern covering a sidewall and a lower surface of the fourth metal pattern 800.

In example embodiments, the first and second conductive lines 122 and 310 may serve as word lines and bit lines, respectively, of the first memory structure, and the fourth and fifth conductive lines 530 and 810 may serve as bit lines and word lines, respectively, of the second memory structure. In an implementation, the first and second conductive lines 122 and 310 may serve as bit lines and word lines, respectively, of the first memory structure, and the fourth and fifth conductive lines 530 and 810 may serve as word lines and bit lines, respectively, of the second memory structure.

FIGS. 64 to 66 show that the variable resistance memory device includes two stacked memory structures, i.e., the first and second memory structures. In an implementation, the variable resistance memory device may include a plurality of memory structures sequentially stacked.

Figure 67:
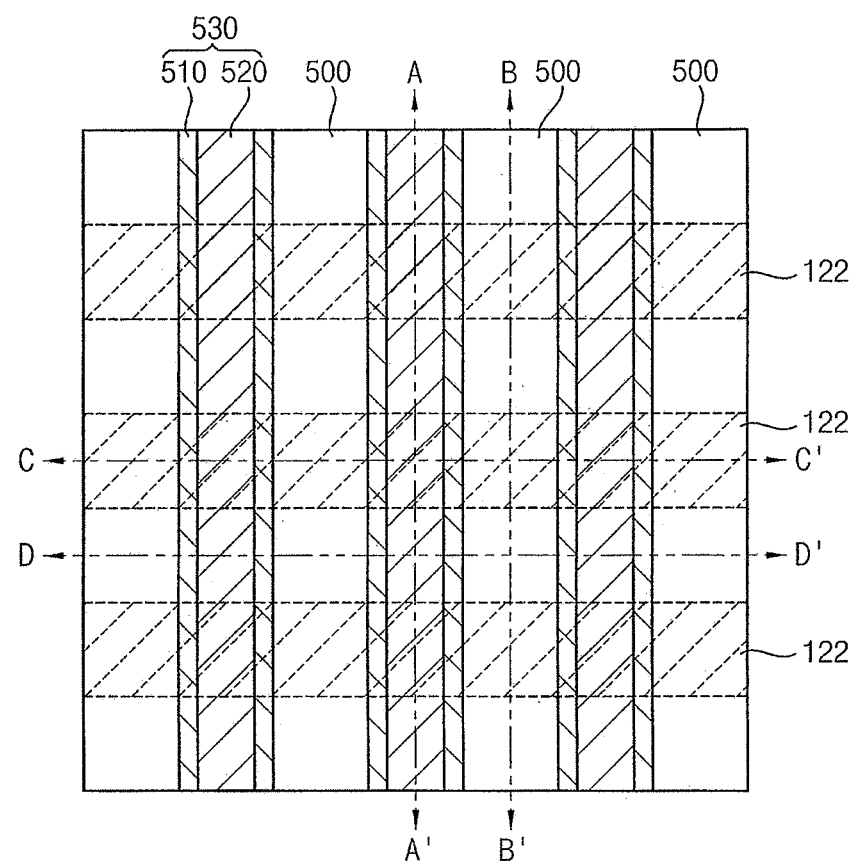
FIGS. 67 to 69 illustrate a plan view and cross-sectional views of stages in a method of manufacturing a variable resistance memory device in accordance with example embodiments.
Figure 68:
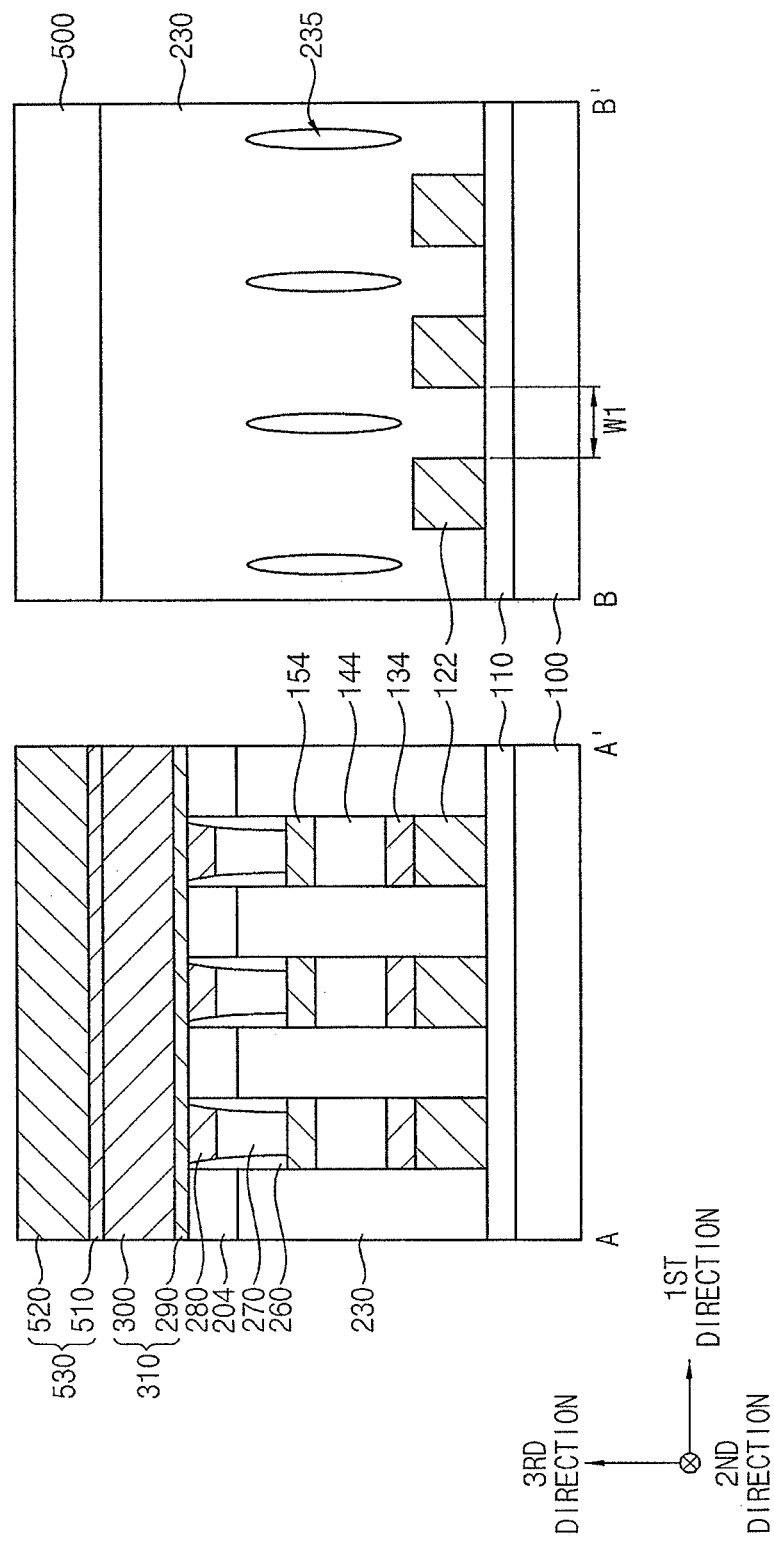
Figure 69:
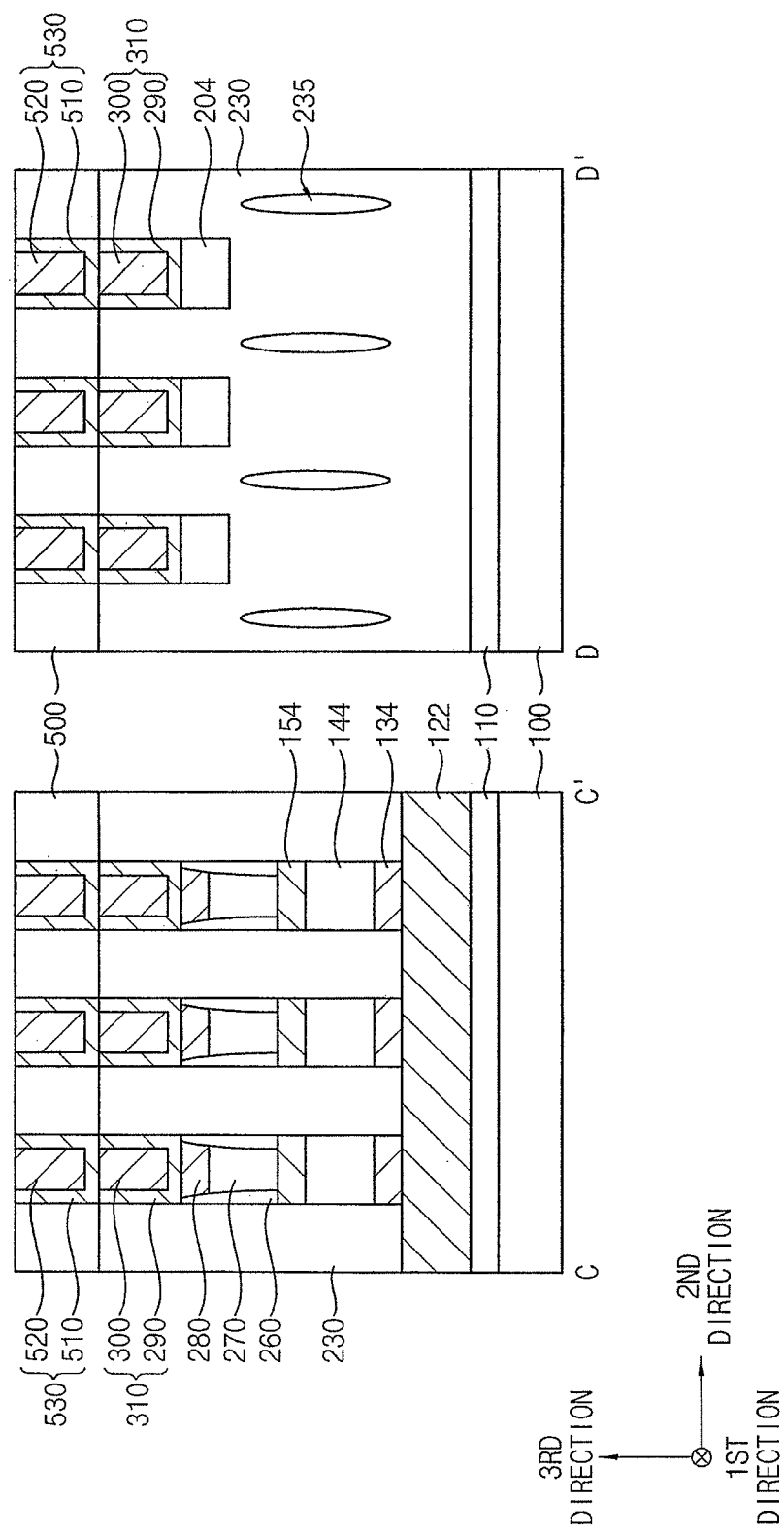

FIGS. 67 to 69 illustrate a plan view and cross-sectional views of stages in a method of manufacturing a variable resistance memory device in accordance with example embodiments. FIG. 67 is a plan view, FIG. 68 is a cross-sectional view including cross-sections taken along lines A-A' and B-B', respectively, of FIG. 67, and FIG. 69 is a cross-sectional view including cross-sections taken along lines C-C' and D-D', respectively, of FIG. 67. This method may include processes substantially the same as or similar to those illustrated with reference to FIGS. 1 to 30 or those illustrated with reference to FIGS. 49 to 63, and thus repeated detailed descriptions thereon may be omitted herein.

Referring to FIGS. 67 to 69, processes substantially the same as or similar to those illustrated with reference to FIGS. 1 to 30 may be performed to form a first memory structure, and processes substantially the same as or similar to those illustrated with reference to FIGS. 52 to 54 may be performed to form a fourth insulation layer 500 containing fourth conductive lines 530 therein on the first memory structure.

For example, the fourth insulation layer 500 may be formed on the first memory structure, and a plurality of sixth openings, which may be formed through the fourth insulation layer 500 to expose an upper surface of the second conductive line 310 and may extend in the first direction, may be formed in the second direction. A third barrier layer may be formed on a sidewall of the sixth opening, the exposed upper surface of the second conductive line 310 and an upper surface of the fourth insulation layer 500, a third metal layer may be formed on the third barrier layer to fill the sixth openings, and the third metal layer and the third barrier layer may be planarized until the upper surface of the fourth insulation layer 500 may be exposed to form the fourth conductive lines 530 in the respective sixth openings.

The fourth insulation layer 500 may be formed of an insulating material, e.g., silicon oxide, silicon nitride, silicon oxynitride, etc. The third metal layer may be formed of a metal, e.g., tungsten, platinum, palladium, rhodium, ruthenium, iridium, copper, aluminum, titanium, tantalum, etc., and the third barrier layer may be formed of a metal nitride, e.g., titanium nitride, tantalum nitride, tungsten nitride, etc.

Each of the fourth conductive lines 530 may include a third metal pattern 520 extending in the first direction, and a third barrier pattern 510 covering a sidewall and a lower surface of the third metal pattern 520.

In example embodiments, the fourth conductive lines 530 may be formed to contact upper surfaces of the second conductive lines 310, respectively.

Referring to FIGS. 64 to 66 again, processes substantially the same as or similar to those illustrated with reference to FIGS. 55 to 63 and FIGS. 49 to 51 may be performed.

Thus, a second memory structure similar to the first memory structure may be formed thereon, and the variable resistance memory device including the first and second memory structures sequentially stacked may be completed.

The second memory structure may include a fourth conductive line 530, a fifth conductive line 810, a second memory unit, a fifth insulation layer 730 having a second air gap 735, and a second filling pattern 704. The second memory unit may include a second selection pattern 644, a fifth electrode 654 and a second variable resistance pattern 770 sequentially stacked.

The variable resistance memory device may further include fourth and sixth electrodes 634 and 780, and a second spacer 760.

The second air gap 735 may be formed in an area of the fifth insulation layer 730 overlapping neither the fourth conductive lines 530 nor the fifth conductive lines 810 in the third direction. In example embodiments, at least one of the second air gaps 735 may overlap one of the first air gaps 235 in the third direction.

Each of the fifth conductive lines 810 may include a fourth metal pattern 800 extending in the second direction, and a fourth barrier pattern 790 covering a sidewall and a lower surface of the fourth metal pattern 800.

Figure 70:
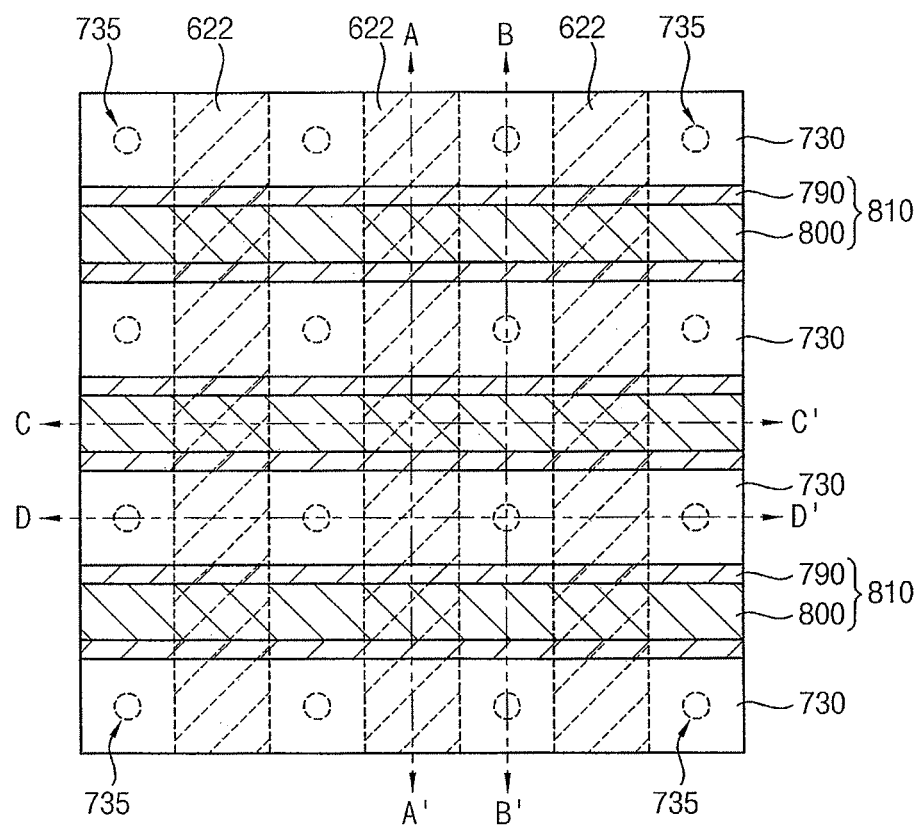
FIG. 70 illustrates a plan view of a variable resistance memory device in accordance with example embodiments.
Figure 71:
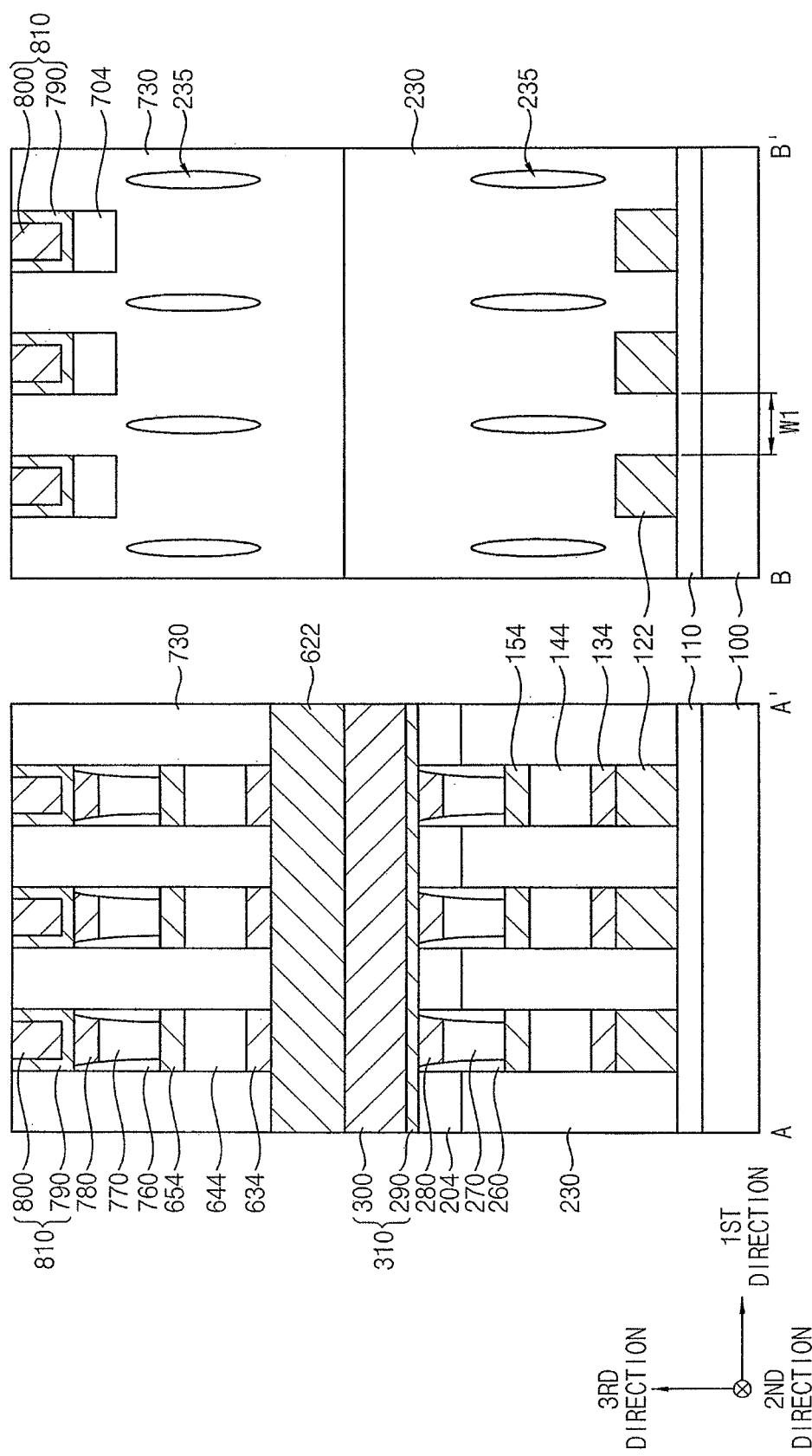
FIGS. 71 and 72 illustrate cross-sectional views of the variable resistance memory device of FIG. 70.
Figure 72:
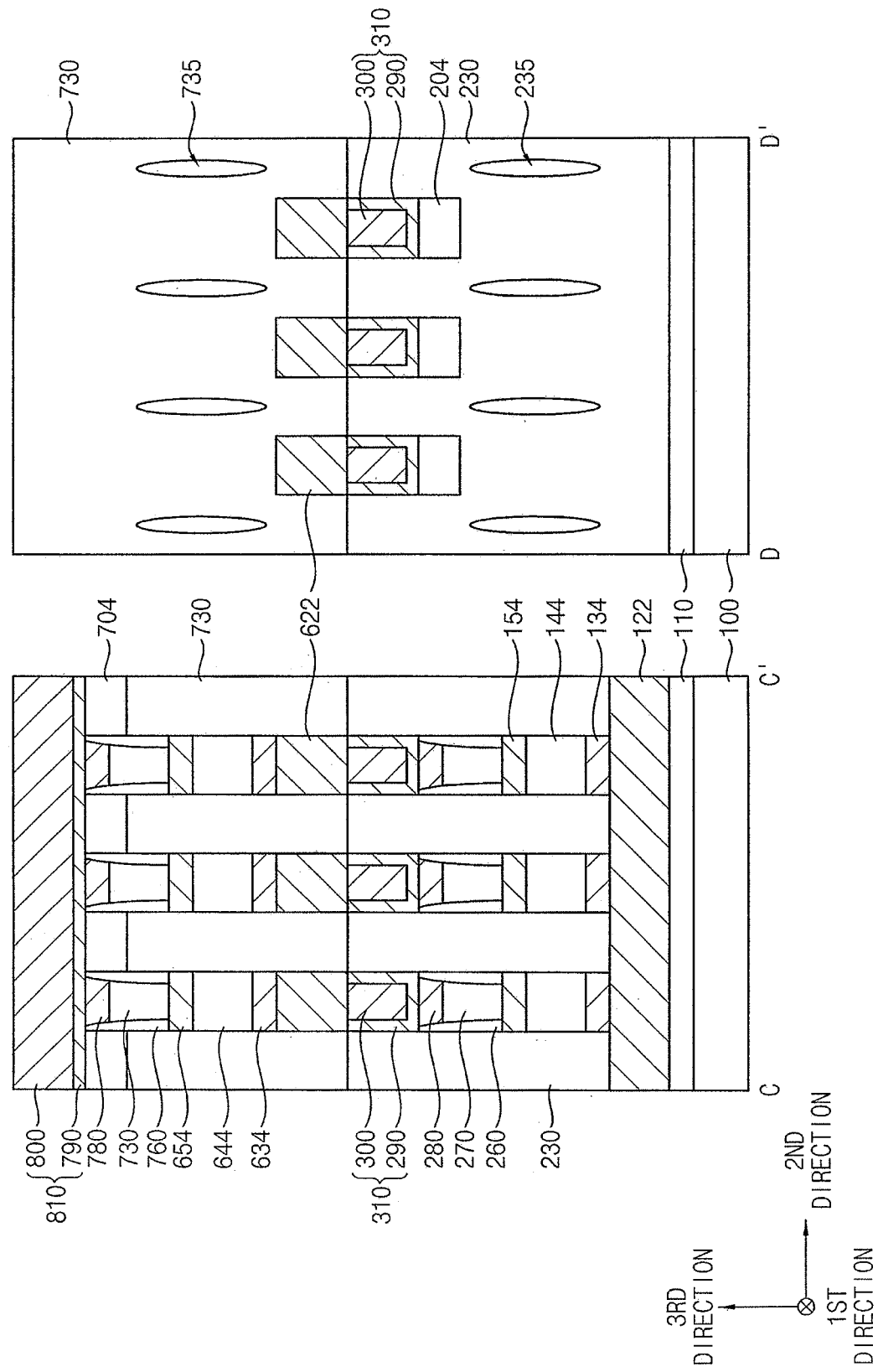

FIG. 70 illustrates a plan view of a variable resistance memory device in accordance with example embodiments, and FIGS. 71 and 72 illustrate cross-sectional views of the variable resistance memory device of FIG. 70. FIG. 71 is a cross-sectional view including cross-sections taken along lines A-A' and B-B', respectively, in FIG. 70, and FIG. 72 is a cross-sectional view including cross-sections taken along lines C-C' and D-D', respectively, in FIG. 70.

The variable resistance memory device may have a stacked structure including the variable resistance memory devices of FIGS. 1 to 3 sequentially stacked. Thus, like reference numerals refer to like elements, and repeated detailed descriptions thereon may be omitted below.

Referring to FIGS. 70 to 72, the variable resistance memory device may include first and second memory structures sequentially stacked in the third direction. The first memory structure may be substantially the same as the variable resistance memory device of FIGS. 1 to 3.

The second memory structure may be also substantially the same as or similar to the variable resistance memory device of FIGS. 1 to 3. In an implementation, a sixth conductive line 622 at a low level in the second memory structure may extend in the first direction, and a plurality of sixth conductive lines 622 may be spaced apart from each other in the second direction. The fifth conductive line 810 at a high level in the second memory structure may extend in the second direction, and a plurality of fifth conductive lines 810 may be spaced apart from each other in the first direction.

The second memory structure may include the sixth and fifth conductive lines 622 and 810, the second memory unit therebetween, the fifth insulation layer 730 covering the second memory unit and having the second air gap 735 therein, and the second filling pattern 704, and the second memory unit may include the second selection pattern 644, the fifth electrode 654 and the second variable resistance pattern 770 sequentially stacked.

The second memory structure may further include the fourth and sixth electrodes 634 and 780, and the second spacer 760.

The second air gap 735 may be formed in an area of the fifth insulation layer 730 overlapping neither the fourth conductive lines 530 nor the fifth conductive lines 810 in the third direction. Each of the fifth conductive lines 810 may include the fourth metal pattern 800 extending in the second direction, and a fourth barrier pattern 790 covering a sidewall and a lower surface of the fourth metal pattern 800.

FIGS. 70 to 72 show that the variable resistance memory device includes two stacked memory structures, i.e., the first and second memory structures. In an implementation, the variable resistance memory device may include a plurality of memory structures sequentially stacked.

Figure 73:
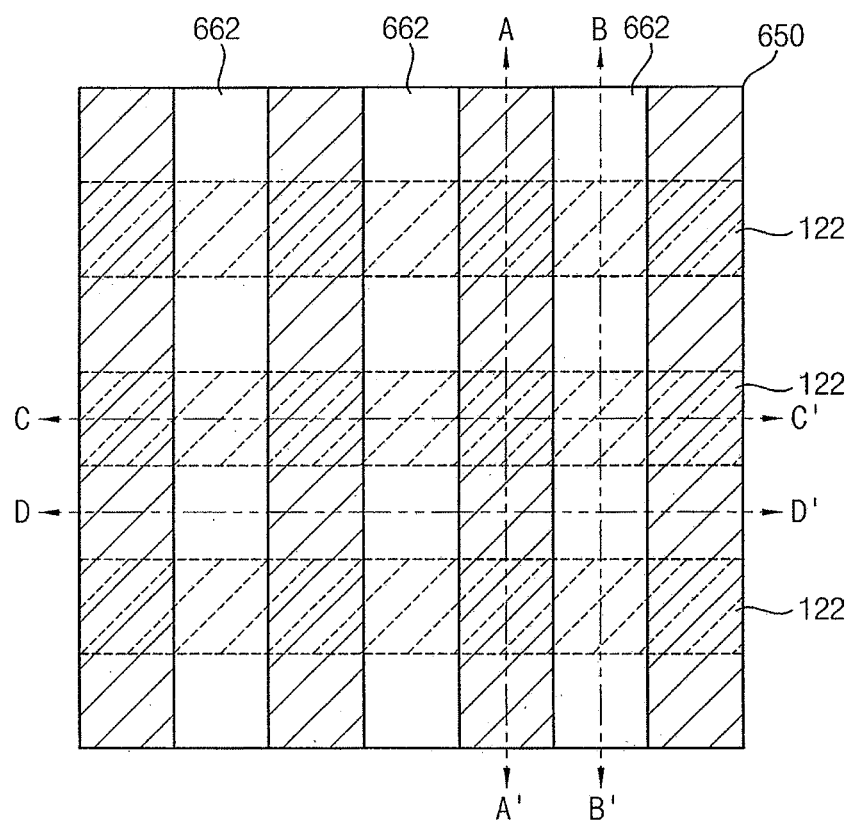
FIGS. 73 to 75 illustrate a plan view and cross-sectional views of stages in a method of manufacturing a variable resistance memory device in accordance with example embodiments.
Figure 74:
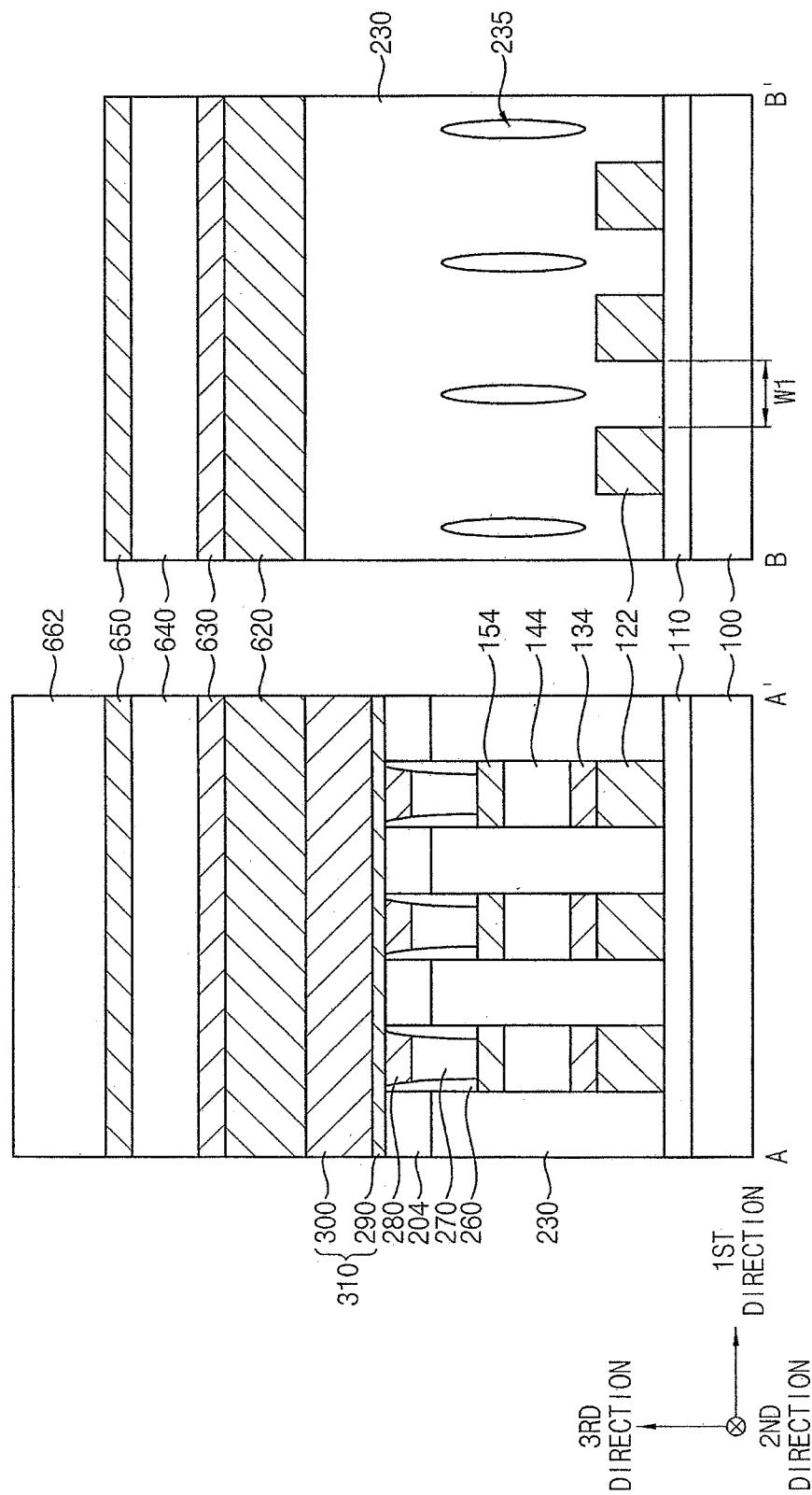
Figure 75:
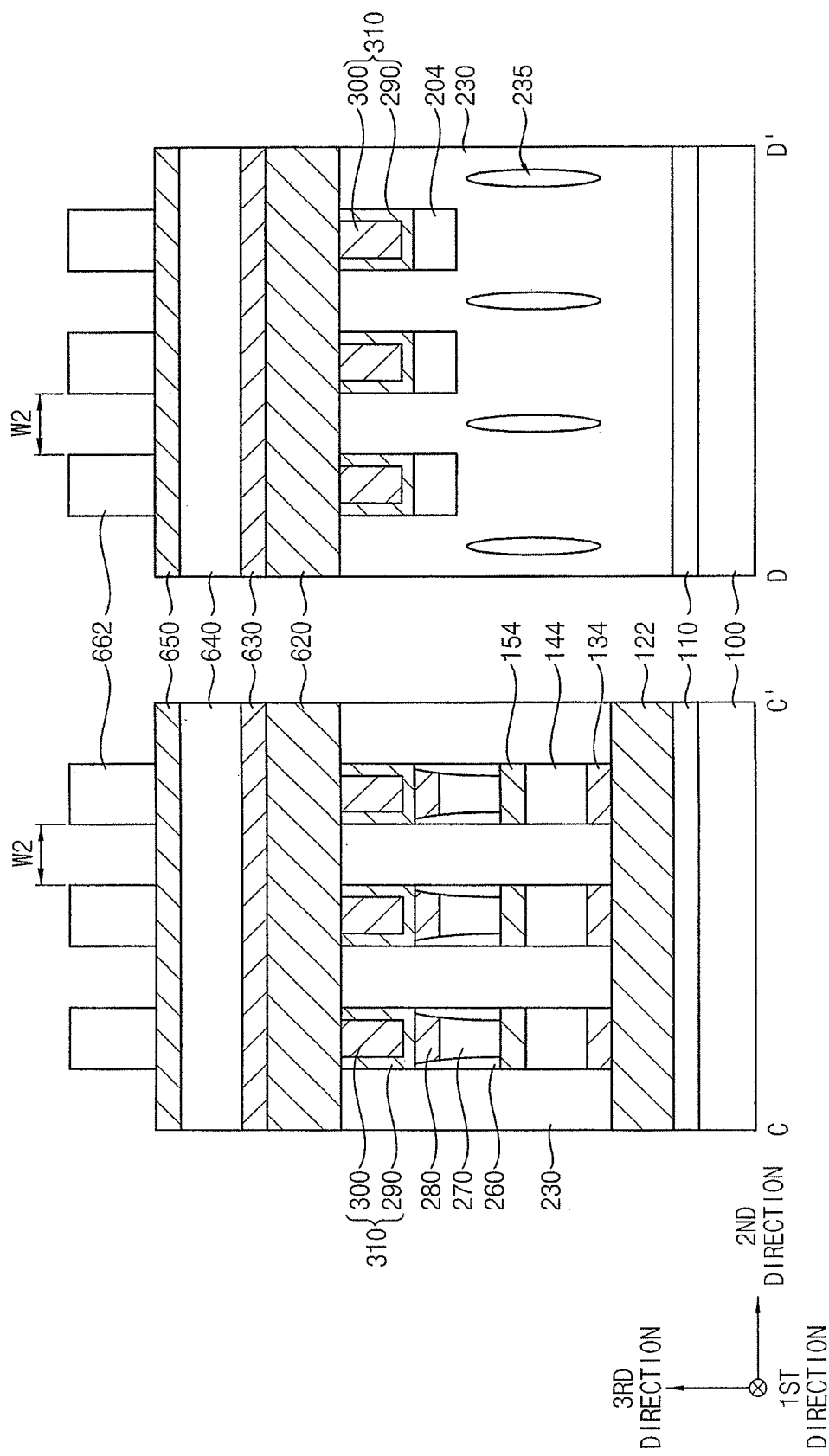

FIGS. 73 to 75 illustrate a plan view and cross-sectional views of stages in a method of manufacturing a variable resistance memory device in accordance with example embodiments. FIG. 73 is a plan view, FIG. 74 is a cross-sectional view including cross-sections taken along lines A-A' and B-B', respectively, of FIG. 73, and FIG. 75 is a cross-sectional view including cross-sections taken along lines C-C' and D-D', respectively, of FIG. 73. This method may include processes substantially the same as or similar to those illustrated with reference to FIGS. 1 to 30 or those illustrated with reference to FIGS. 64 to 69, and thus repeated detailed descriptions thereon may be omitted herein.

Referring to FIGS. 73 to 75, processes substantially the same as or similar to those illustrated with reference to FIGS. 1 to 30 may be performed to form a first memory structure, and processes substantially the same as or similar to those illustrated with reference to FIGS. 4 to 6 may be performed.

Thus, a sixth conductive layer 620, a fourth electrode layer 630, a second selection layer 640, and a fifth electrode layer 650 may be sequentially formed on the first memory structure, and a preliminary third mask 662 may be formed on the fifth electrode layer 650.

In example embodiments, the preliminary third mask 662 may extend in the first direction, and a plurality of preliminary third masks 662 may be formed in the second direction. The preliminary third masks 662 may be spaced apart from each other by the second width W2 in the second direction. In example embodiments, the preliminary third masks 662 may be formed to overlap the second conductive lines 310, respectively, in the third direction.

Referring to FIGS. 70 to 72 again, processes substantially the same as or similar to those illustrated with reference to FIGS. 7 to 30 and FIGS. 1 to 3 may be performed to complete the variable resistance memory device.

For example, the second memory structure on the first memory structure may include the sixth conductive line 622 extending in the first direction on the first memory structure, the fifth conductive line 810 on the sixth conductive line 622, the second memory unit between the sixth and fifth conductive lines 622 and 810, the fifth insulation layer 730 covering the second memory unit and having the second air gap 735 therein, and the second filling pattern 704. The second memory unit may include the second selection pattern 644, the fifth electrode 654 and the second variable resistance pattern 770 sequentially stacked.

The second memory structure may further include the fourth and sixth electrodes 634 and 780, and the second spacer 760.

Figure 76:
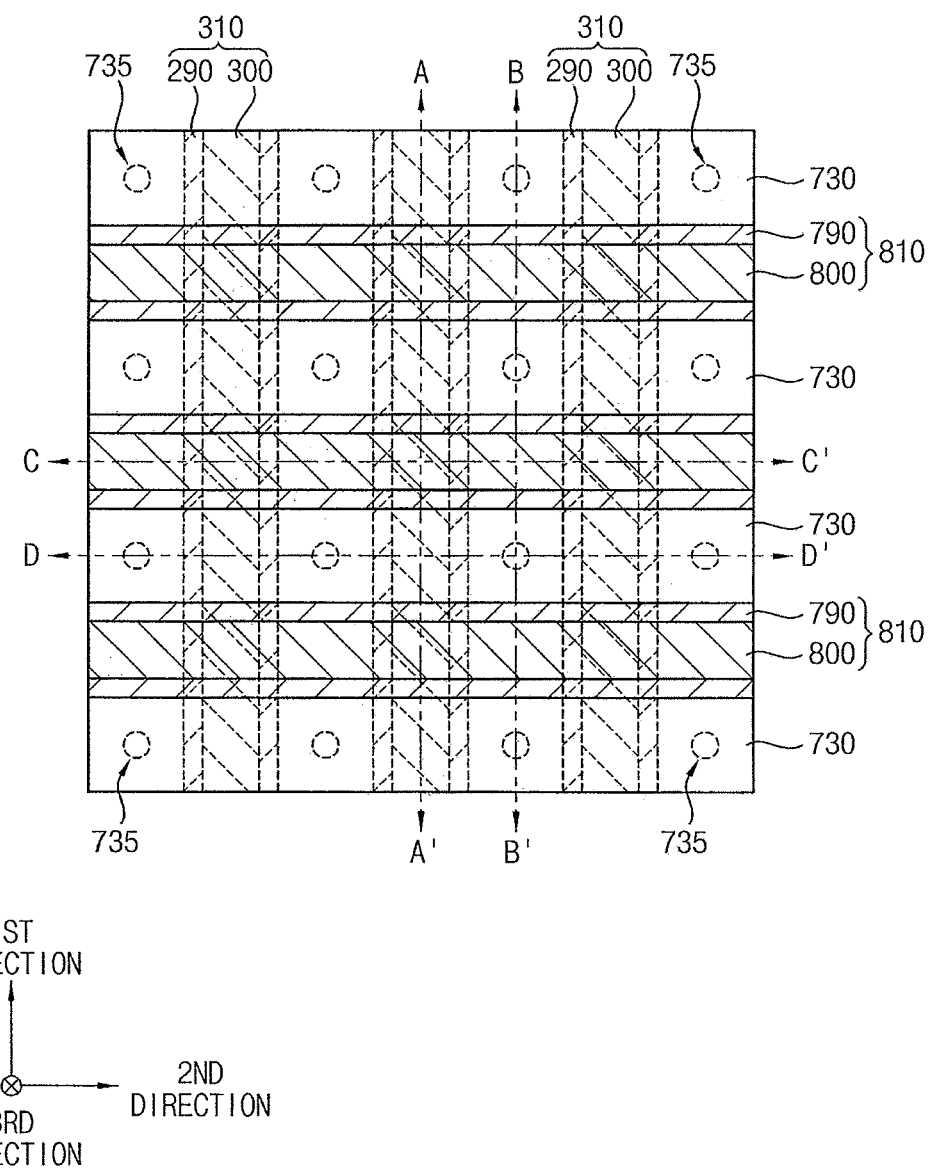
FIG. 76 illustrates a plan view of a variable resistance memory device in accordance with example embodiments.
Figure 77:
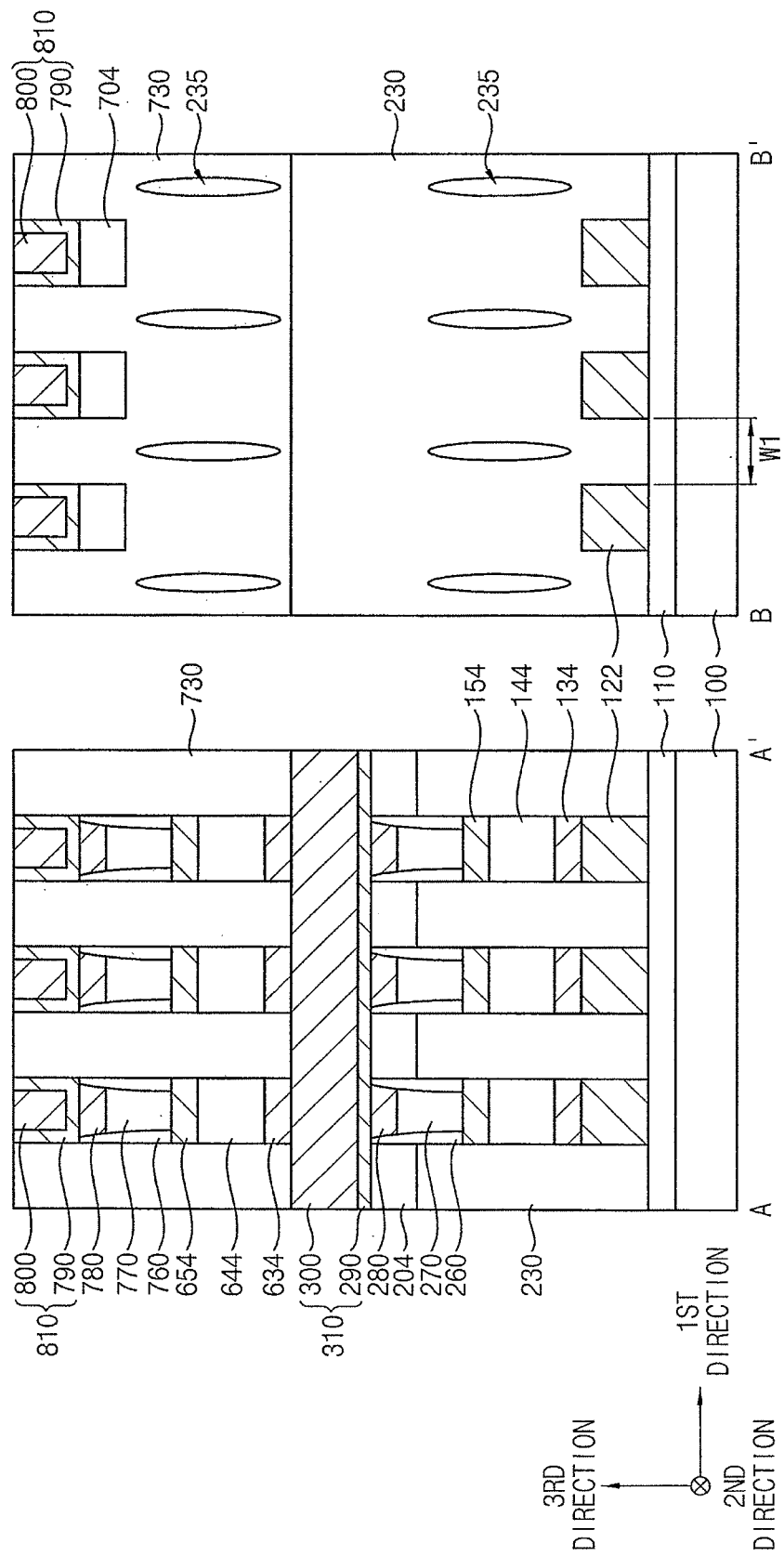
FIGS. 77 and 78 illustrate cross-sectional views of the variable resistance memory device of FIG. 76.
Figure 78:
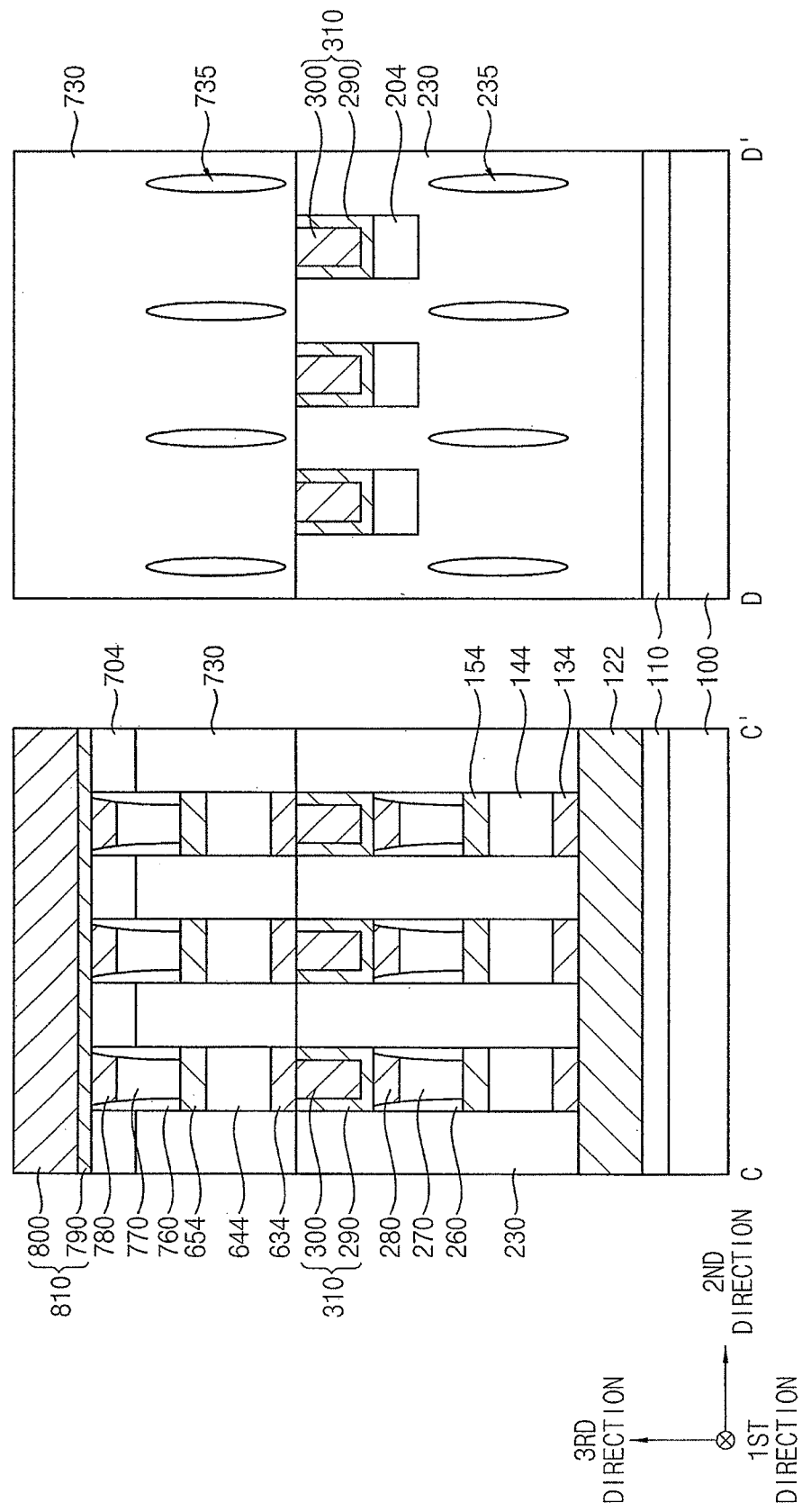

FIG. 76 illustrates a plan view of a variable resistance memory device in accordance with example embodiments, and FIGS. 77 and 78 illustrate cross-sectional views of the variable resistance memory device of FIG. 76. FIG. 77 is a cross-sectional view including cross-sections taken along lines A-A' and B-B', respectively, in FIG. 76, and FIG. 78 is a cross-sectional view including cross-sections taken along lines C-C' and D-D', respectively, in FIG. 76.

The variable resistance memory device may have a stacked structure including the variable resistance memory devices of FIGS. 1 to 3 sequentially stacked. Thus, like reference numerals refer to like elements, and repeated detailed descriptions thereon may be omitted below.

Referring to FIGS. 76 to 78, the variable resistance memory device may include first and second memory structures sequentially stacked in the third direction. The first memory structure may be substantially the same as the variable resistance memory device of FIGS. 1 to 3.

The second memory structure may be also substantially the same as or similar to the variable resistance memory device of FIGS. 1 to 3. In an implementation, the second conductive line 310 in the first memory structure may be also commonly used in the second memory structure. For example, when the first and second conductive lines 122 and 310 serve as word lines and bit lines, respectively, in the first memory structure, the second and fifth conductive lines 310 and 810 may serve as bit lines and word lines, respectively, in the second memory structure.

Thus, the second memory structure on the first memory structure may include the fifth conductive line 810, the second memory unit between the second and fifth conductive lines 310 and 810, the fifth insulation layer 730 covering the second memory unit and having the second air gap 735 therein, and the second filling pattern 704. The second memory unit may include the second selection pattern 644, the fifth electrode 654 and the second variable resistance pattern 770 sequentially stacked.

The second memory structure may further include the fourth and sixth electrodes 634 and 780, and the second spacer 760.

FIGS. 76 to 78 show that the variable resistance memory device includes two stacked memory structures, i.e., the first and second memory structures. In an implementation, the variable resistance memory device may include a plurality of memory structures sequentially stacked.

Figure 80:
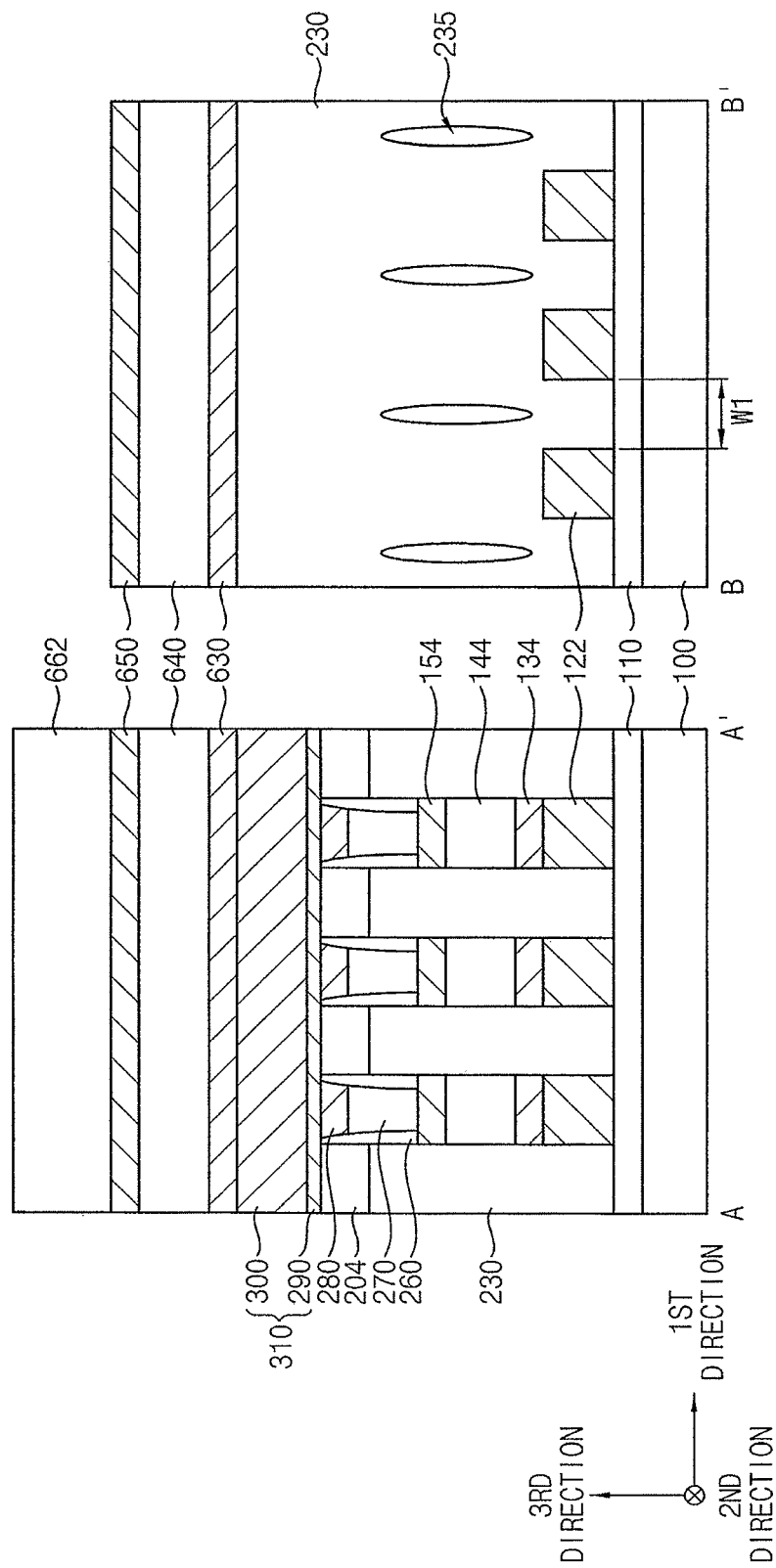
Figure 81:
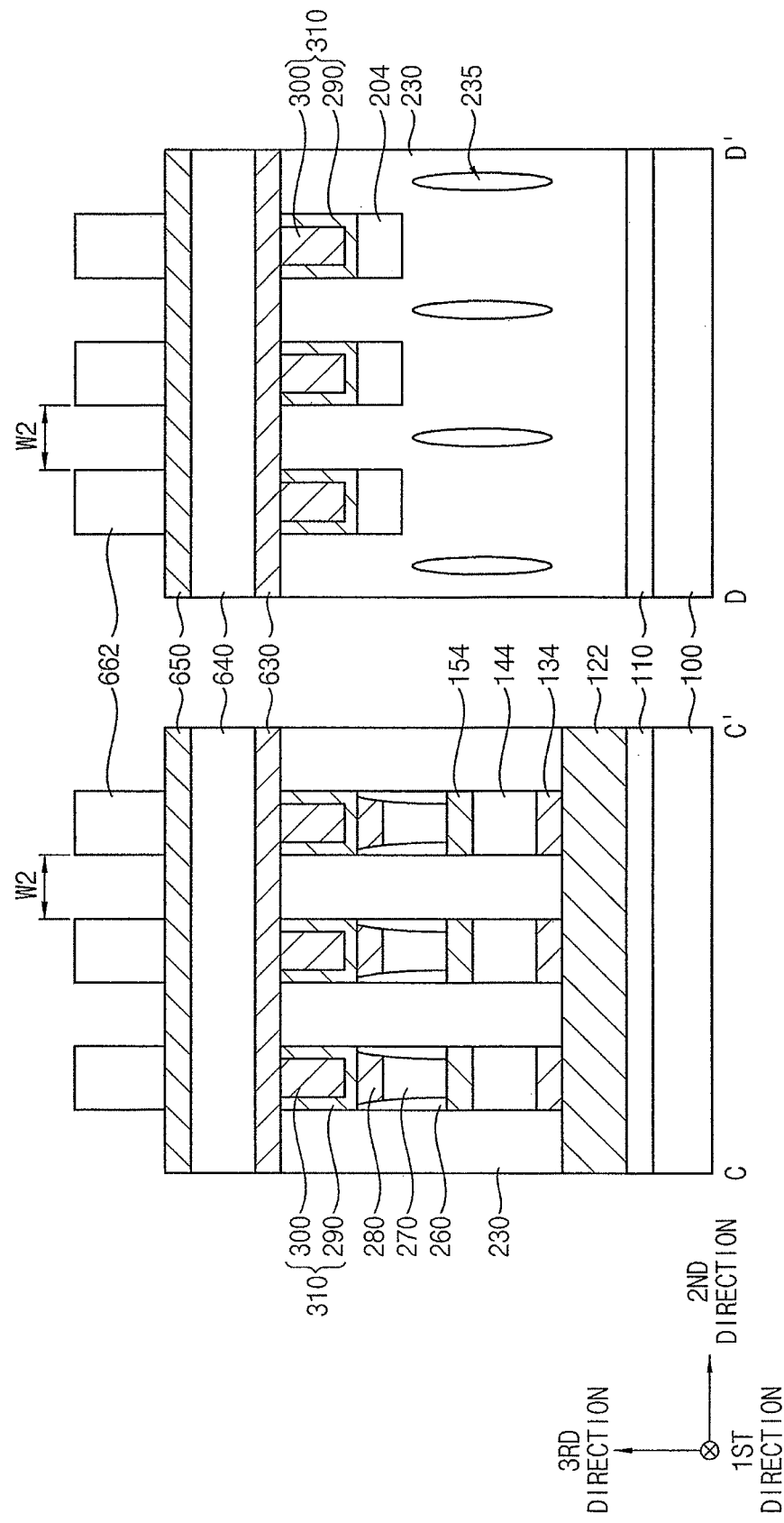

FIGS. 79 to 81 illustrate a plan view and cross-sectional views of stages in a method of manufacturing a variable resistance memory device in accordance with example embodiments. FIG. 79 is a plan view, FIG. 80 is a cross-sectional view including cross-sections taken along lines A-A' and B-B', respectively, of FIG. 79, and FIG. 81 is a cross-sectional view including cross-sections taken along lines C-C' and D-D', respectively, of FIG. 79. This method may include processes substantially the same as or similar to those illustrated with reference to FIGS. 1 to 30 or those illustrated with reference to FIGS. 64 to 69, and thus repeated detailed descriptions thereon may be omitted herein.

Referring to FIGS. 79 to 81, processes substantially the same as or similar to those illustrated with reference to FIGS. 1 to 30 may be performed to form a first memory structure, and processes substantially the same as or similar to those illustrated with reference to FIGS. 4 to 6 may be performed.

Thus, the fourth electrode layer 630, the second selection layer 640, and the fifth electrode layer 650 may be sequentially formed on the first memory structure, and the preliminary third mask 662 may be formed on the fifth electrode layer 650.

Referring to FIGS. 76 to 78 again, processes substantially the same as or similar to those illustrated with reference to FIGS. 7 to 30 and FIGS. 1 to 3 may be performed to complete the variable resistance memory device.

The variable resistance memory device in accordance with example embodiments may be used in PRAM devices, ReRAM devices, MRAM devices, etc.

The embodiments may provide a variable resistance memory device having an air gap.

The embodiments may provide a variable resistance memory device having good characteristics.

The embodiments may provide a method of manufacturing a variable resistance memory device having good characteristics.

In the variable resistance memory device in accordance with example embodiments, the air gap may be formed between upper and lower conductive lines in an area vertically overlapping neither the upper conductive lines nor the lower conductive lines, and thus the parasitic capacitance may be reduced. The air gap may have a top that is lower than the lower surface of the filling pattern under the upper conductive lines, and thus may be spaced apart from the lower surfaces of the upper conductive lines. As a result, when the upper conductive lines are formed, they may not be electrically short via the air gap.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A variable resistance memory device, comprising:
   first conductive lines disposed in a first direction on a substrate, each of the first conductive lines extending in a second direction crossing the first direction, and the first and second directions being parallel to a top surface of the substrate;
   second conductive lines disposed in the second direction over the first conductive lines, each of the second conductive lines extending in the first direction;
   a memory unit between the first and second conductive lines, the memory unit being in each area overlapping the first and second conductive lines in a third direction substantially perpendicular to the top surface of the substrate, and the memory unit including a selection pattern, a second electrode, and a variable resistance pattern sequentially stacked such that the second electrode is between the selection pattern and the variable resistance pattern; and
   an insulation layer structure between the first and second conductive lines, the insulation layer structure covering the memory unit and including a discontinuous air gap in at least a portion of an area overlapping neither the first conductive lines nor the second conductive lines in the third direction such that no part of the air gap overlaps the first conductive lines or the second conductive lines in the third direction,
   wherein:
   a bottom of the air gap is higher than upper surfaces of the first conductive lines, a top of the air gap is higher than an upper surface of the second electrode, and the top of the air gap is lower than lower surfaces of the second conductive lines.

2. The variable resistance memory device as claimed in claim 1, wherein the insulation layer structure includes a first insulation layer between neighboring ones of the memory units in the first direction, the first insulation layer contacting a lower surface of one of the second conductive lines and covering upper sidewalls of the neighboring ones of the memory units.

3. The variable resistance memory device as claimed in claim 2, comprising a plurality of first insulation layers disposed in the first direction.

4. The variable resistance memory device as claimed in claim 2, wherein the top of the air gap is lower than a lower surface of the first insulation layer.

5. The variable resistance memory device as claimed in claim 2, wherein:
   a lower surface of the first insulation layer is higher than the upper surface of the second electrode.

6. The variable resistance memory device as claimed in claim 1, wherein the insulation layer structure:
   covers sidewalls of the first and second conductive lines and the memory unit, and includes silicon nitride.

7. The variable resistance memory device as claimed in claim 1, wherein the insulation layer structure includes:
   a first insulation layer covering sidewalls of the first conductive lines; and
   a second insulation layer covering sidewalls of the memory units and the second conductive lines.

8. The variable resistance memory device as claimed in claim 7, wherein:
   the first insulation layer includes silicon oxide, and
   the second insulation layer includes silicon nitride.

9. The variable resistance memory device as claimed in claim 1, wherein the memory unit includes a selection pattern, a second electrode, and the variable resistance pattern sequentially stacked.

10. The variable resistance memory device as claimed in claim 9, further comprising:
    a first electrode between each of the first conductive lines and the selection pattern; and
    a third electrode between the variable resistance pattern and each of the second conductive lines.

11. The variable resistance memory device as claimed in claim 9, wherein the selection pattern includes an ovonic threshold switch material containing germanium, silicon, arsenic, or tellurium.

12. The variable resistance memory device as claimed in claim 11, wherein the selection pattern further includes selenium or sulfur.

13. The variable resistance memory device as claimed in claim 9, wherein the selection pattern includes at least one selected from the group of AsTeGeSiIn, GeTe, SnTe, GeSe, SnSe, AsTeGeSiSbS, AsTeGeSiIP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P$, $As_{10}Te_{21}S_2Ge_{15}Se_{50}Sb_2$, $Si_5Te_{34}As_{28}Ge_{11}S_{21}Se_1$, AsTeGeSiSeNS, AsTeGeSiP, AsSe, AsGeSe, AsTeGeSe, ZnTe, GeTePb, GeSeTe, AlAsTe, SeAsGeC, SeTeGeSi, GeSbTeSe, GeBiTeSe, GeAsSbSe, GeAsBiTe, GeAsBiSe, or $Ge_xSe_{1-x}$.

14. The variable resistance memory device as claimed in claim 9, wherein the second electrode includes carbon or a carbonitride.

15. The variable resistance memory device as claimed in claim 9, wherein the variable resistance pattern includes a phase-change material.

16. A variable resistance memory device, comprising:
    a first memory structure including:
    first conductive lines disposed in a first direction on a substrate, each of the first conductive lines extending in a second direction crossing the first direction, and the first and second directions being parallel to a top surface of the substrate;
second conductive lines disposed in the second direction over the first conductive lines, each of the second conductive lines extending in the first direction;
a first memory unit between the first and second conductive lines, the first memory unit being in each area overlapping the first and second conductive lines in a third direction substantially perpendicular to the top surface of the substrate, and the first memory unit including a selection pattern, a second electrode, and a first variable resistance pattern sequentially stacked such that the second electrode is between the selection pattern and the first variable resistance pattern; and
a first insulation layer structure between the first and second conductive lines, the first insulation layer structure covering the first memory unit and including a discontinuous first air gap in at least a portion of an area overlapping neither the first conductive lines nor the second conductive lines in the third direction such that no part of the first air gap overlaps the first conductive lines or the second conductive lines in the third direction wherein a bottom of the first air gap is higher than upper surfaces of the first conductive lines, a top of the air gap is higher than an upper surface of the second electrode, and the top of the first air gap is lower than lower surfaces of the second conductive lines; and
a second memory structure on the first memory structure, the second memory structure including:
third conductive lines disposed in the second direction, each of the third conductive lines extending in the first direction;
fourth conductive lines disposed in the first direction over the third conductive lines, each of the fourth conductive lines extending in the second direction;
a second memory unit between the third and fourth conductive lines, the second memory unit being in each area overlapping the third and fourth conductive lines in the third direction, and the second memory unit including a second variable resistance pattern; and
a second insulation layer structure between third and fourth conductive lines, the second insulation layer structure covering the second memory unit and including a discontinuous second air gap in at least a portion of an area overlapping neither the third conductive lines nor the fourth conductive lines in the third direction such that no part of the second air gap overlaps the third conductive lines or the fourth conductive lines in the third direction.

* * * * *